United States Patent
Hsieh et al.

(10) Patent No.: US 12,300,776 B2
(45) Date of Patent: May 13, 2025

(54) LIGHT-EMITTING DEVICE

(71) Applicant: EPISTAR CORPORATION, Hsinchu (TW)

(72) Inventors: Min-Hsun Hsieh, Hsinchu (TW); Shih-An Liao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 148 days.

(21) Appl. No.: 17/856,465

(22) Filed: Jul. 1, 2022

(65) Prior Publication Data
US 2022/0336718 A1  Oct. 20, 2022

Related U.S. Application Data

(63) Continuation of application No. 17/129,294, filed on Dec. 21, 2020, now Pat. No. 11,380,828, which is a continuation of application No. 16/172,406, filed on Oct. 26, 2018, now Pat. No. 10,873,014.

(30) Foreign Application Priority Data

Oct. 26, 2017 (TW) ................. 106136977
Feb. 14, 2018 (TW) ................. 107105502
Aug. 28, 2018 (TW) ................. 107129979

(51) Int. Cl.
| | |
|---|---|
| H01L 33/60 | (2010.01) |
| H01L 25/075 | (2006.01) |
| H01L 33/10 | (2010.01) |
| H01L 33/38 | (2010.01) |
| H01L 33/50 | (2010.01) |
| H01L 33/54 | (2010.01) |
| H01L 33/62 | (2010.01) |

(52) U.S. Cl.
CPC .......... *H01L 33/60* (2013.01); *H01L 25/0753* (2013.01); *H01L 33/10* (2013.01); *H01L 33/38* (2013.01); *H01L 33/502* (2013.01); *H01L 33/54* (2013.01); *H01L 33/62* (2013.01)

(58) Field of Classification Search
CPC ......... H01L 33/60; H01L 33/54; H01L 33/10; H01L 33/38; H01L 33/502; H01L 33/62; H01L 25/0753
See application file for complete search history.

(56) References Cited

U.S. PATENT DOCUMENTS

| | | |
|---|---|---|
| 6,498,355 B1 | 12/2002 | Harrah et al. |
| 7,118,262 B2 | 10/2006 | Negley |
| 7,222,993 B2 | 5/2007 | Kikuchi et al. |

(Continued)

FOREIGN PATENT DOCUMENTS

| | | |
|---|---|---|
| CN | 101681962 A | 3/2010 |
| DE | 102005059541 A1 | 6/2006 |

(Continued)

OTHER PUBLICATIONS

Levallois, Christophe, [et al:] VCSEL collimation using self-aligned integrated polymer microlenses. In: Micro-Optics 2008. SPIE, 2008. p. 269-276.

*Primary Examiner* — Mounir S Amer
(74) *Attorney, Agent, or Firm* — MUNCY, GEISSLER, OLDS & LOWE, P.C.

(57) ABSTRACT

A light-emitting device includes a carrier, a light-emitting unit disposed on the carrier, a reflective element arranged on the light-emitting unit, and an optical element arranged on the carrier and surrounding the light-emitting unit.

10 Claims, 36 Drawing Sheets

(56) References Cited

U.S. PATENT DOCUMENTS

| | | |
|---|---|---|
| 7,246,931 B2 | 7/2007 | Hsieh et al. |
| 7,344,902 B2 | 3/2008 | Basin et al. |
| 7,378,686 B2 | 5/2008 | Beeson et al. |
| 7,582,915 B2 | 9/2009 | Hsing Chen et al. |
| 10,873,014 B2 | 12/2020 | Hsieh et al. |
| 2006/0119250 A1 | 6/2006 | Suehiro et al. |
| 2006/0171151 A1 | 8/2006 | Park et al. |
| 2008/0067534 A1 | 3/2008 | Hsieh et al. |
| 2009/0045416 A1 | 2/2009 | Bierhuizen et al. |
| 2013/0037748 A1 | 2/2013 | Kato et al. |
| 2017/0179345 A1 | 6/2017 | Yamada et al. |
| 2019/0131500 A1 | 5/2019 | Hsieh et al. |

FOREIGN PATENT DOCUMENTS

| | | |
|---|---|---|
| DE | 102017102112 A1 | 8/2017 |
| JP | WO2005106978 A1 | 12/2007 |
| JP | 201092956 | 4/2010 |
| JP | 2013115280 A | 6/2013 |
| JP | 2013143430 A | 7/2013 |
| JP | 201595488 | 5/2015 |
| JP | 2015095658 A | 5/2015 |
| JP | 2017073549 A | 4/2017 |
| JP | 2017108111 A | 6/2017 |
| KR | 20100082460 A | 7/2010 |
| KR | 20140095723 A | 8/2014 |
| WO | WO2016006781 A1 | 1/2016 |

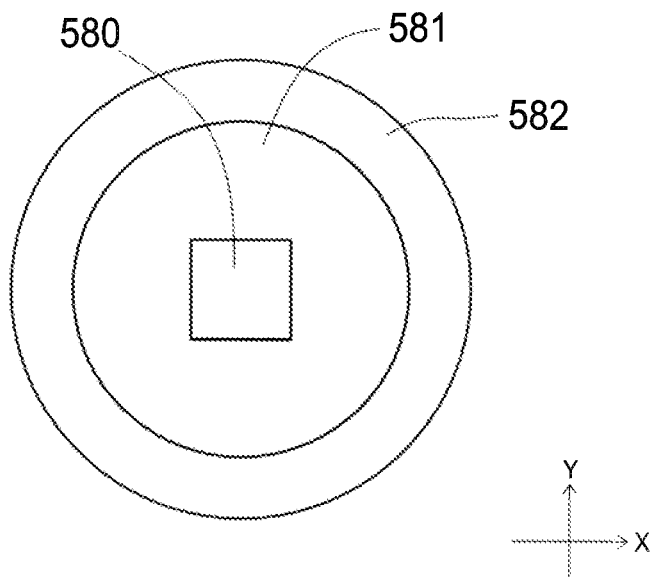
FIG. 14C
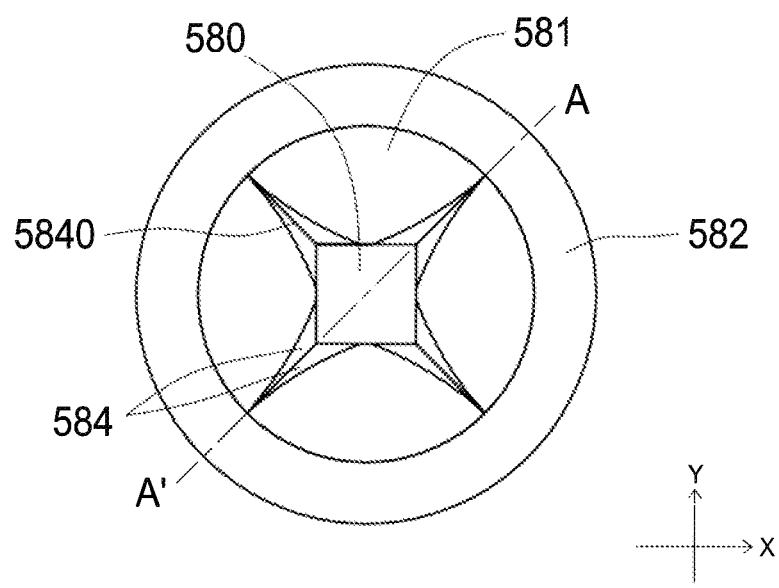
FIG. 14D1

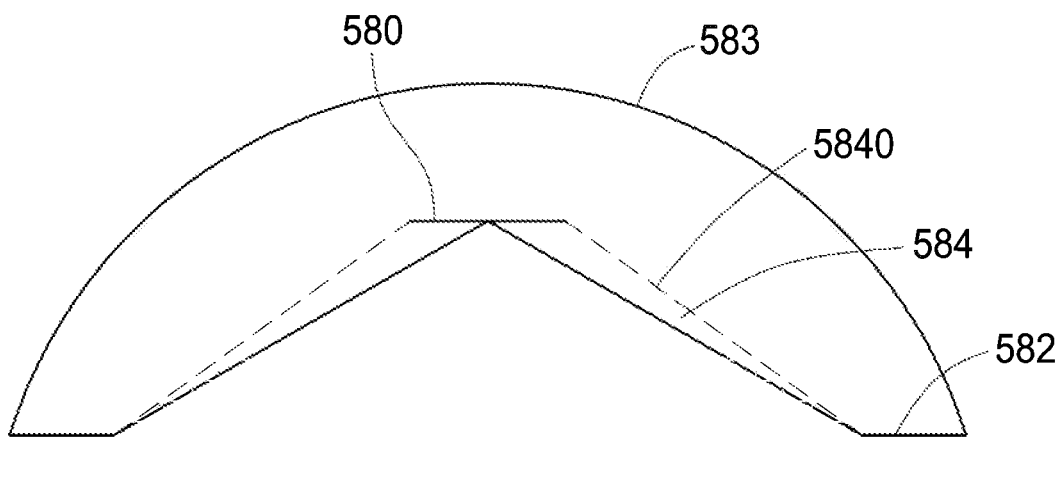
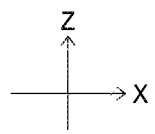
FIG. 14D2

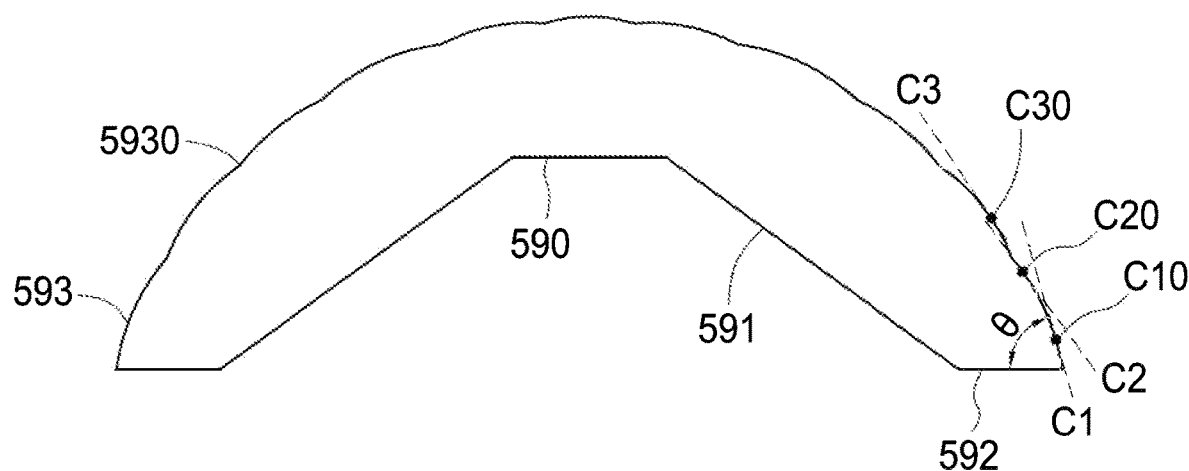
FIG. 14E
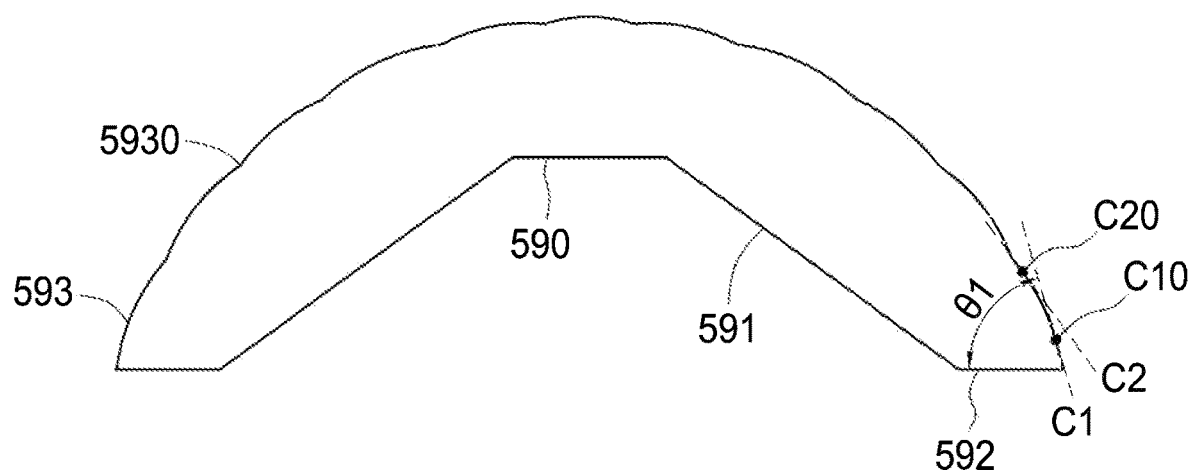
FIG. 14F1

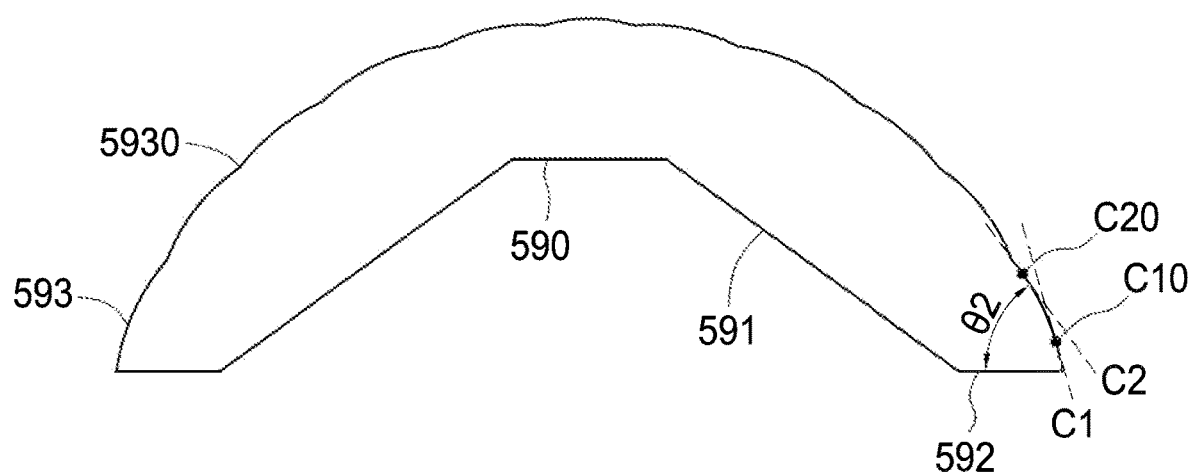
FIG. 14F2
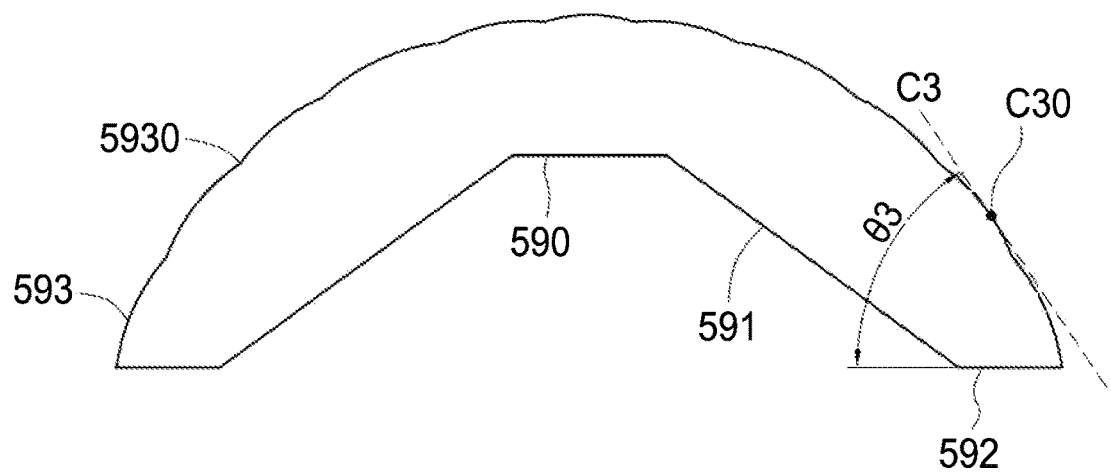
FIG. 14F3

LIGHT-EMITTING DEVICE

CROSS REFERENCE TO RELATED APPLICATIONS

This application is a Continuation of co-pending application Ser. No. 17/129,294, filed on 21 Dec. 2020, which is a Continuation of U.S. application Ser. No. 16/172,406, filed on Oct. 26, 2018, which issued as a U.S. Pat. No. 10,873,014 on 22 Dec. 2020 for which priority is claimed under 35 U.S.C. § 120; and this application claims priority of Application No. 106136977 filed in TAIWAN on 26 Oct. 2017, and Application No. 107105502 filed in TAIWAN on 14 Feb. 2018, and Application No. 107129979 filed in TAIWAN on 28 Aug. 2018, under 35 U.S.C. § 119, the entire contents of all of which are hereby incorporated by reference.

TECHNICAL FIELD

The present disclosure relates to a light-emitting device, and more relate to a light-emitting device having a reflective layer and an optical element.

DESCRIPTION OF THE RELATED ART

The light-emitting diode used in the solid-state lighting device has the characteristics of low power consumption, long operating life, small volume, fast reaction, and stable wavelength of the light it emitted, so the light-emitting diode gradually replaces the traditional lighting source. With the development of optoelectronic technology, solid-state lighting has made significant progress in different aspects, such as lighting efficiency, operating life and brightness. Therefore, in recent years, LEDs have been used in various applications, such as backlight module in the display.

SUMMARY OF THE DISCLOSURE

The following description illustrates embodiments and together with drawings to provide a further understanding of the disclosure described above.

A light-emitting device has a carrier, a light-emitting unit, a reflective layer and a first optical element. The carrier has a mirror reflection surface and a bottom surface opposite to the mirror reflection surface. The light-emitting unit is formed on the mirror reflection surface. The reflective layer is arranged on the light-emitting unit and has a top surface and a side surface. The first optical element surrounds the light-emitting unit and the reflective layer.

A light-emitting device has a carrier, a first circuit portion on the carrier, a second circuit portion on the carrier, an optical element on the carrier, and a light-emitting structure having a top surface directly connected to the optical element. The first circuit portion has a width larger than that of the second circuit portion.

A light-emitting device has a carrier, a first circuit layer on the carrier, an optical element on the carrier, and a light-emitting structure having a top surface directly connected to the optical element. The first circuit layer has a rotational symmetrical pattern.

BRIEF DESCRIPTION OF THE DRAWINGS

FIG. 14C shows a bottom view of the optical element shown in FIG. 14A

FIG. 14D1 shows a bottom view of an optical element shown in accordance with an embodiment of the present disclosure.

FIG. 14D2 shows a cross-sectional view of the optical element shown in FIG. 14D1.

FIG. 14E shows a cross-sectional view of an optical element in accordance with an embodiment of the present disclosure.

FIGS. 14F1~14F3 show cross-sectional views of a light-emitting device in accordance with an embodiment of the present disclosure.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1A:
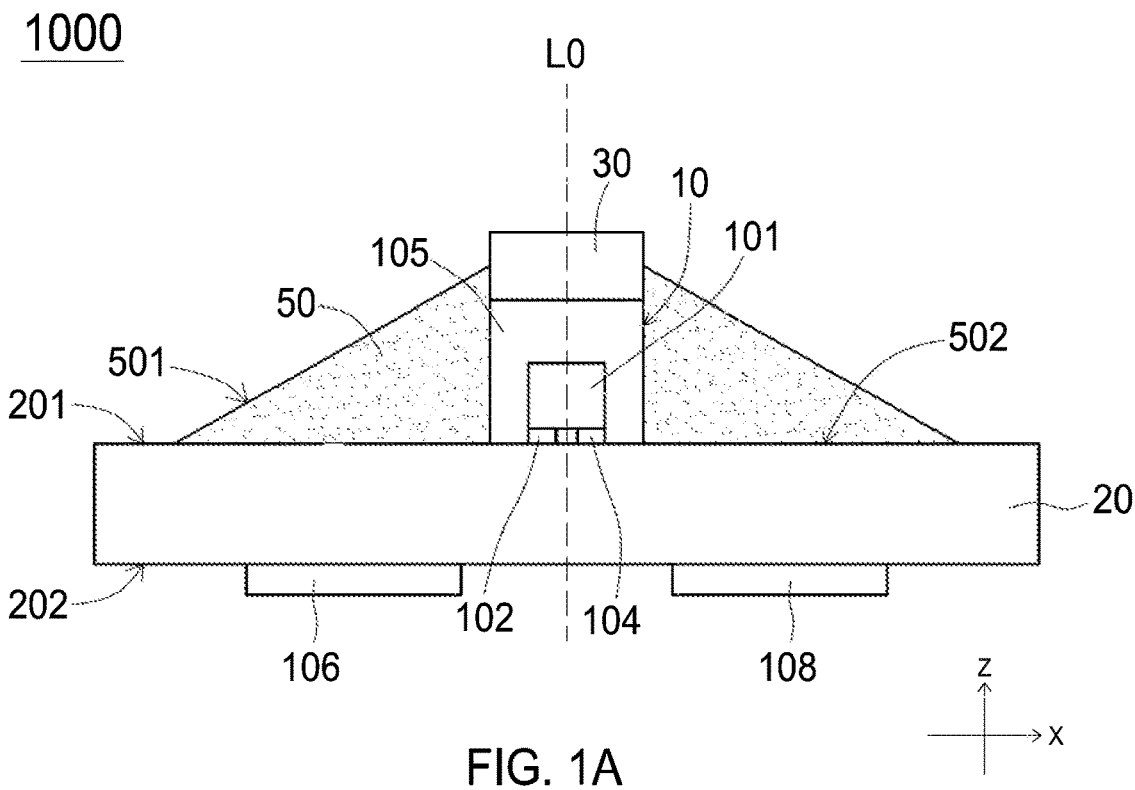
FIG. 1A shows a cross-sectional view of a light-emitting device in accordance with an embodiment of the present disclosure.

FIG. 1A shows a cross-sectional view of a light-emitting device in accordance with an embodiment of the present disclosure. The Z-axis matches the virtual center line L0, and the X-axis passes through the light-emitting unit 10 in a horizontal direction. The light-emitting device 1000 has a carrier 20, a light-emitting unit 10, a first optical element 30, and a second optical element 50. The light emitting unit 10 includes a light emitting structure 101, a light transmitting layer 105 surrounding and covering the light emitting structure 101 and electrodes 102, 104. The light emitting structure 101 includes a substrate (not shown), a first conductive type semiconductor layer (not shown), an active layer (not shown) and a second conductive type semiconductor layer (not shown). The substrate can be a growth substrate. The material of the substrate can be suitable for growing epitaxy layer and can be sapphire, silicon carbide, gallium nitride or gallium arsenide. The epitaxy layer can be the first conductive type semiconductor layer, the active layer, and the second conductive type semiconductor layer. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The first conductive type semiconductor layer and the second conductive type semiconductor layer can be cladding layer or confinement layer which provides electrons and holes respectively to be recombined for the active layer to emit a light. The material of the first conductive type semiconductor layer, the active layer, and the second conductive type semiconductor layer can be III-V semiconductor materials, such as $Al_xIn_yGa_{(1-x-y)}$ N or $Al_xIn_yGa_{(1-x-y)}$ P, wherein 0≤x, y≤1 and (x+y)≤1. The light-emitting structure 101 can emit a red light having a peak wavelength between 610 nm and 650 nm, a green light having a peak wavelength between 530 nm and 570 nm, or a blue light having a peak wavelength between 450 nm and 490 nm. Optionally, the light transmitting layer 105 has a wavelength conversion material, such as pigment, phosphor powder, or quantum dot material. In an embodiment, the phosphor powder is used as the wavelength conversion material, and some of the adjacent phosphor particles in the phosphor powder are connected to each other while some of the adjacent phosphor particles are not. The maximum or average particle size of the wavelength particles is between 5 μm~100 μm. The wavelength powder includes but is not limited to yellow-green phosphor and red phosphor. The material of the yellow-green phosphor can be aluminum oxide (for example, YAG or TAG), citrate, vanadate, alkaline earth metal, selenide, or metal nitride. The material of the red phosphor can be citrate, vanadate, alkaline earth metal, sulfide, metal oxynitride, or mixture of tungsten molybdate group mixture.

In an embodiment, the light transmitting layer 105 has a wavelength conversion material which converts a first light from the light-emitting structure 101 to a second light having a peak wavelength different from that of the first light. A mixture of the first light and the second light can be white light. The white light from the light-emitting device 1000 has a color temperature ranging from 2200K~6500K, and can be 2200K, 2400K, 2700K, 3000K, 5700K or 6500K while being operated in a steady state. The CIE xy chromaticity coordinates (CIE x, y) of the light from the light-emitting device 1000 locates within 7-step MacAdam ellipse on the CIE 1931 chromaticity chart and has a color rendering index (CRI) larger than 80 or larger than 90. In another embodiment, the light transmitting layer 105 includes scattering particles, which include titanium dioxide, zirconium oxide, zinc oxide or aluminum oxide.

The light-emitting unit 10 can be electrically connected with the circuit (not shown) on a surface of the carrier 20 through the electrodes 102, 104 and the light-emitting structure 101 can be powered through the circuit on the carrier 20 to emit light. More specifically, the electrodes 102, 104 are electrically connected to the circuit on the surface of the carrier 20 through a conductive material. The conductive material can be an adhesive conductive material, such as solder. In an embodiment, the electrodes 106, 108 on the bottom surface 202 are arranged to receive external power. The electrodes 106, 108 on the bottom surface 202 of the carrier 20 are electrically connected to the circuit (not shown) on the surface of the carrier 20 through metal wires (not shown) in the carrier 20. The metal wires in the carrier 20 can penetrate through the carrier 20 in a vertical direction or in an inclined direction. In an embodiment, the top surface 201 of the carrier 20 includes a reflective layer to reflect light from the light-emitting unit 10. The reflective layer can be a diffusion reflection surface, wherein the light can be reflected to multiple directions. Or, the reflective layer can be a mirror reflection surface, wherein the light can be reflected to a single direction and the incident angle of light equals to the angle of reflection. In an embodiment, the reflective layer is a diffusion reflection surface, and a portion of the light from the light-emitting structure 101 is reflected by the reflective layer to be the reflected light. Then, a portion of the reflected light moves toward the light-emitting structure 101. Meanwhile, a portion of the reflected light can be reabsorbed by the light-emitting unit 10 or trapped in the light-emitting device 1000 by being reflected back and forth between the first optical element 30 and the carrier 20. Thus, the light-emitting intensity of the light-emitting device 1000 is reduced. In an embodiment, the reflective layer is a mirror reflection surface, and the light from the light-emitting structure 101 is reflected by the surface of the carrier 20 toward a direction away from the light-emitting structure 101. Therefore, more light is reflected to the peripheral region of the light-emitting device 1000 to improve the light intensity around the light-emitting device 1000 while the top surface 201 includes a mirror reflection surface. Moreover, the difference of the light intensity between the center portion and the peripheral portion of the light-emitting device 1000 is increased.

The material of the reflective layer can be an insulating material and/or conductive material. The insulating material can be white paint or ceramic ink. The conductive material can be metal, such as silver and aluminum. The white paint includes a base material and a plurality of reflective particles (not shown) dispersed in the base material. The material of the base material can be a siloxane group contained material, an epoxy group contained material, or a material having the above two functional groups, and has a refractive index (n) between 1.4 and 1.6 or between 1.5 and 1.6. In an embodiment, the material of the base can be polyimide (PI), benzocyclobutene (BCB), perfluorocyclobutane (PFCB), polymethyl methacrylate (PMMA), polyethylene terephthalate (PET), polycarbonate ester (PC), polyetherimide or fluorocarbon polymer. The material of the reflective particles can be titanium dioxide, cerium oxide, aluminum oxide, zinc oxide, or zirconium dioxide.

In an embodiment, the first optical element 30 is arranged on the light-emitting unit 10. The first optical element 30 has a width substantially equal to a width of the light-emitting unit 10 and larger than a width of the light-emitting structure 101. Referring to FIG. 1A, the first optical element 30 is applied to reflect a portion of the light from the light-emitting structure 101 to a bottom right (or (X, −Z)) direction and/or bottom left (or (Y, −Z)) direction away from the light-emitting unit 10. So, the light is emitted toward the second optical element 50 after leaving the light-emitting structure 101 to avoid being trapped within the light-emitting unit 10. That is, the first optical element 30 enables the light generated by the light-emitting unit 10 to be dispersed around the light-emitting device 1000 instead of being concentrated above the light-emitting device 1000. The second optical element 50 surrounds the light-emitting unit 10 and the first optical element 30, and simultaneously contacts the first optical element 30 and the light-emitting unit 10. The second optical element 50 substantially covers the light-emitting unit 10 symmetrically with respect to a center line passing through the light-emitting unit 10 (or the first optical element 30) in a cross-sectional view. For example, the center line can be a virtual center line L0 passing through the light-emitting unit 10. The second optical element 50 has a side surface 501 and a bottom surface 502. The side surface 501 directly contacts the side surface of the first optical element 30 but does not contact the top surface of the first optical element 30. The bottom surface 502 is connected to the carrier 20 and is substantially coplanar with the surfaces of the electrodes 102, 104 connected to the carrier 20. In an embodiment, the shape of the second optical element 50 in a cross-sectional view is rectangular or approximately rectangular. The side surface 501 is a horizontal surface parallel to the top surface 201 in a cross-sectional view. The side surface 501 is substantially coplanar with the top surface of the first optical element 30. In an embodiment, the side surface 501 and the side surface of the first optical element 30 are not directly connected with each other. The second optical element 50 has a horizontal top surface connected to the side surface 501 and the side surface of the first optical element 30. The second optical element 50 surrounds the light-emitting unit 10 and the highest point of the side surface 501 is located above the top surface of the light-emitting unit 10. The first optical element 30 can be a single layer structure or a multi-layer structure. For example, the first optical element 30 can be a single reflective layer including insulating material, such as white paint or ceramic ink. For example, the first optical element 30 can be a single reflective layer including conductive material. The conductive material can be metal, such as silver and aluminum. The first optical element 30 can be a distributed Bragg reflector (DBR) which includes at least two stacked light transmission layers having different refractive index. The material of the distributed Bragg reflector (DBR) can be insulating material or conductive material. The insulating material includes, but is not limited to, polyammonium (PI), benzocyclobutene (BCB), perfluorocyclobutane (PFCB), magnesium oxide (MgO), Su8, epoxy (Epoxy), acrylic resin (Acrylic Resin), cycloolefin polymer (COC), polymethyl methacrylate (PMMA), polyethylene terephthalate (PET), polycarbonate (PC), Polyetherimide, Fluorocarbon Polymer, Glass, Alumina ($Al_2O_3$), Magnesium Oxide (MgO), Cerium Oxide ($SiO_x$), Titanium Oxide ($TiO_2$), Tantalum Oxide ($Ta_2O_5$), Silicon Nitride (SiNx), spin-on glass (SOG) or tetraethoxy decane (TEOS). The conductive material includes, but is not limited to, indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), magnesium oxide (MgO), aluminum gallium arsenide (AlGaAs), gallium nitride (GaN), gallium phosphide (GaP) or indium zinc oxide (IZO).

The second optical element 50 and the light-transmitting layer 105 can be translucent or transparent with respect to the light from the light-emitting structure 101. The material of the second optical element 50 and the material of the light-transmitting layer 105 can be the same or similar. The materials of the optical element 50 and the light-transmitting layer 105 can be silicone, epoxy, polyimidine (PI), benzene byclobutene (BCB), perfluorocyclobutane (PFCB), SUB, acrylic resin, polymethyl methyl acrylate (PMMA), polyethylene terephthalate (PET), polycarbonate (PC), polyetherimide, fluorocarbon polymer, alumina ($Al_2O_3$), SINR, spin-on glass (SOG) or a combination thereof. In an embodiment, the second optical element 50 includes scattering particles, such as titanium dioxide, zirconium oxide, zinc oxide or aluminum oxide. In an embodiment, the material of the second optical element 50 includes a wavelength conversion material, such as dye, phosphor, and quantum dot.

Figure 1B:
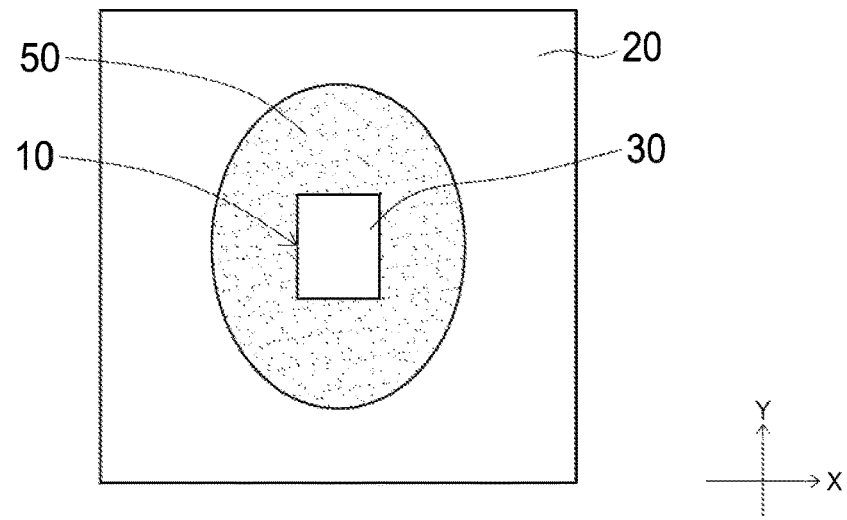
FIG. 1B shows a top view of a light-emitting device in accordance with an embodiment of the present disclosure.

FIG. 1B shows a top view of the light-emitting device 1000 in accordance with an embodiment of the present disclosure. The X axis and the Y axis are interconnected with each other at the geometric center of the light-emitting unit 10 in FIG. 1B. Referring to FIG. 1B, the Y axis passes vertically through the geometric center of the light-emitting unit 10, while the X axis passes horizontally through the geometric center of the light-emitting unit 10. Most of the light-emitting unit 10 is covered by the first optical element 30, and the second optical element 50 surrounds the whole light-emitting unit 10 and the first optical element 30. The second optical element 50 has a circular, a pseudo circle or an elliptical contour. There is a proportional relationship between the size of the light-emitting unit 10 and that of the second optical element 50 in a cross-sectional view. There is a proportional relationship between the size of the light-emitting unit 10 and that of the reflective layer on the top surface 201 or on the carrier 20 in a cross-sectional view. For example, referring to FIG. 1A, the maximum width of the second optical element 50 is three times or more of the maximum width of the light-emitting unit 10. Or the maximum width of the reflective layer on the carrier 20 or on the top surface 201 is three times or more of the maximum width of the light-emitting unit 10. In an embodiment, the maximum width of the second optical element 50 is 5 times or more of the maximum width of the light-emitting unit 10. In one embodiment, the maximum width of the reflective layer on the carrier 20 or on the top surface 201 is 10 times or more of the maximum width of the light-emitting unit 10.

Figure 2A:
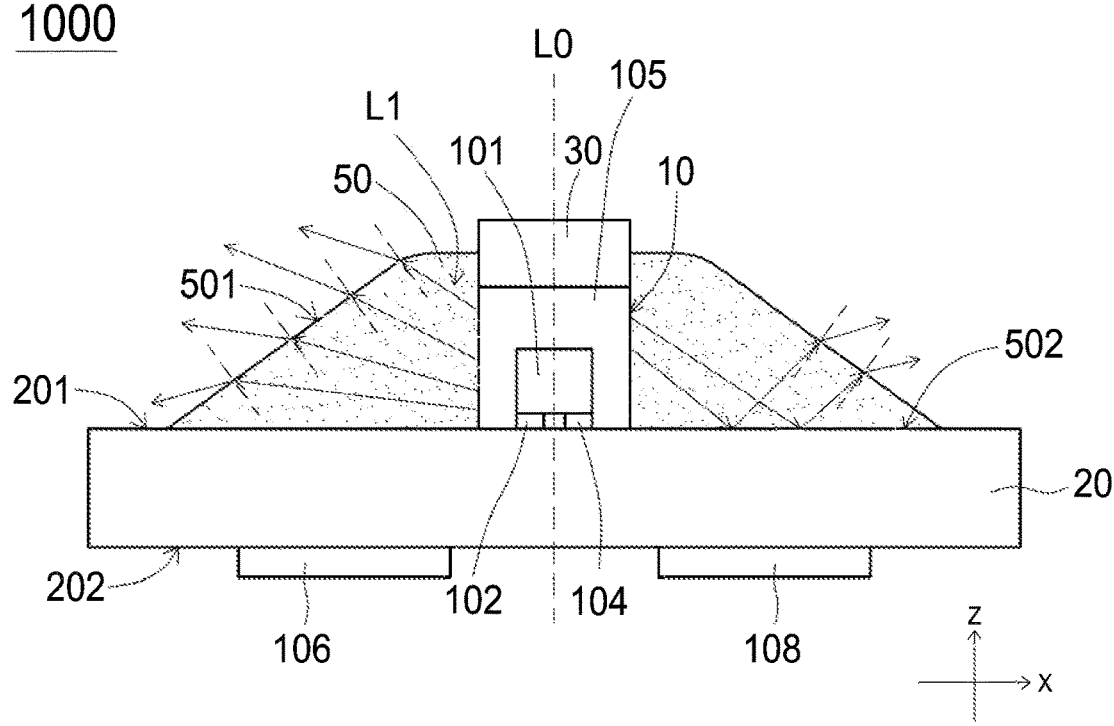
FIG. 2A shows a cross-sectional view of a light-emitting device in accordance with an embodiment of the present disclosure.
Figure 2B:
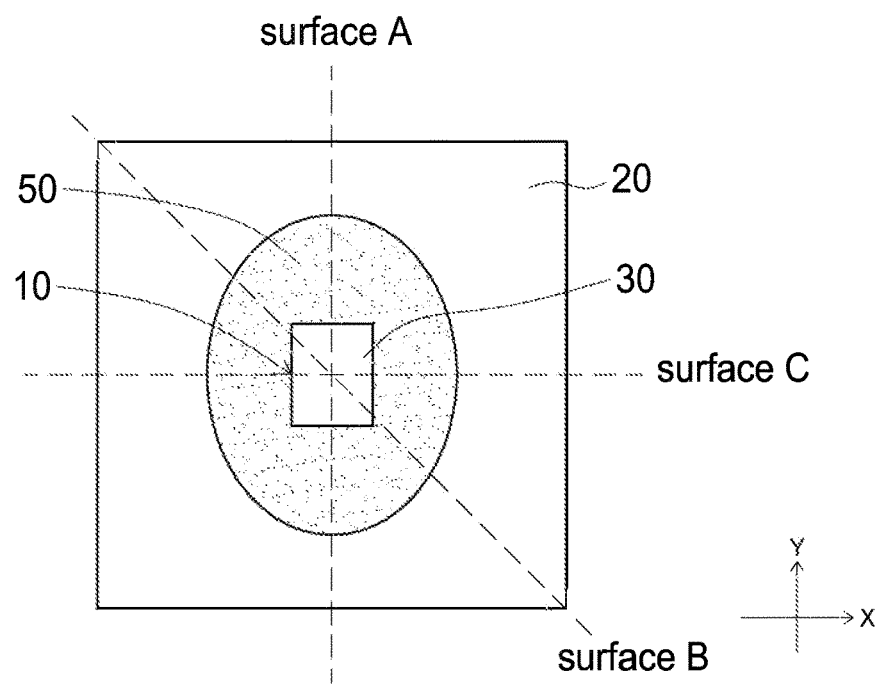
FIG. 2B shows a top view of a light-emitting device in FIG. 2A.

FIG. 2A shows a cross-sectional view of a light-emitting device in accordance with an embodiment of the present disclosure. The rays in FIG. 2A indicate the trajectory or tracks of the light from the light-emitting device. FIG. 2B shows a top view of a light-emitting device in FIG. 2A. The Z-axis matches the virtual center line L0, and the X-axis passes through the light-emitting unit 10 in a horizontal direction. The portion of the second optical element 50 arranged on a side of the light-emitting unit 10 has a pseudo trapezoid shape. The side surface 501 of the second optical element 50 is an inclined surface. In an embodiment, the top surface 201 of the carrier 20 is a mirror reflection surface or a quasi-mirror reflection surface to disperse the light emitted by the light-emitting unit 10 to lateral sides of the light-emitting device 1000 (in a cross-sectional view). For convenience of discussion, the left half part of the light-emitting device 1000 in FIG. 2A shows the light moving in an upward direction within the second optical element 50 after leaving the light-emitting unit 10, while the right half part shows the light moving in a downward direction within the second optical element 50 after leaving the light-emitting unit 10. The moving direction of the light within the second optical element 50 includes upward direction, downward direction as described above, or a combination thereof while most of the light proceeds in a direction away from the light-emitting unit 10. As shown in FIG. 2A, the light within the second optical element 50 moves in a straight direction until being refracted on the side surface 501. For example, the light L1 shifts in a direction close to the carrier 20 after leaving the second optical element 50.

Figure 2C:
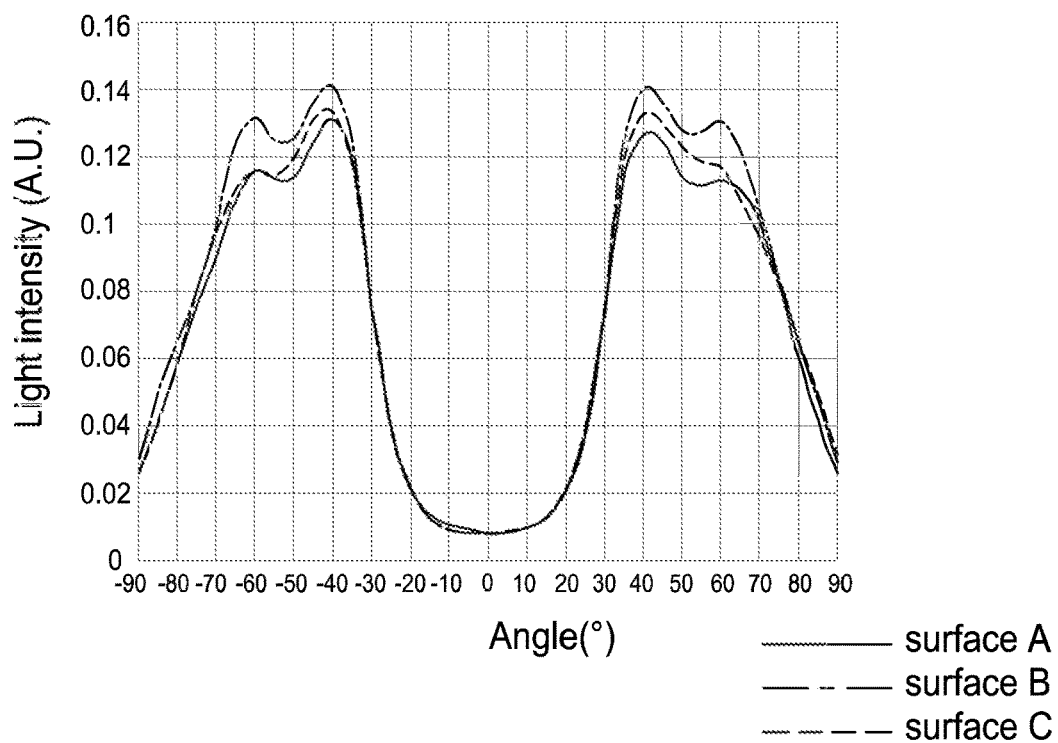
FIG. 2C shows a light distribution pattern of a light-emitting device in FIG. 2A on a cartesian coordinate system.
Figure 2D:
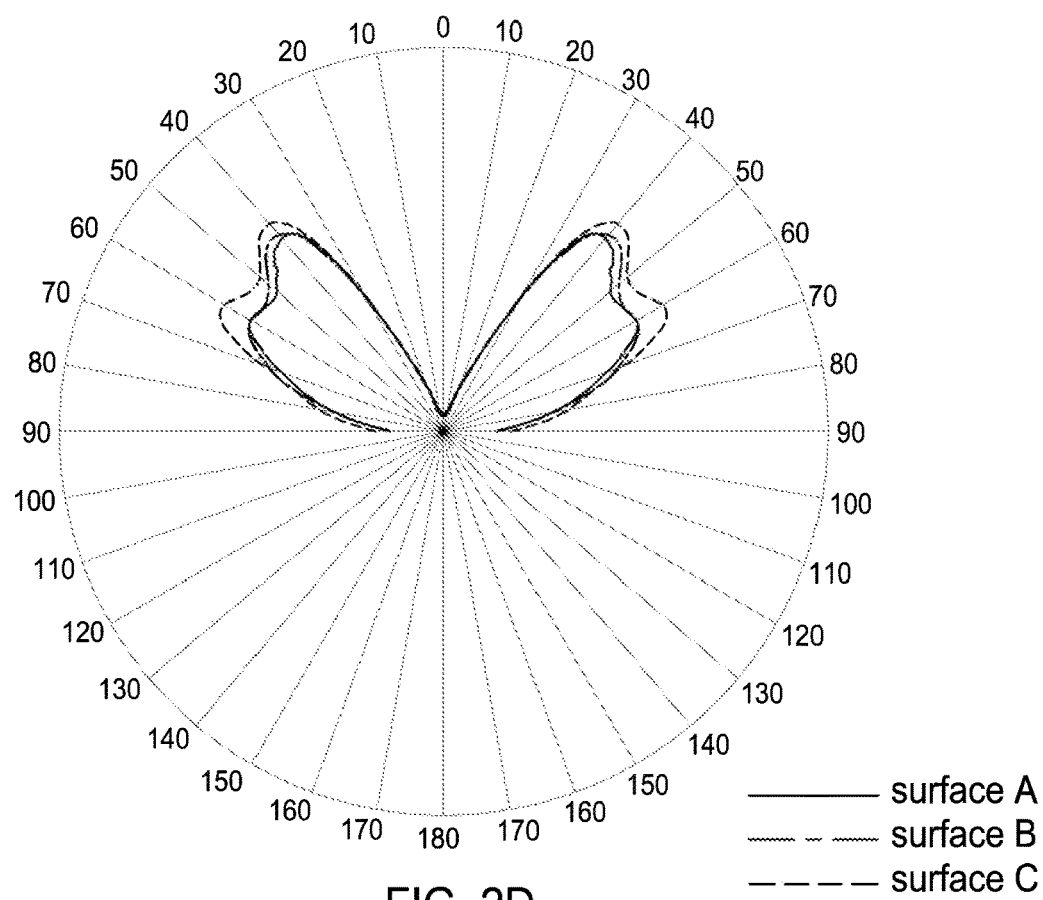
FIG. 2D shows a light distribution pattern of a light-emitting device in FIG. 2A on a polar coordinate system.

FIG. 2B shows a top view of a light-emitting device in FIG. 2A. FIG. 2C shows a light distribution pattern of a light-emitting device in FIG. 2A on a cartesian coordinate system. The three curves in FIG. 2C show the light intensity measured from three different surfaces in FIG. 2B: the surface A (with respect to 90°), surface B (with respect to 135°) and surface C (with respect to 180°). The horizontal axis in FIG. 2C shows the measuring angle at a plane (for example, surface A, surface B or surface C) while the vertical axis represents the light intensity (a.u.). Referring to FIG. 2C, the distribution of the light intensity of the light-emitting device 1000 is symmetrically distributed with respect to the 0° and has a maximum value of about 0.14 a.u. on two sides within an angle range between 40° and 70°, which is about 14 times of the minimum light intensity (about 0.001 a.u.) at the center region within an angle between 15° and −15°. For convenience of discussion, the light intensity disclosed is normalized, so the light intensity in embodiments disclosed is unified with an arbitrary unit (a.u.). FIG. 2D shows a light distribution pattern of a light-emitting device in FIG. 2A on a polar coordinate system. Referring to FIG. 2D, the light intensity of the light-emitting device 1000 has a distribution being substantially symmetrical with respect to the 0° or the geometric center of the light-emitting unit 10, and most of the light is distributed within an angle between 40° and 70°.

Figure 3A:
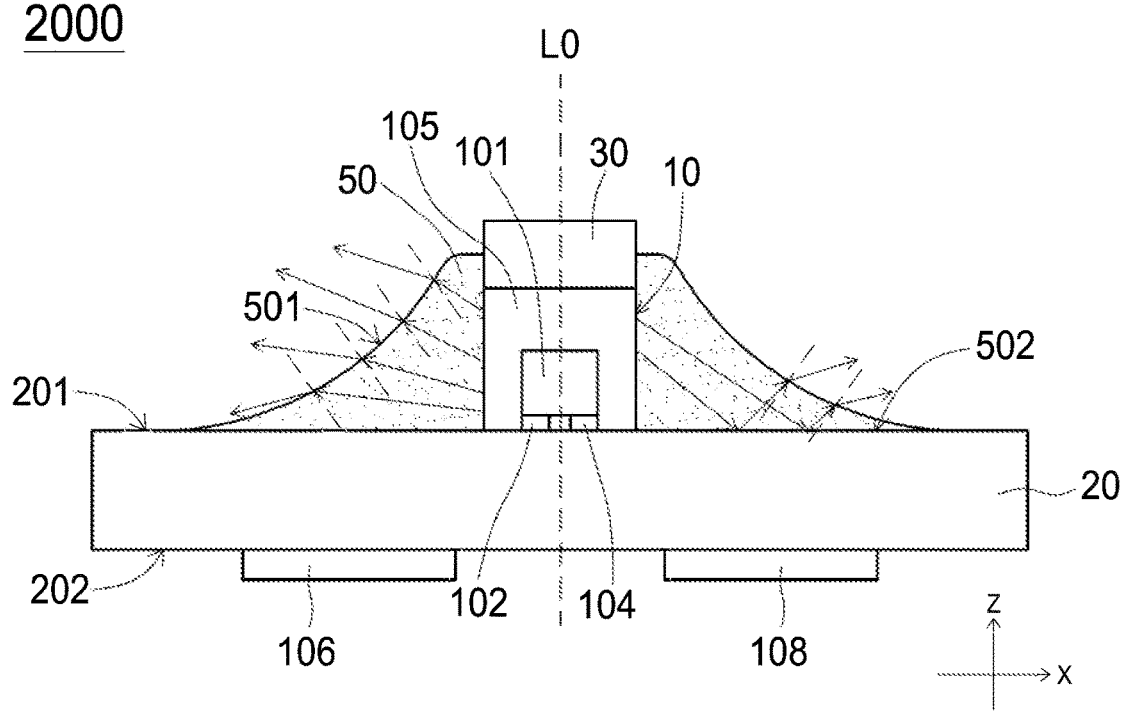
FIG. 3A shows a cross-sectional view of a light-emitting device in accordance with an embodiment of the present disclosure.
Figure 3B:
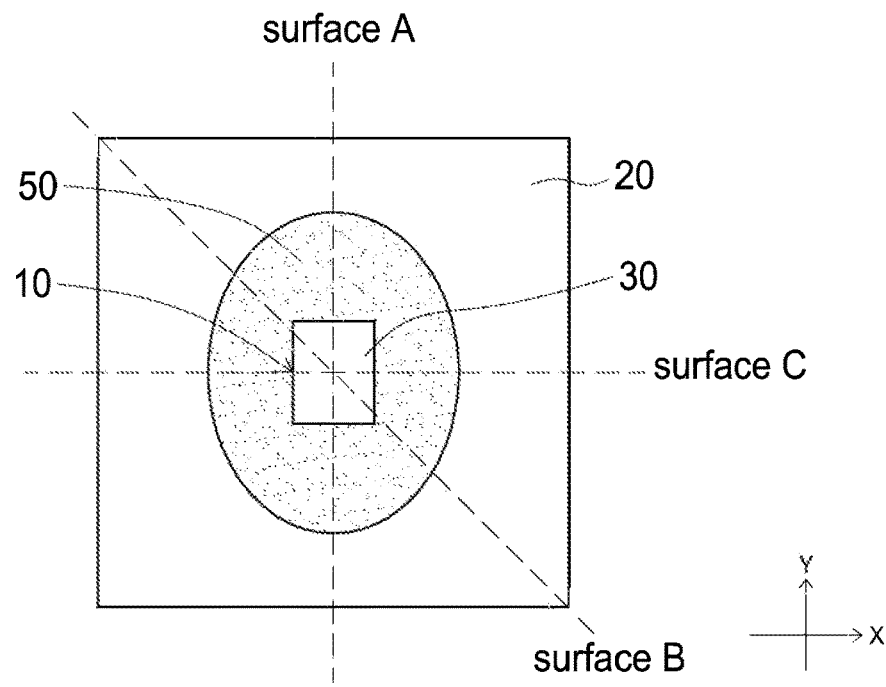
FIG. 3B shows a top view of a light-emitting device shown in FIG. 3A.
Figure 3C:
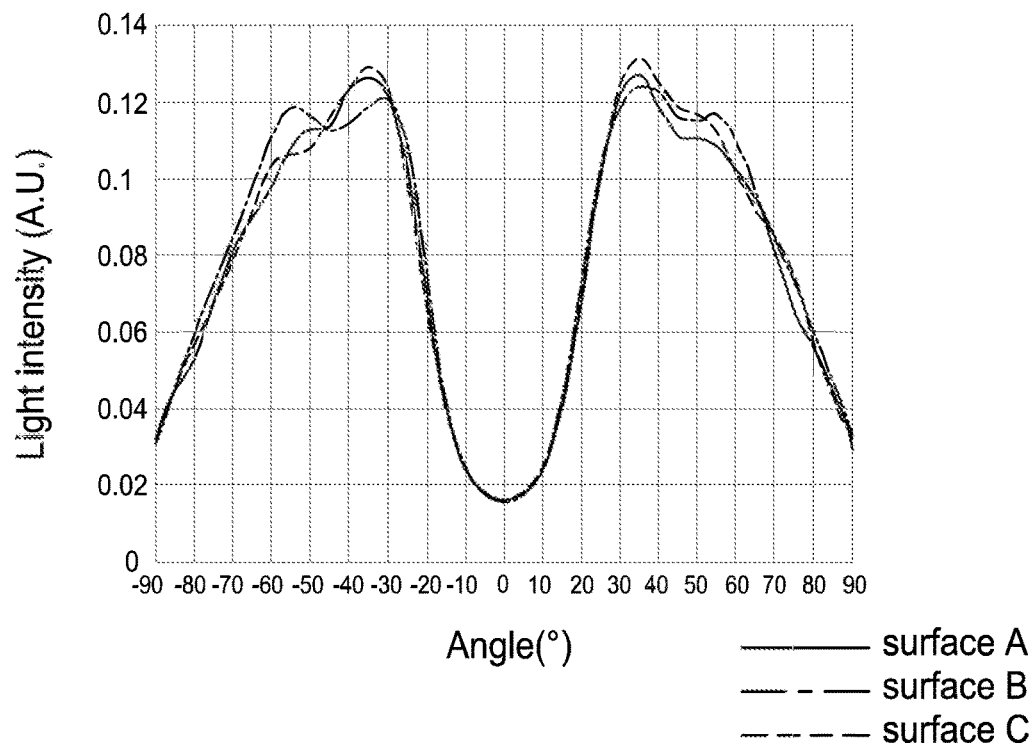
FIG. 3C shows a light distribution pattern of a light-emitting device in FIG. 3A on a cartesian coordinate system.
Figure 3D:
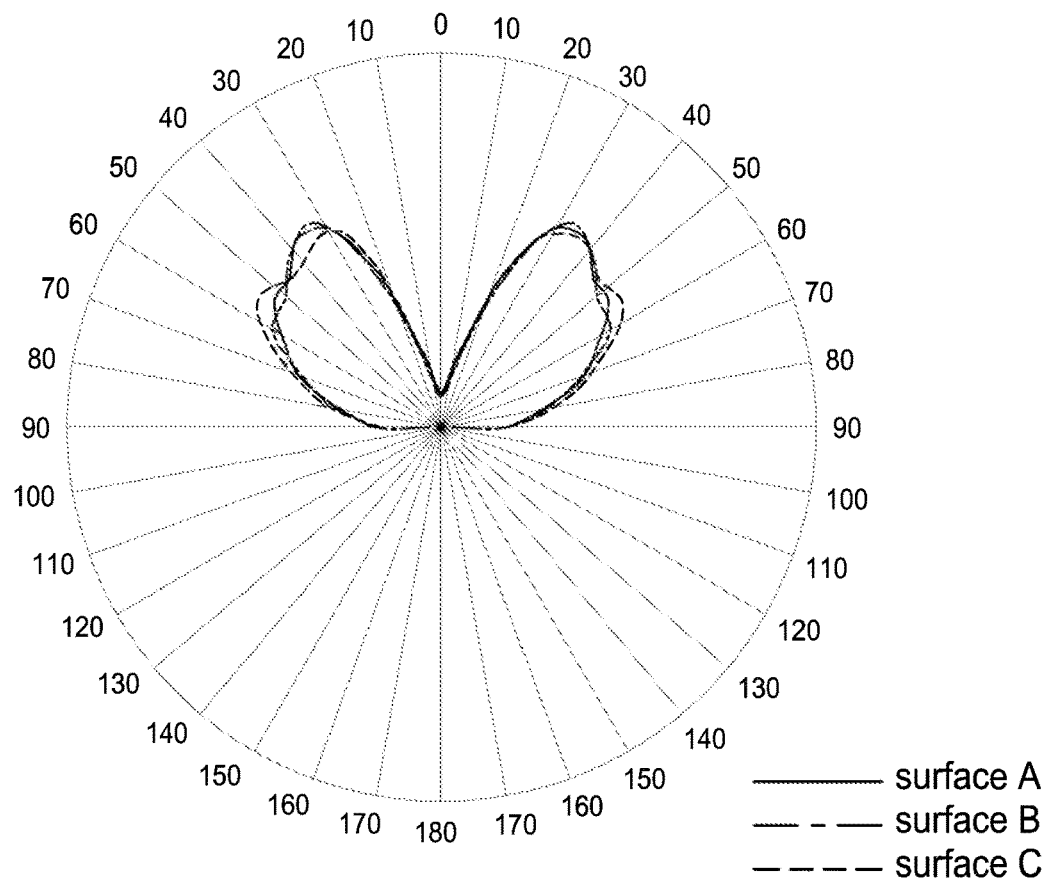
FIG. 3D shows a light distribution pattern of a light-emitting device in FIG. 3A on a polar coordinate system.

FIG. 3A shows a cross-sectional view of a light-emitting device in accordance with an embodiment of the present disclosure. The rays in FIG. 3A indicate the trajectory or tracks of the light from the light-emitting device. FIG. 3B shows a top view of a light-emitting device shown in FIG. 3A. The Z-axis matches the virtual center line L0, and the X-axis passes through the light-emitting unit 10 in a horizontal direction. The cross-sectional view of the second optical element 50 substantially includes two trapezoids arranged on two sides of the light-emitting unit 10. The side surface 501 of the second optical element 50 is a depressed surface. The top surface 201 of the carrier 20 is a mirror reflection surface to guide the light from the light-emitting unit 10 towards the two sides of the light-emitting device 2000. The left portion in FIG. 3A shows the light moving upward while the right portion shows the light moving downward. The moving direction of the light within the second optical element 50 can be upward direction, downward direction, or a combination thereof while most of the light proceeds in a direction away from the light-emitting unit 10. Similarly, a reflection happens at the side surface 501 when the light exits the second optical element 50, wherein the second optical element 50 has a depressed side surface 501. FIG. 3C shows a light distribution pattern of a light-emitting device in FIG. 3A on a cartesian coordinate system. The three curves in FIG. 3C show the light intensity measured from three different surfaces in FIG. 3B: the surface A (with respect to 90°), surface B (with respect to 135°), and surface C (with respect to 180°). The horizontal axis in FIG. 3C shows the measuring angle at a plane (for example, surface A, surface B, or surface C) while the vertical axis represents the light intensity (a.u.). The labels of 90° and −90° labeled on the horizontal axis substantially show the +X direction and the −X direction in FIG. 3A respectively while the label of 0° is overlapped with the virtual center line L0 which passes through the center of the light-emitting unit 10. The horizontal axis in FIG. 3C shows the measuring angle at a plane (for example, surface A, surface B, or surface C) while the vertical axis represents the light intensity (a.u.). Referring to FIG. 3C, the light intensity of the light-emitting device 2000 has a distribution being substantially symmetrical with respect to the 0° and has a maximum value of about 0.13 a.u. on two sides within an angle between 30° and 60°, which is about 7.2 times of the minimum light intensity (about 0.018 a.u.) at the center region within an angle between 10° and −10°. FIG. 3D shows a light distribution pattern of a light-emitting device in FIG. 3A on a polar coordinate system. Referring to FIG. 3D, the light intensity of the light-emitting device 2000 has a distribution being substantially symmetrical with respect to the 0° or the geometric center of the light-emitting unit 10, and most of the light is distributed within an angle between 30° and 60°. The difference between the light-emitting device 1000 in FIG. 2A and the light-emitting device 2000 is the depressed side surface 501 in the light-emitting device 2000. The depressed side surface 501 affects the light intensity distribution. To be more specific, the position of the highest light intensity of the light-emitting device 2000 locates within an angle range between 30° and 60° while the position of the highest light intensity of the light-emitting device 1000 locates within an angle range between 40° and 70°. The area of the center region with lower light intensity is decreased from the angle range between +15° and −15° to +10° and −10°. Besides, the ratio between the maximum light intensity and the minimum light intensity of the light-emitting device 2000 is less than that of the light-emitting device 1000.

Figure 4A:
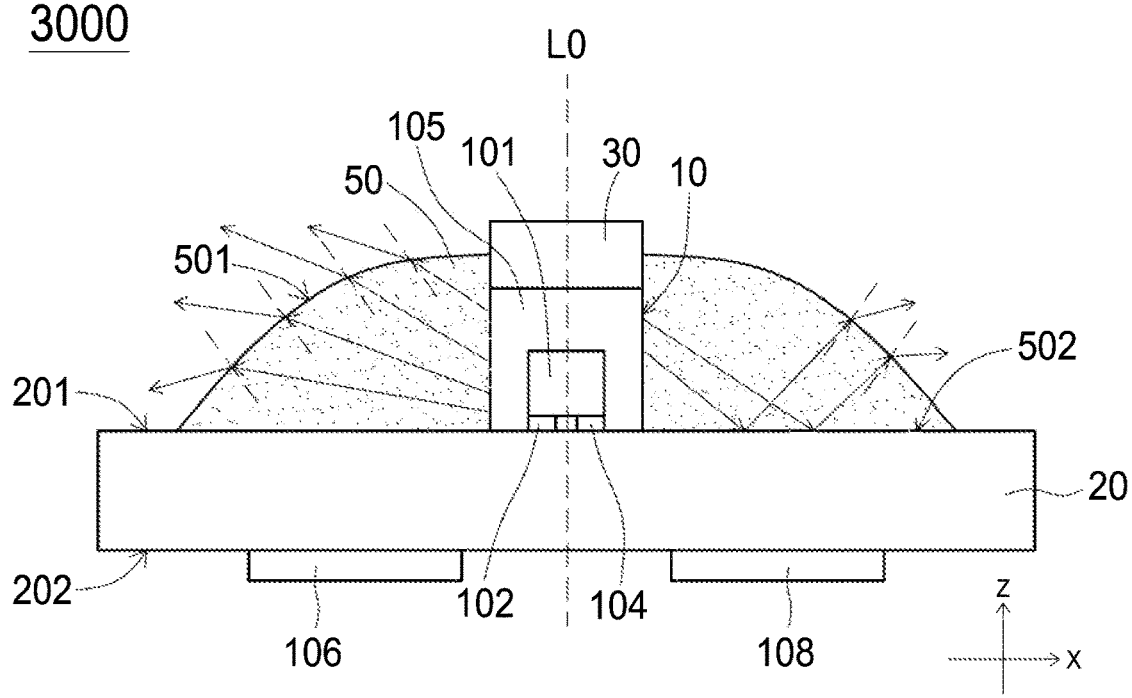
FIG. 4A shows a cross-sectional view of a light-emitting device in accordance with an embodiment of the present disclosure.
Figure 4B:
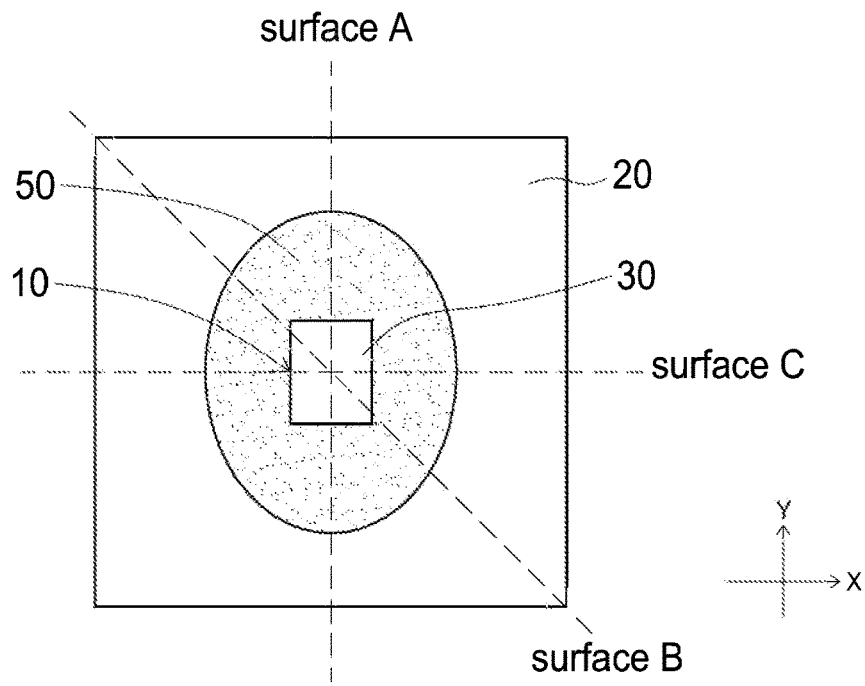
FIG. 4B shows a top view of a light-emitting device shown in FIG. 4A.
Figure 4C:
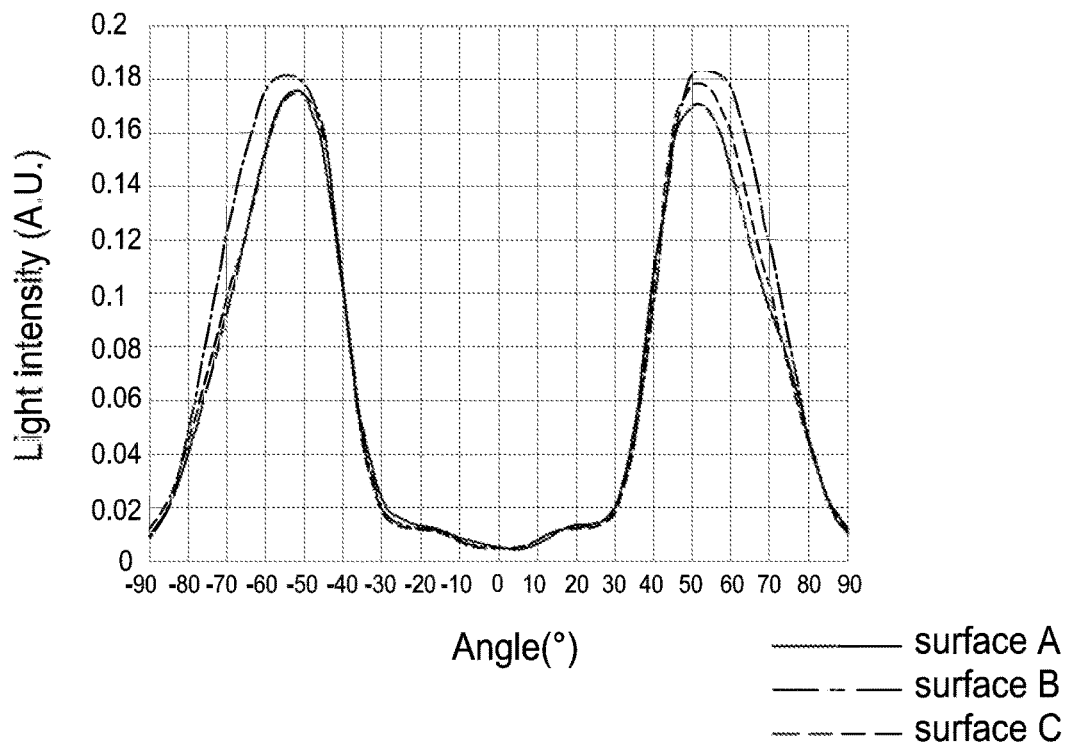
FIG. 4C shows a light distribution pattern of a light-emitting device in FIG. 4A on a cartesian coordinate system.
Figure 4D:
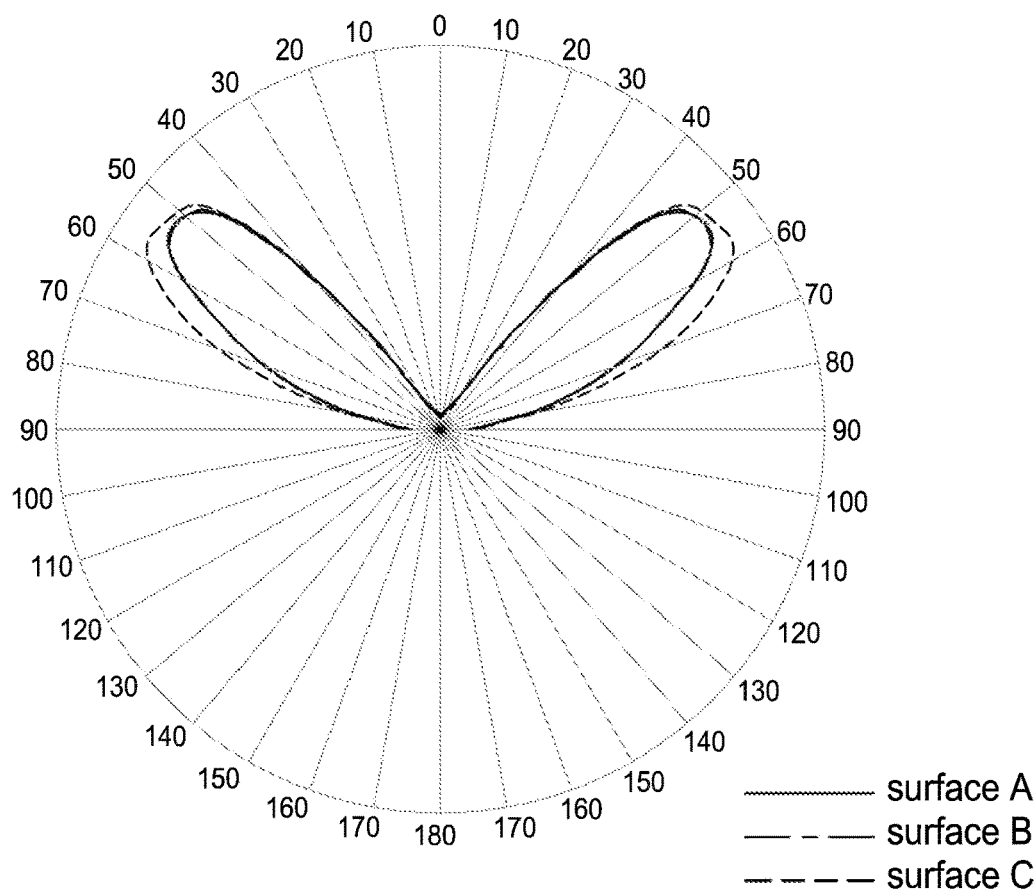
FIG. 4D shows a light distribution pattern of a light-emitting device in FIG. 4A on a polar coordinate system.

FIG. 4A shows a cross-sectional view of a light-emitting device in accordance with an embodiment of the present disclosure. The rays in FIG. 4A indicate the trajectory or tracks of the light from the light-emitting device. FIG. 4B shows a top view of a light-emitting device in FIG. 4A. The Z-axis matches the virtual center line L0, and the X-axis passes through the light-emitting unit 10 in a horizontal direction. The cross-sectional view of the second optical element 50 substantially includes two trapezoids arranged on two sides of the light-emitting unit 10. The side surface 501 of the second optical element 50 is a protruded surface. The top surface 201 of the carrier 20 is a mirror reflection surface to guide the light from the light-emitting unit 10 towards lateral sides of the light-emitting device 3000. The left portion in FIG. 4A shows the light moving upward while the right portion shows the light moving downward. The moving direction of the light within the second optical element 50 can be upward direction, downward direction, or a combination thereof while most of the light proceeds in a direction away from the light-emitting unit 10. Similarly, a reflection happens at the side surface 501 when the light exits the second optical element 50. It is noted that the second optical element 50 has a protruded side surface 501. FIG. 4C shows a light distribution pattern of a light-emitting device in FIG. 4A on a cartesian coordinate system. The three curves in FIG. 4C show the light intensity measured from three different surfaces in FIG. 4B: the surface A (with respect to) 90°, surface B (with respect to 135°), and surface C (with respect to) 180°. The horizontal axis in FIG. 4C shows the measuring angle at a plane while the vertical axis represents the light intensity (a.u.). The labels of 90° and −90° on the horizontal axis substantially show the +X direction and the −X direction in FIG. 4A respectively while the label of 0° is overlapped with the virtual center line L0 which passes through the center of the light-emitting unit 10. The horizontal axis in FIG. 4C shows the measuring angle at a plane (for example, surface A, surface B, or surface C) while the vertical axis represents the light intensity (a.u.). Referring to FIG. 4C, the light intensity of the light-emitting device 3000 has a distribution being substantially symmetrical with respect to the 0° and has a maximum value of about 0.18 a.u. on two sides within an angle range between 40° and 60°, which is about 18 times of the minimum light intensity (about 0.01 a.u.) at the center region within an angle range between 25° and −25°. FIG. 4D shows a light distribution pattern of a light-emitting device in FIG. 4A on a polar coordinate system. Referring to FIG. 4D, the light intensity of the light-emitting device 3000 has a distribution being substantially symmetrical with respect to the 0° or the geometric center of the light-emitting unit 10, and most of the light is distributed within an angle range between 40° and 60°. The difference between the light-emitting device 1000 shown in FIG. 2A and the light-emitting device 3000 is the protruded side surface 501 in the light-emitting device 3000. The protruded side surface 501 affects the light intensity distribution. To be more specific, the position of the highest light intensity of the light-emitting device 3000 locates within an angle range between 40° and 60° while the position of the highest light intensity of the light-emitting device 1000 locates within an angle range between 40° and 70°. The area of the center region with lower light intensity is increased from the angle range between +15° and −15° to +25° and −25°. Besides, the ratio between the maximum light intensity and the minimum light intensity of the light-emitting device 3000 is also higher than that of the light-emitting device 1000. Therefore, the light-emitting device 3000 can provide a better contrast of light intensity than the light-emitting device 1000.

Figure 5:
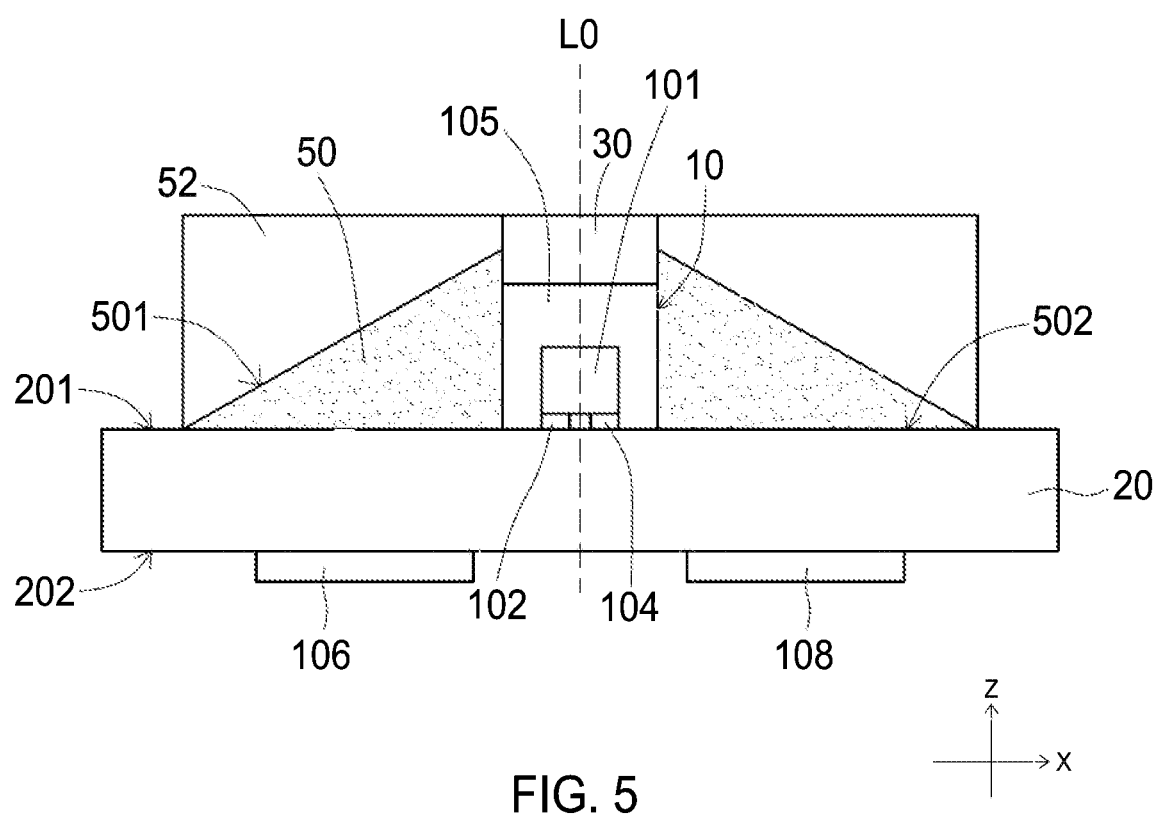
FIG. 5 shows a cross-sectional view of a light-emitting device in accordance with an embodiment of the present disclosure.

FIG. 5 shows a cross-sectional view of a light-emitting device in accordance with an embodiment of the present disclosure. FIG. 5 shows a cross-sectional view of a light-emitting device 4000. The light-emitting device 4000 has a carrier 20, a light-emitting unit 10, a first optical element 30, a second optical element 50, and a third optical element 52 formed on the second optical element 50. The light emitting unit 10 includes a light emitting structure 101, a light transmitting layer 105 surrounding and covering the light emitting structure 101 and electrodes 102, 104. The light emitting structure 101 includes a substrate (not shown), a first conductive type semiconductor layer (not shown), an active layer (not shown) and a second conductive type semiconductor layer (not shown). The substrate can be a growth substrate. The material of the substrate can be suitable for growing epitaxy layer and can be sapphire, silicon carbide, gallium nitride or gallium arsenide. The epitaxy layer can be the first conductive type semiconductor layer, the active layer, and the second conductive type semiconductor layer. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The second optical element 50 and the third optical element 52 are light-transmitting layers with respect to the light from the light-emitting unit 10. The refractive index of the second optical element 50 is different from that of the third optical element 52. For example, the second optical element 50 has epoxy resin with a refractive index between 1.5 and 1.6 and the third optical element 52 has silicon resin with a refractive index between 1.4 and 1.5. In an embodiment, the second optical element 50 and third optical element 52 include common material (for example, silicon resin or epoxy resin) and different refractive indexes. The light from the light-emitting unit 10 passes the second optical element 50 (having a higher refractive index) and the third optical element 52 (having a lower refractive index) to be concentrated on two (lateral) sides. Therefore, the center region (of the light intensity distribution) maintains at a low light intensity level. The light exits the light-emitting unit 10, passes the second optical element 50 and the third optical element 52 in sequence and enters the ambiance like air. The light passes through the third optical element 52 having a refractive index between the air (having a lower refractive index) and the second optical element 50 (having a higher refractive index) before entering the air. Therefore, the difference of refractive index on the interface which passed by the light is lowered and the occurrence opportunity of total reflection is decreased. In another aspect, the light extraction efficiency of the light-emitting device 4000 can be better. There is a proportional relationship between the size of the light-emitting unit 10 and that of the second optical element 50 in a cross-sectional view. There is a proportional relationship between the size of the light-emitting unit 10 and that of the third optical element 52 in a cross-sectional view. There is a proportional relationship between the size of the light-emitting unit 10 and that of the reflective layer on the top surface 201 or on the carrier 20 in a cross-sectional view. For example, referring to FIG. 5, the maximum width of the second optical element 50 or the third optical element 52 is three times or more of the maximum width of the light-emitting unit 10. Or the maximum width of the reflective layer on the carrier 20 or on the top surface 201 is three times or more of the maximum width of the light-emitting unit 10. In an embodiment, the maximum width of the second optical element 50 or the third optical element 52 is 5 times or more of the maximum width of the light-emitting unit 10. In one embodiment, the maximum width of the reflective layer on the carrier 20 or on the top surface 201 is 10 times or more of the maximum width of the light-emitting unit 10.

Figure 6A:
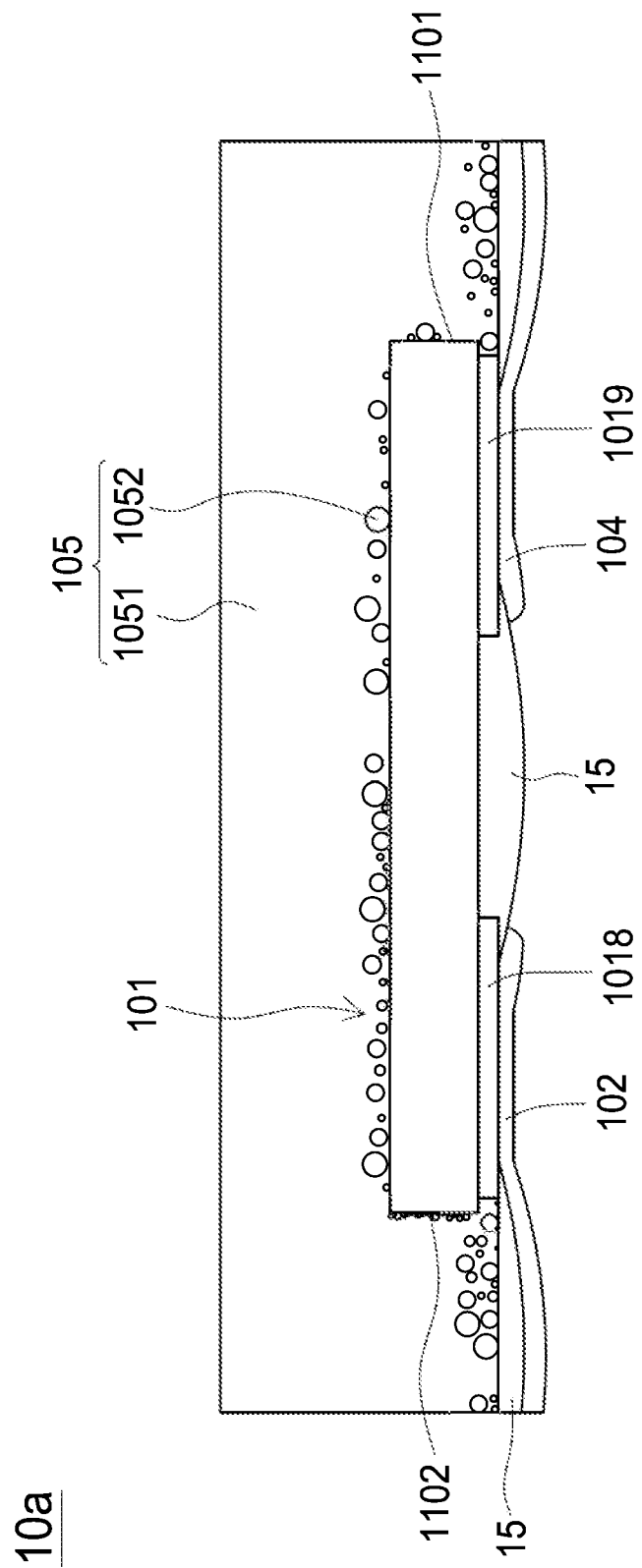
FIG. 6A shows a cross-sectional view of a light-emitting unit in accordance with an embodiment of the present disclosure.

FIG. 6A shows a cross-sectional view of a light-emitting unit in accordance with an embodiment of the present disclosure. The light-emitting unit 10a has a light-emitting structure 101, a first electrode 102, a second electrode 104, a light-transmitting layer 105, and an insulating structure 15. The light emitting structure 101 includes a substrate (not shown), a first conductive type semiconductor layer (not shown), an active layer (not shown) and a second conductive type semiconductor layer (not shown). The substrate can be a growth substrate. The material of the substrate can be sapphire, silicon carbide, gallium nitride or gallium arsenide, which is suitable for growing the first type conductive semiconductor layer, the active layer, and the second conductive type semiconductor layer. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The light-emitting structure 101 has electrode pads 1018, 1019 arranged on the bottom surface. The top surface of the light-emitting structure 101 and the side surfaces 1101, 1012 are connected to the light-transmitting layer 105. The light-transmitting layer 105 has a base 1052 and phosphor particles 1051. Part of the phosphor particles 1051 are directly connected to the top surface of the light-emitting structure 101 and the side surfaces 1101, 1012. The electrode pad 1018 is connected to the first electrode 102. The electrode pad 1019 is connected to the second electrode 104. Referring to FIG. 6A, the portion of the insulating structure 15 near the central region of the light-emitting unit 10a is directly connected to the bottom surface of the light-emitting unit 10a and a portion of the surfaces of the electrode pads 1018, 1019. Moreover, the portion of the insulating structure 15 near the central region of the light-emitting unit 10a is formed between the electrodes 102, 104 which correspond to the electrode pads 1018, 1019. The portion of the insulating structure 15 near the lateral region of the light-emitting unit 10a is formed between the electrodes 102, 104 and the light-transmitting layer 105. Moreover, some phosphor particles 1051 on the interface between the light-transmitting layer 105 and the insulating structure 15 are arranged near or directly connected to the insulating structure 15. Referring to FIG. 6A, the bottom surface of the insulating structure 15 has a curved contour. A portion of the electrodes 102, 104 is arranged along with the curved contour and has a shape similar to the curved contour.

The base 1052 includes silicon-based material, epoxy-based material or a combination thereof. The refractive index (n) of the base 1052 is between 1.4 and 1.6 or between 1.5 and 1.6. The description about the phosphor particles 1051 can be referred to the above sections and not are omitted for brevity. The insulating structure 15 is formed by curing a white paint. The white paint includes a base and multiple reflective particles (not shown) spread within the base. The base of the white paint includes silicon based material, epoxy resin based material or a combination thereof. The refractive index (n) of the base in the white paint is between 1.4 and 1.6 or between 1.5 and 1.6. In an embodiment, the material of the base can be polyimide (PI), benzocyclobutene (BCB), perfluorocyclobutane (PFCB), polymethyl methacrylate (PMMA), polyethylene terephthalate (PET), polycarbonate ester (PC), polyetherimide or fluorocarbon polymer. Reflective particles can be titanium dioxide, cerium oxide, aluminum oxide, zinc oxide, or zirconium dioxide. Reflective particles can be titanium dioxide, cerium oxide, aluminum oxide, zinc oxide, or zirconium dioxide. In an embodiment, the light from the light-emitting structure is reflected when the light hits the insulating structure 15. To be more specific, the reflection happened on the surface of the insulating structure 15 is a diffuse reflection.

The white paint has a viscosity between 0.5 and 1000 Pa·s, such as 0.5, 1, 2, 10, 30, 100, 500, or 1000 Pa·s and hardness between 40 and 90 shore D. Or, the white paint has a viscosity between 100 and 10000 Pa·s, such as 100, 300, 500, 1000, 5000, or 10000 Pa·s and a hardness between 30 and 60 shore D.

Figure 6B:
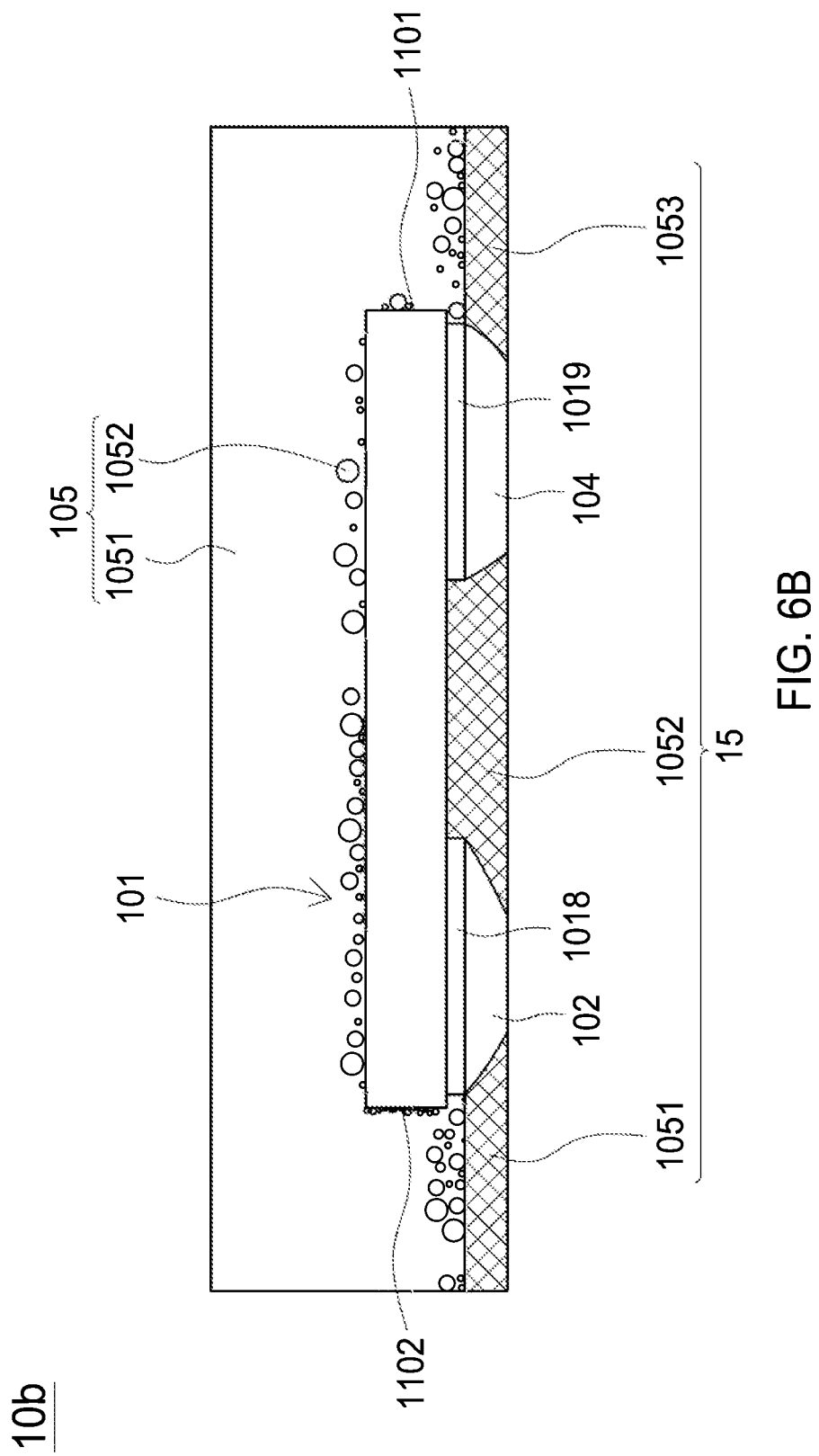
FIG. 6B shows a cross-sectional view of a light-emitting unit in accordance with an embodiment of the present disclosure.

FIG. 6B shows a cross-sectional view of a light-emitting unit in accordance with an embodiment of the present disclosure. The light-emitting unit 10b has a light-emitting structure 101, a first electrode 102, a second electrode 104, a light-transmitting layer 105, and an insulating structure 15. The light emitting structure 101 includes a substrate (not shown), a first conductive type semiconductor layer (not shown), an active layer (not shown), and a second conductive type semiconductor layer (not shown). The substrate can be a growth substrate. The material of the substrate can be sapphire, silicon carbide, gallium nitride, or gallium arsenide, which is suitable for growing the first conductive type semiconductor layer, the active layer, and the second conductive type semiconductor layer. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The light-emitting structure 101 has electrode pads 1018, 1019 arranged on the bottom surface. The top surface of the light-emitting structure 101 and the side surfaces 1101, 1012 are connected to the light-transmitting layer 105. The light-transmitting layer 105 has a base 1052 and phosphor particles 1051. Part of the phosphor particles 1051 are directly contacted with the top surface of the light-emitting structure 101 and the side surfaces 1101, 1102. The electrode pad 1018 is connected to the first electrode 102. The electrode pad 1019 is connected to the second electrode 104. The insulating structure 15 has a first part 1501, a second part 1502, and a third part 1503. The first electrode 102 is arranged between the first part 1501 and the second part 1502. The second electrode 104 is arranged between the third part 1503 and the second part 1502. The second part 1502 is directly connected to the bottom surface of the light-emitting structure 101. The bottom surfaces of the first electrode 102 and the second electrode 104 are substantially coplanar with that of the insulating structure 15. In an embodiment, the first electrode 102 and the second electrode 104 are omitted from the light-emitting unit 10b. Therefore, the bottom surface of the insulating structure 15 is substantially coplanar with that of the electrode pads 1018 and 1019. The details of the base 1052, phosphor particles 1051 and the insulating structure 15 can be referred to sections above.

In the embodiments of present disclosure, the light-emitting units, such as the light-emitting units 10, 10a, and 10b, can be arbitrarily chosen without violating the spirit of present disclosure. In other words, the light-emitting unit 10 in the embodiments can be replaced by the light-emitting unit 10a or 10b.

Figure 7:
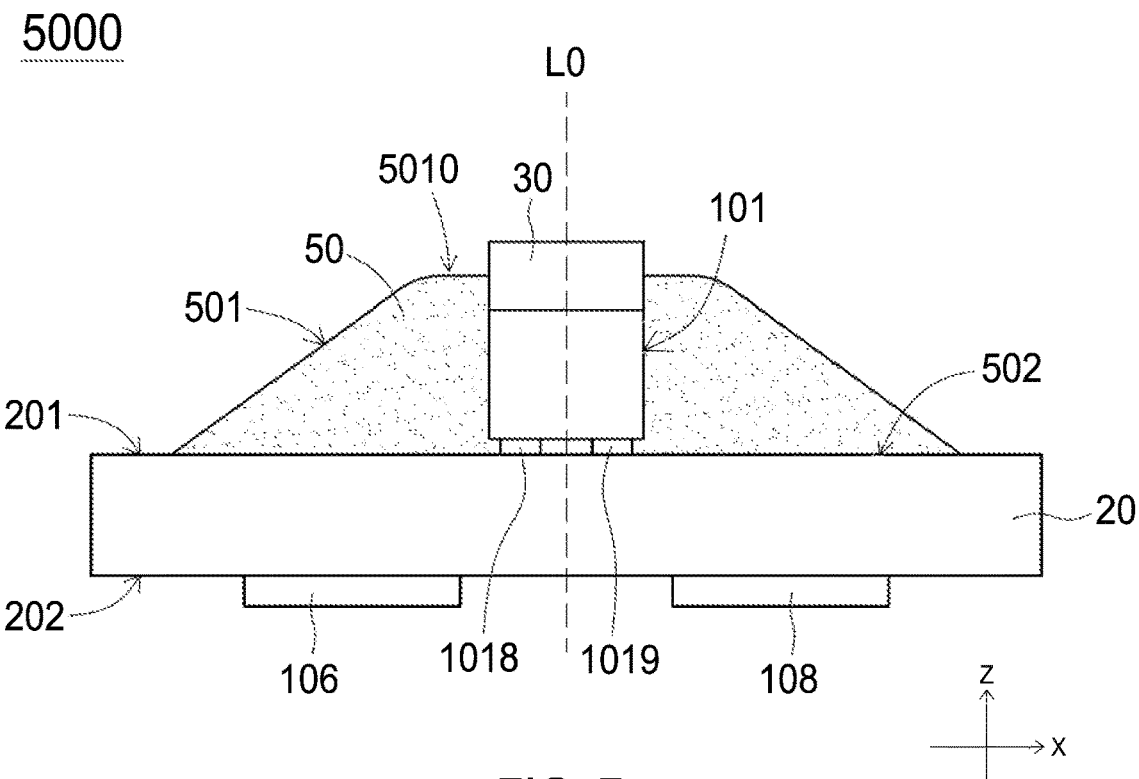
FIG. 7 shows a cross-sectional view of a light-emitting device in accordance with an embodiment of the present disclosure.

FIG. 7 shows a cross-sectional view of a light-emitting device in accordance with an embodiment of the present disclosure. The Z-axis matches the virtual center line L0, and the X-axis passes through the light-emitting structure 101 in a horizontal direction. The light-emitting device 5000 has a carrier 20, a light-emitting structure 101, a first optical element 30, a second optical element 50, and electrodes 106, 108. The light-emitting structure 101 is electrically connected to the circuit on the top surface 201 of the carrier through the electrode pads 1018, 1019. Then, the circuit on the top surface 201 is connected to the electrodes 106, 108 on the bottom surface 202 of the carrier 20. Therefore, the light-emitting structure 101 can receive the electricity from external circuit to emit a light. The light emitting structure 101 includes a substrate (not shown), a first conductive type semiconductor layer (not shown), an active layer (not shown) and a second conductive type semiconductor layer (not shown). The substrate can be a growth substrate. The material of the substrate can be suitable for growing epitaxy layer and can be sapphire, silicon carbide, gallium nitride or gallium arsenide. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The light-emitting structure 101 can be electrically connected to the circuit on the carrier 20 through the electrode pads 1018, 1019 and conductive materials, such as solder.

The light-emitting device 5000 has an optical property similar with that of the light-emitting device 1000, wherein the optical property includes light intensity, light distribution, color temperature and wavelength. The difference between the light-emitting device 1000 and 5000 is the absence of the light-transmitting layer 105. Referring to FIG. 7, the first optical element 30 is directly formed on the light-emitting structure 101. The second optical element 50 surrounds and contacts the light-emitting structure 101 and the first optical element 30. The first optical element 30 has a width substantially equal to that of the light-emitting structure 101. The second optical element 50 surrounds the light-emitting structure 101 and contacts the first optical element 30 and the light-emitting structure 101 directly. The second optical element 50 has a side surface 501 and a bottom surface 502. The side surface 501 is connected to the side surface of the first optical element 30 but is not directly contacted with the top surface of the first optical element 30. In an embodiment, the side surface 501 and the side surface of the first optical element 30 are not directly connected. The second optical element 50 includes a substantially horizontal top surface 5010 connected with the side surface 501 and the side surface of the first optical element 30. The second optical element 50 surrounds the light-emitting structure 101 and has a side surface 501 with a topmost point higher than the top surface of the light-emitting structure 101 and lower than the top surface of the first optical element 30. In an embodiment, the distance between the light-emitting structure 101 and the first optical element 30 in the light-emitting device 5000 is decreased when the light-emitting structure 101 and the first optical element 30 are directly connected to each other. Therefore, the light emitted from the light emitting structure toward the first optical element 30 does not have enough space to exit the light emitting structure 101 and is easily reflected back to the light emitting structure 101. In other words, the light from the light-emitting structure 101 is easily to be trapped between the light-emitting structure 101 and the first optical element 30 and is not easily to be guided to the peripheral region of the light-emitting structure 101.

Figure 8:
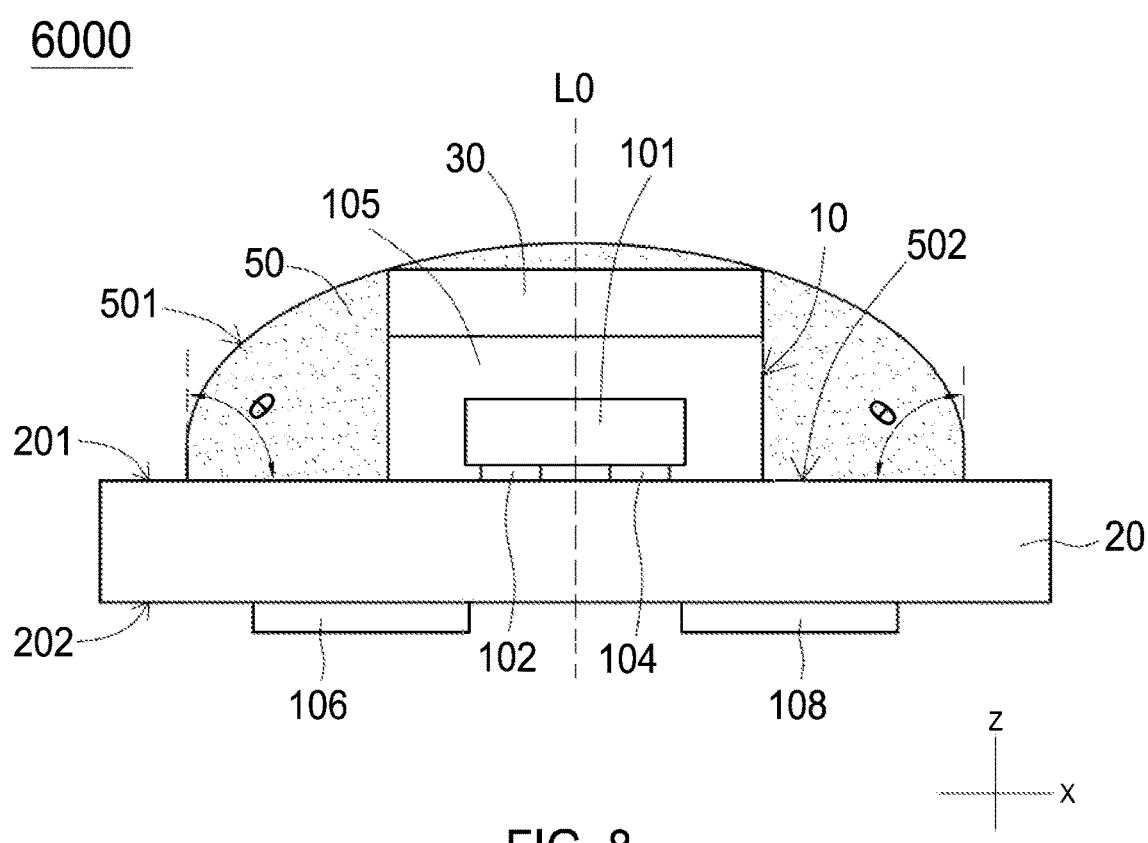
FIG. 8 shows a cross-sectional view of a light-emitting device in accordance with an embodiment of the present disclosure.

FIG. 8 shows a cross-sectional view of a light-emitting device in accordance with an embodiment of the present disclosure. The Z-axis matches the virtual center line L0, and the X-axis passes through the light-emitting unit 10 in a horizontal direction. The light-emitting device 6000 has a carrier 20, a light-emitting unit 10, a first optical element 30, and a second optical element 50. The light emitting unit 10 includes a light emitting structure 101, a light transmitting layer 105 surrounding and covering the light emitting structure 101 and electrodes 102, 104, 106, 108. The light emitting structure 101 includes a substrate (not shown), a first conductive type semiconductor layer (not shown), an active layer (not shown) and a second conductive type semiconductor layer (not shown). The substrate can be a growth substrate. The material of the substrate can be suitable for growing epitaxy layer and can be sapphire, silicon carbide, gallium nitride or gallium arsenide. The epitaxy layer can be the first conductive type semiconductor layer, the active layer, and the second conductive type semiconductor layer. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The characteristics and discussions about elements having same names or marked as same numbers in the light-emitting device 6000 and light-emitting devices 1000, 2000, 3000, and 4000 are omitted for brevity and can be referred to previous sections. Referring to FIG. 8, the side surface 501 of the second optical element 50 has a curved contour. The side surface 501 is higher than the first optical element 30. The second optical element 50 in the light-emitting device 6000 substantially covers the light-emitting unit 10 and the first optical element 30. The side surface of the first optical element 30 is also covered by the second optical element 50. However, the side surface of the first optical element 30 can be exposed to external medium without being covered by the second optical element 50. The side surface 501 of the second optical element 50 can be directly connected to or at a distance greater than zero from the edge or side surface of the first optical element 30. In the light-emitting device 6000, an angle θ is formed between the side surface 501 and the bottom surface 502 (or the top surface 201 of the carrier 20). In an embodiment, the angle θ is smaller than 90°, such as 45°. In an embodiment, the angle θ is larger than 90°, such as 120°. There is a proportional relationship between the size of the light-emitting unit 10 and that of the second optical element 50 in a cross-sectional view. There is a proportional relationship between the size of the light-emitting unit 10 and that of the reflective layer on the top surface 201 or on the carrier 20 in a cross-sectional view. For example, referring to FIG. 8, the maximum width of the second optical element 50 is three times or more of the maximum width of the light-emitting unit 10. Or the maximum width of the reflective layer which is arranged on the carrier 20 or on the top surface 201 is three times or more of the maximum width of the light-emitting unit 10. In an embodiment, the maximum width of the second optical element 50 is 5 times or more of the maximum width of the light-emitting unit 10. In one embodiment, the maximum width of the reflective layer which is arranged on the carrier 20 or the maximum width of the reflective layer which is arranged on the top surface 201 is 10 times or more of the maximum width of the light-emitting unit 10.

Figure 9A:
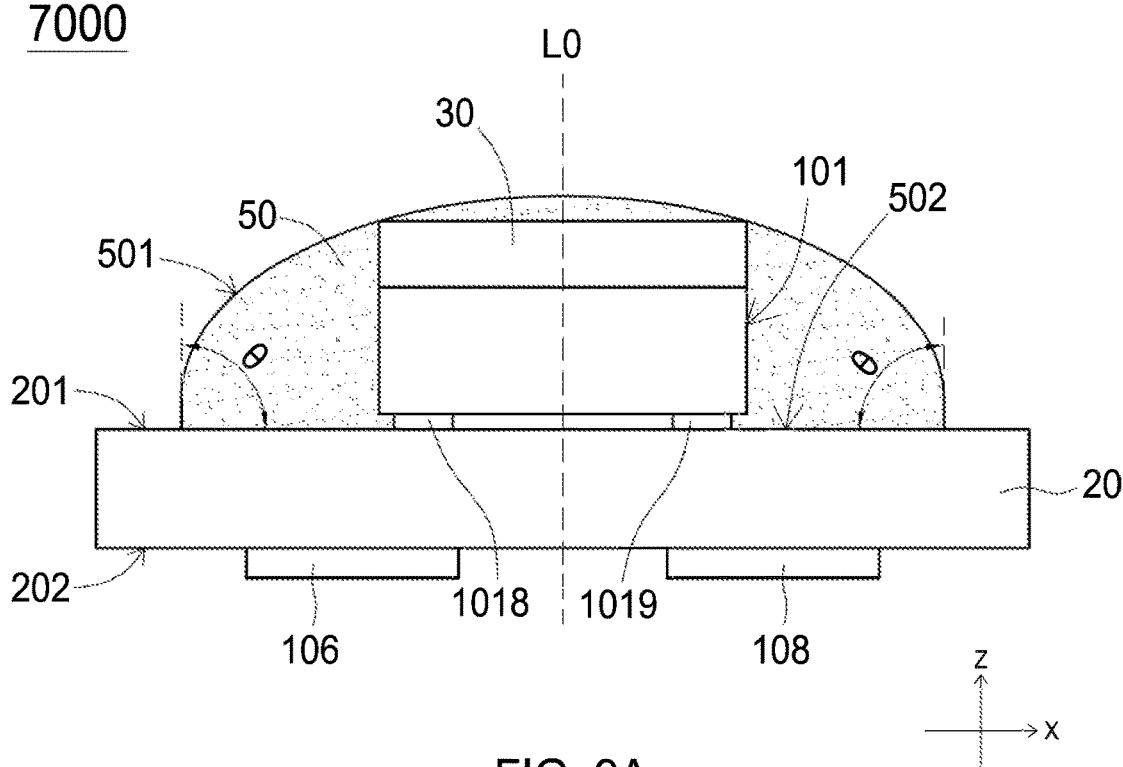
FIG. 9A shows a cross-sectional view of a light-emitting device in accordance with an embodiment of the present disclosure.
Figure 9B:
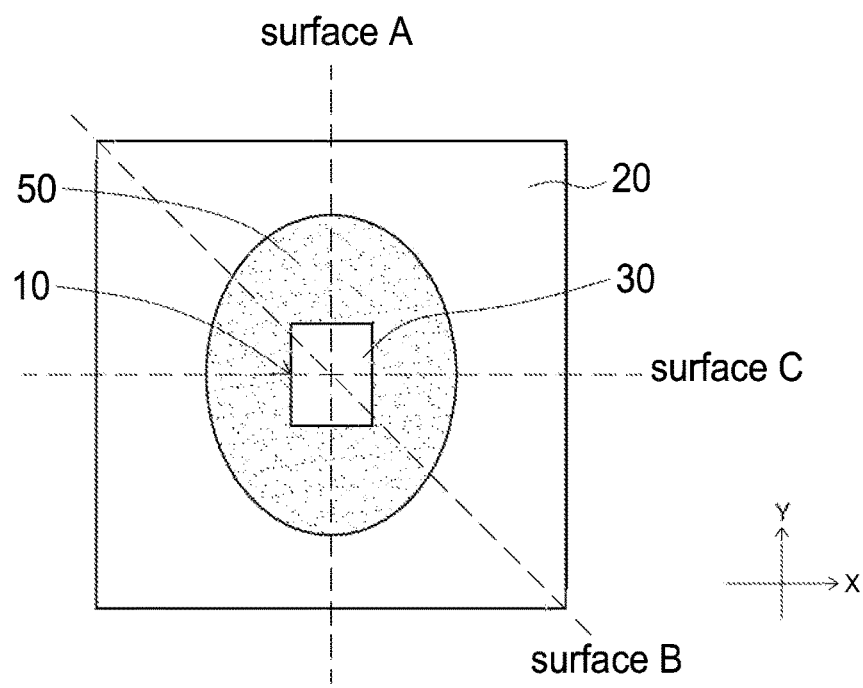
FIG. 9B shows a top view of a light-emitting device shown in FIG. 9A.

FIG. 9A shows a cross-sectional view of a light-emitting device in accordance with an embodiment of the present disclosure. FIG. 9B shows a top view of a light-emitting device in FIG. 9A. The Z-axis matches the virtual center line L0, and the X-axis passes through the light-emitting structure 101 in a horizontal direction. The light-emitting device 7000 has a carrier 20, a light-emitting structure 101, a first optical element 30, a second optical element 50, and electrodes 106, 108. The light emitting structure 101 includes electrode pads 1018, 1019, a substrate (not shown), a first conductive type semiconductor layer (not shown), an active layer (not shown), and a second conductive type semiconductor layer (not shown). The substrate can be a growth substrate. The material of the substrate can be suitable for growing epitaxy layer and can be sapphire, silicon carbide, gallium nitride or gallium arsenide. The epitaxy layer can be the first conductive type semiconductor layer, the active layer, and the second conductive type semiconductor layer. The substrate can be a substrate not suitable for growing epitaxy layer. The material of the substrate can be solid (for example, ceramic) or elastic (for example, glass fiber or triazine resin (BT)). The substrate can be thinned or removed during manufacturing process. The characteristics and discussions about elements having same names or marked as same numbers in the light-emitting device 7000 and light-emitting device 5000 are omitted for brevity and can be referred to previous sections. Referring to FIG. 9A, the side surface 501 of the second optical element 50 has a curved contour. The side surface 501 is higher than the first optical element 30. The second optical element 50 in the light-emitting device 7000 substantially covers the light-emitting unit 10 and the first optical element 30. The side surface of the first optical element 30 is also covered by the second optical element 50. However, the outer edge of the first optical element 30 can be exposed to external medium without being covered by the second optical element 50. The side surface 501 of the second optical element 50 can be directly connected to or at a distance greater than zero from the edge or side surface of the first optical element 30. The second optical element 50 covers the side surface of the first optical element 30. An angle θ is formed between the side surface 501 and the bottom surface 502 (or the top surface 201 of the carrier 20). In an embodiment, the angle θ is smaller than 90°, such as 45°. In an embodiment, the angle θ is larger than 90°, such as 120°.

Figure 9C:
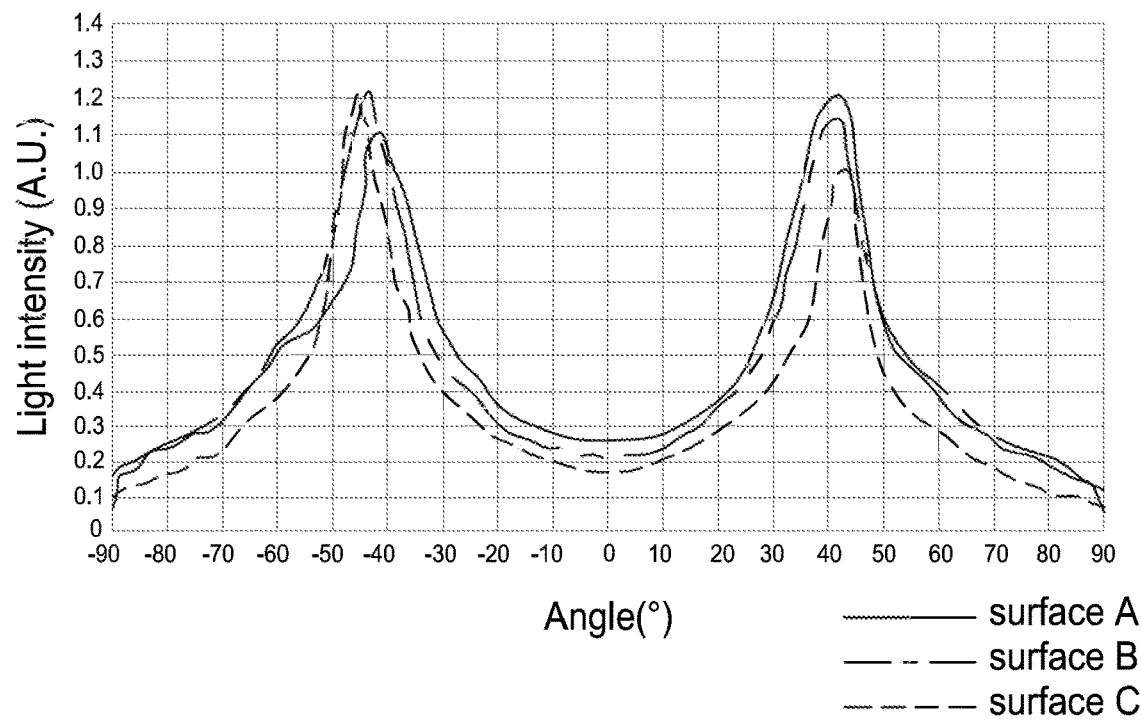
FIG. 9C shows a light distribution pattern on a cartesian coordinate system of a light-emitting device shown in FIG. 9A.
Figure 9D:
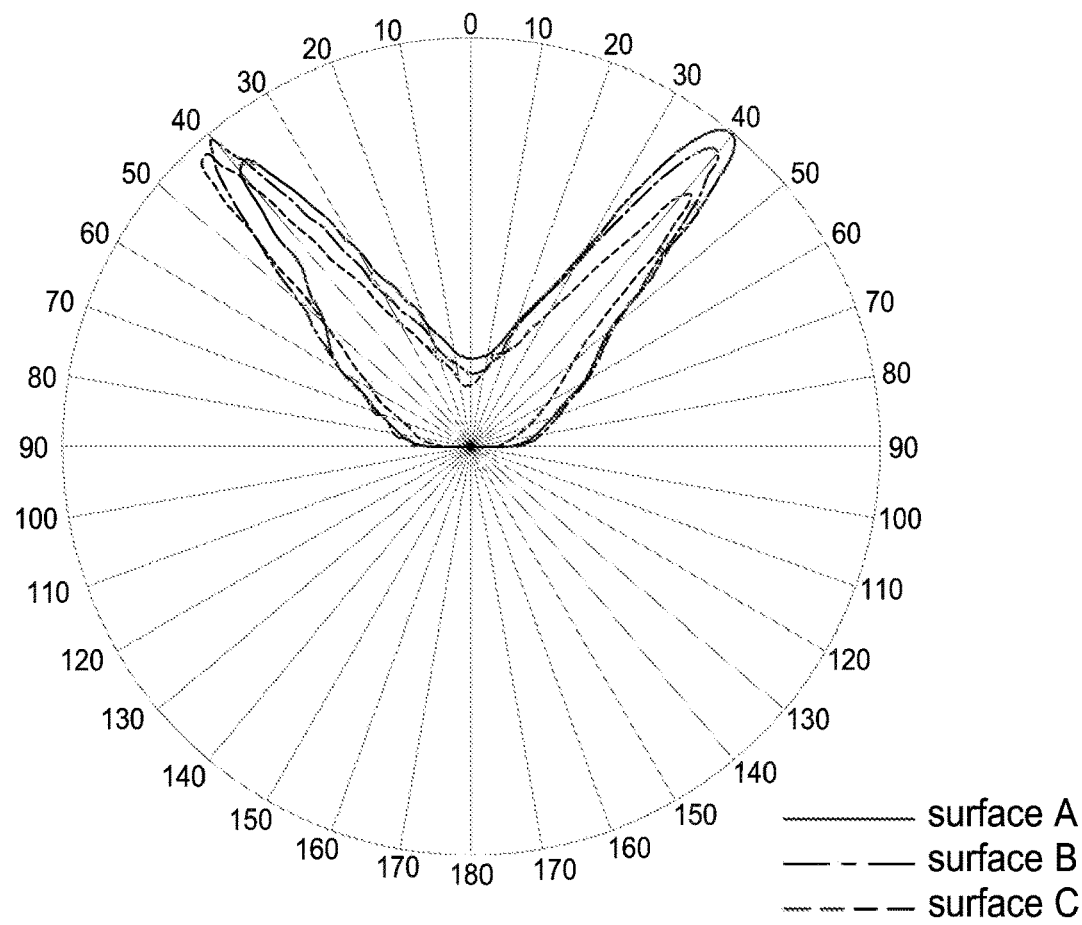
FIG. 9D shows a light distribution pattern on a polar coordinate system of a light-emitting device shown in FIG. 9A.

FIG. 9C shows a light distribution pattern on a cartesian coordinate system of a light-emitting device shown in FIG. 9A. The three curves in FIG. 9C show the light intensity measured from three different surfaces in FIG. 9B: the surface A (with respect to 90°), surface B (with respect to 135°), and surface C (with respect to 180°). The horizontal axis in FIG. 9C shows the measuring angle at a plane (for example, surface A, surface B, or surface C) while the vertical axis represents the light intensity (a.u.). The labels of 90° and −90° labeled on the horizontal axis substantially show the +X direction and the −X direction in FIG. 9A respectively while the label of 0° is overlapped with the virtual center line L0 which passes through the center of the light-emitting structure 101. The horizontal axis in FIG. 9C shows the measuring angle at a plane (for example, surface A, surface B, or surface C) while the vertical axis represents the light intensity (a.u.). Referring to FIG. 9C, the distribution of the light intensity of the light-emitting device 7000 is substantially distributed with respect to the 0° symmetrically and has a maximum value of about 1.2 a.u. on two sides within an angle range between 40° and 50°, which is about 4 times of the minimum light intensity (about 0.3 a.u.) at the center region within an angle range between 10° and −10°. FIG. 9D shows a light distribution pattern on a polar coordinate system of a light-emitting device shown in FIG. 9A. Referring to FIG. 9D, the light intensity of the light-emitting device 7000 has a distribution being substantially symmetrical with respect to the 0° or the geometric center of the light-emitting unit 10, and most of the light is distributed within an angle ranged between 40° and 50°. The difference between the light-emitting device 1000 in FIG. 2A and the light-emitting device 7000 is that the second optical element 50 covers the light-emitting structure 101 and the first optical element 30. The side surface of the first optical element 30 is entirely covered by the second optical element 50. Therefore, the light intensity distribution of the light-emitting device 7000 is influenced. To be more specific, the position of the highest light intensity of the light-emitting device 7000 locates within an angle range between 40° and 50° while the position of the highest light intensity of the light-emitting device 1000 locates within an angle range between 40° and 70°. The area of the center region with lower light intensity is decreased from the angle range between +15° and −15° to +10° and −10°. Besides, the ratio between the maximum light intensity and the minimum light intensity of the light-emitting device 7000 is less than that of the light-emitting device 1000.

Figure 9E:
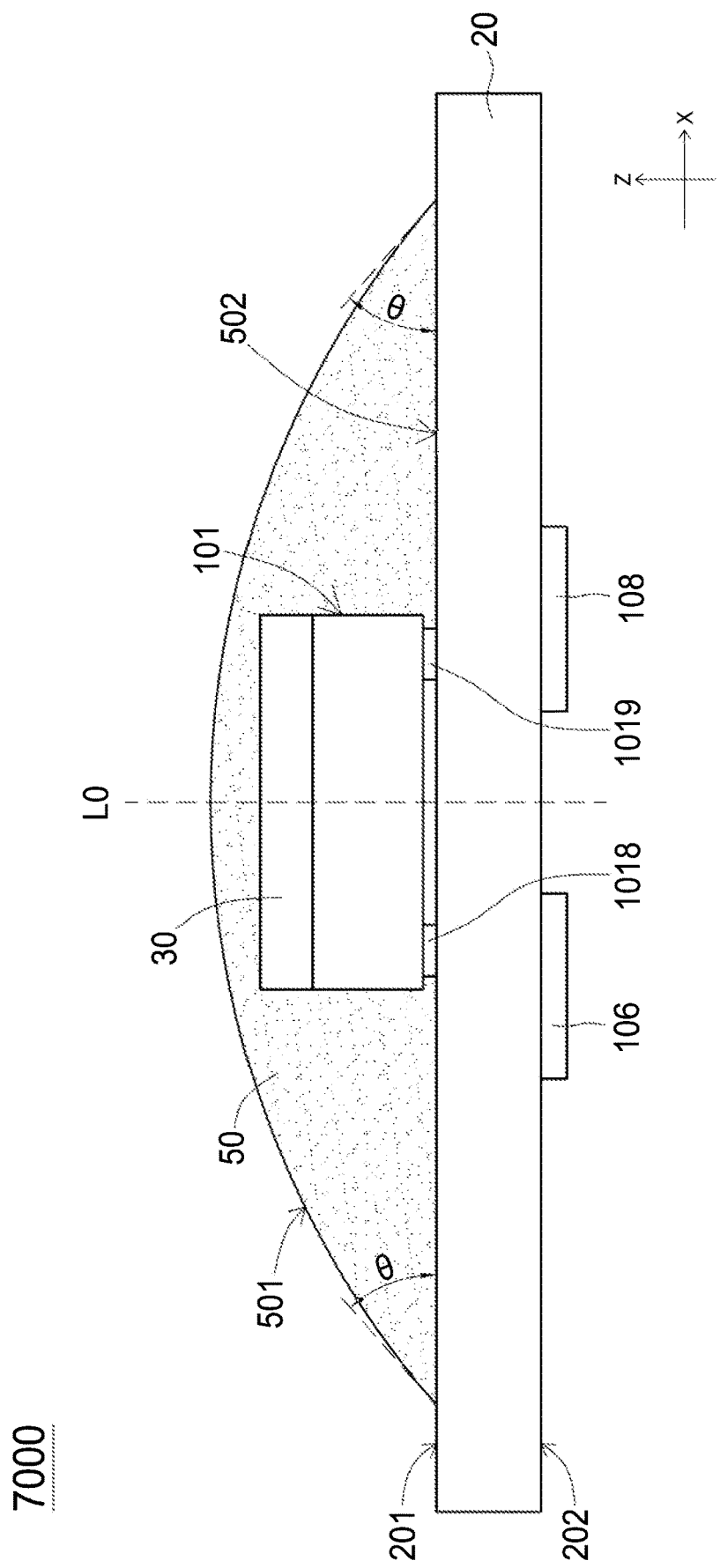
FIG. 9E shows a cross-sectional view of a light-emitting device in accordance with an embodiment of the present disclosure.

In another embodiment, the cross-sectional view of the second optical element 50 substantially includes two trapezoids arranged on two sides of the light-emitting structure 101 as shown in FIG. 9E. FIG. 9E shows a cross-sectional view of a light-emitting device in accordance with an embodiment of the present disclosure. The side surface 501 of the second optical element 50 is an inclined surface. An angle θ smaller than 90° is formed between the side surface 501 and the bottom surface 502 (or the top surface 201 of the carrier 20). In an embodiment, the angle θ is 45°.

Figure 10A:
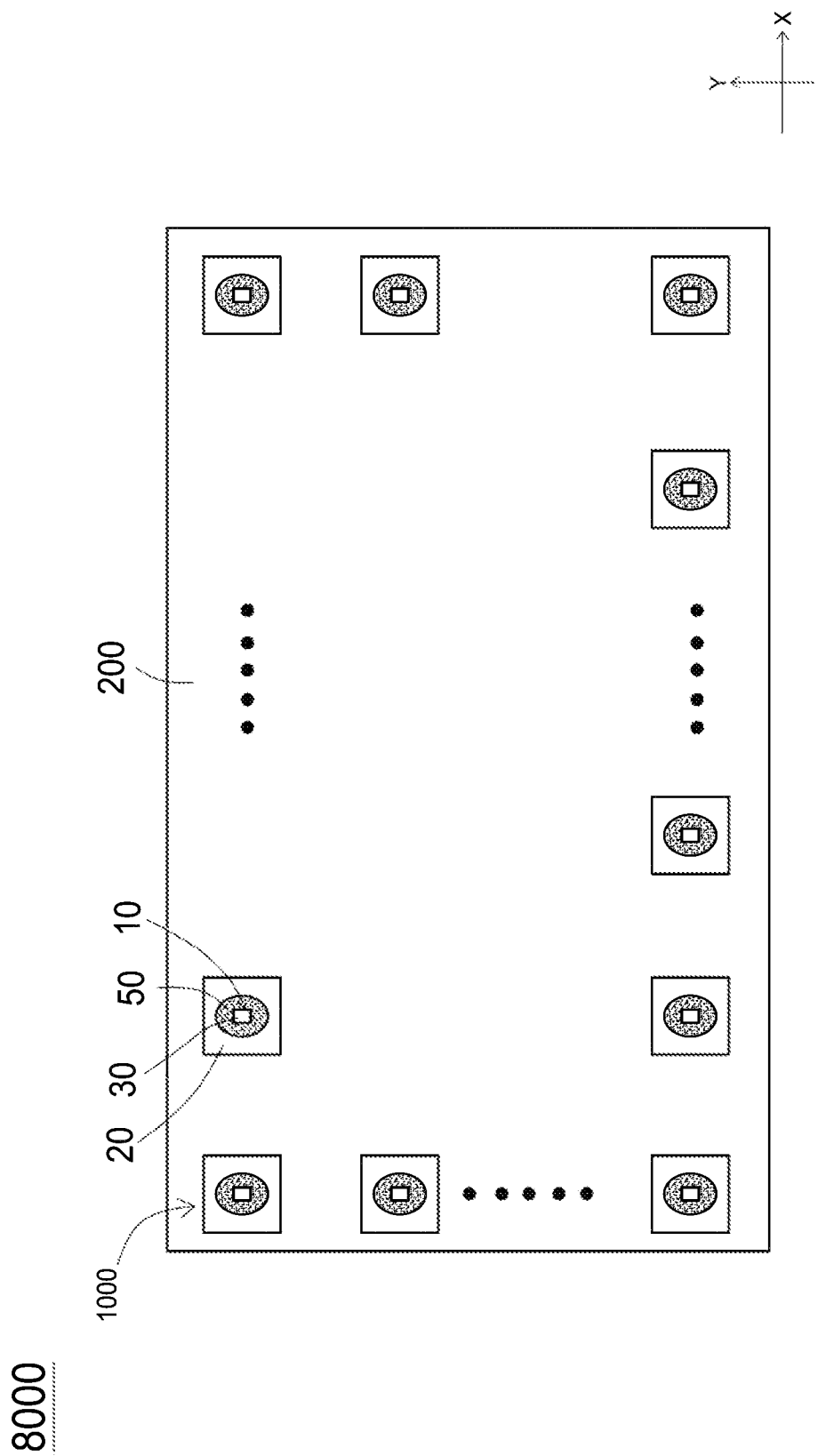
FIG. 10A shows a top view of a light-emitting apparatus in accordance with an embodiment of the present disclosure.

FIG. 10A shows a top view of a light-emitting device in accordance with an embodiment of the present disclosure. Referring to FIG. 10A, the top view is defined by an X-axis and a Y-axis. The light-emitting apparatus 8000 has a carrier 200, multiple light-emitting devices 1000 and a fourth optical element 54 (referring to FIG. 10B) covering these light-emitting devices 1000. The light-emitting device 1000 has a carrier 20, a light-emitting unit 10, a first optical element 30, a second optical element 50 and electrodes 106, 108 (not shown). The light emitting unit 10 includes a light emitting structure 101 (not shown), a light transmitting layer 105 (not shown) surrounding and covering the light emitting structure 101 and electrodes 102, 104 (not shown). The light emitting structure 101 includes a first conductive type semiconductor layer (not shown), an active layer (not shown) and a second conductive type semiconductor layer (not shown). The characteristics of the elements can be referred to elements with same numbers or names in the previous sections, and are omitted for brevity. The top surface 201 of the carrier 200 is a mirror reflection surface to efficiently extract light from the light-emitting units 10. These light-emitting devices 1000 are arranged in a form of a matrix on the carrier 200 with a fixed interval in X direction and a fixed interval in Y direction regularly. The optical characteristics of the light-emitting devices 1000, such as light-emitting intensity, light intensity distribution, color temperature and wavelength are substantially the same. In another embodiment, the interval between two light-emitting devices can be the same or different. Or, the interval in one direction, such as in X direction or in Y direction, is gradually increased or decreased. In another embodiment, the light-emitting device 1000 can be replaced by other light-emitting devices, such as the light-emitting device 2000, 3000, 4000, 5000, 600, or 7000.

Figure 10B:
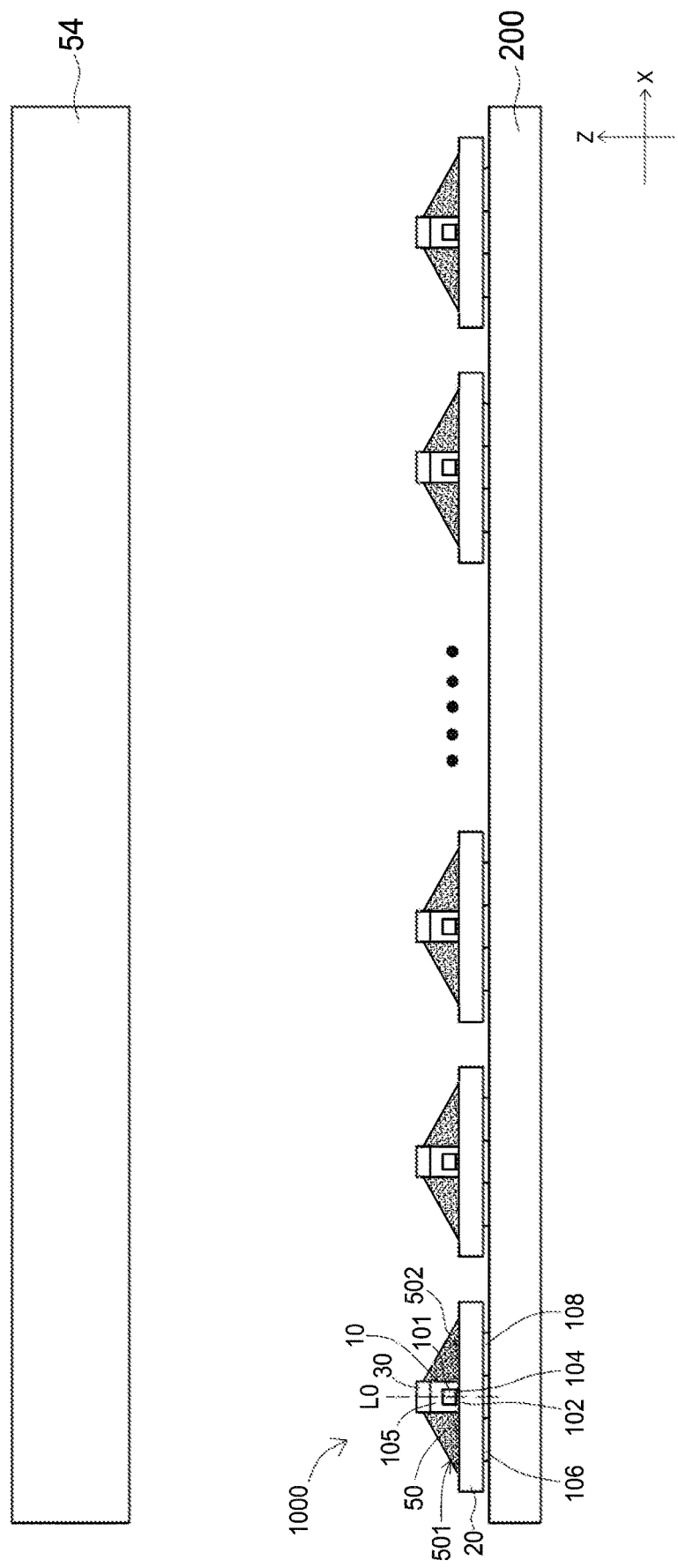
FIG. 10B shows a cross-sectional view of a light-emitting apparatus shown in FIG. 10A.

FIG. 10B shows a cross-sectional view of a light-emitting device in FIG. 10A. Referring to FIG. 10B, the cross-sectional view is defined by an X-axis and a Z-axis. The fourth optical element 54 covers multiple light-emitting devices 1000 to adjust the light from the light-emitting devices 1000. The fourth optical element 54 can be a single layer structure or a multilayers structure (for example, including a brightness enhancing film, a prism sheet, a diffusion film and/or an alignment film) to adjust the optical characteristic, such as traveling direction. In an embodiment, the fourth optical element 54 includes a film having wavelength conversion material, such as phosphor or quantum dot. Referring to FIG. 10B, the light-emitting apparatus 8000 has light-emitting devices 1000 arranged in X direction and Y direction in fixed intervals. The plurality of the light-emitting devices 1000 has a characteristic of higher light intensity on lateral sides than that on the center portion (as shown in the light distribution pattern on a cartesian coordinate system and/or on a polar coordinate system in the previous sections). Therefore, the light-emitting apparatus 8000 can provide a planar light field with high uniformity and less bright or dark areas (or spots). To be more specific, the difference between the maximum light intensity and the minimum light intensity provided by the planar light field is less than 3%~10% of the maximum light intensity. Or, no dark or bright lines can be discerned.

Figure 11A:
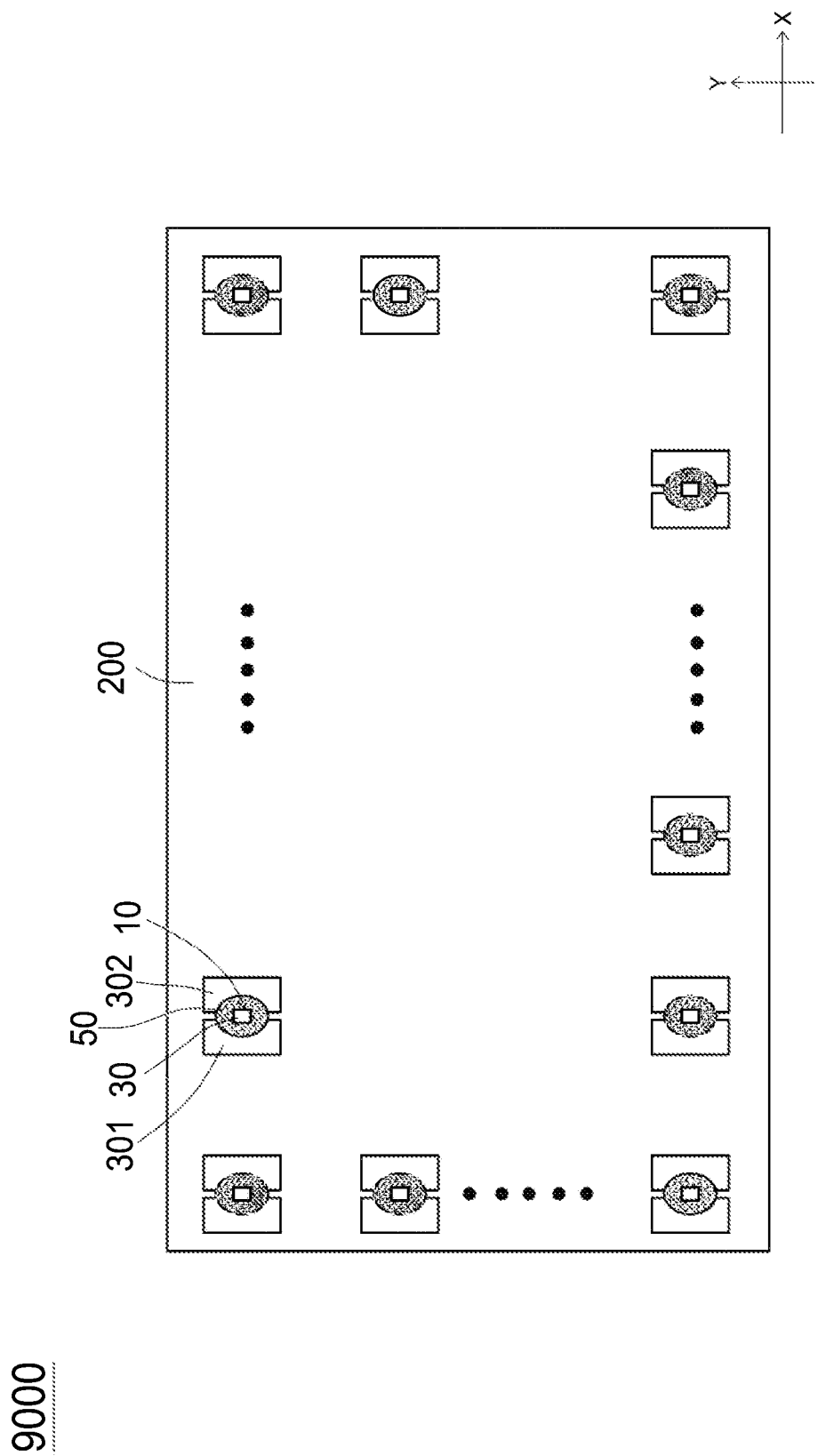
FIG. 11A shows a top view of a light-emitting apparatus in accordance with an embodiment of the present disclosure.

FIG. 11A shows a top view of a light-emitting device in accordance with an embodiment of the present disclosure. Referring to FIG. 11A, the top view is defined by an X-axis and a Y-axis. The light-emitting apparatus 9000 has a carrier 200, multiple light-emitting units 10, multiple first optical elements 30, multiple second optical elements 50, multiple circuit portions 301, 302 and a fourth optical element 54 (referring to FIG. 11B).

Referring to FIG. 11A, the light-emitting units 10 are arranged in a form of a matrix on the carrier 200 with a fixed interval in X direction and a fixed interval in Y direction. The size of the matrix can match the aspect ratio of a display, such as 4:3, 3:2, 16:9, 18:9, 1.85:1, or 2.39:1. More detail about the aspect ratio can be referred to the Wikipedia aspect ratio entry. The optical characteristics of each of the light-emitting units 10, such as light-emitting intensity, light intensity distribution, color temperature, and wavelength, are substantially the same. However, if the optical characteristics of the light-emitting units discussed above are different from each other, the visual effect caused by the unevenness of the characteristics of the light-emitting units 10 can be reduced by randomly arranging the light-emitting unit 10 on the whole area or a partial area of the carrier 200. In another embodiment, the interval between two light-emitting units can be the same or different. Or, the interval in one direction, such as in X direction or in Y direction, is gradually increased or decreased. In another embodiment, the light-emitting unit 10 can be replaced by other light-emitting unit, such as the light-emitting unit 10*a* in FIG. 6A and the light-emitting unit 10*b* in FIG. 6B.

Figure 11B:
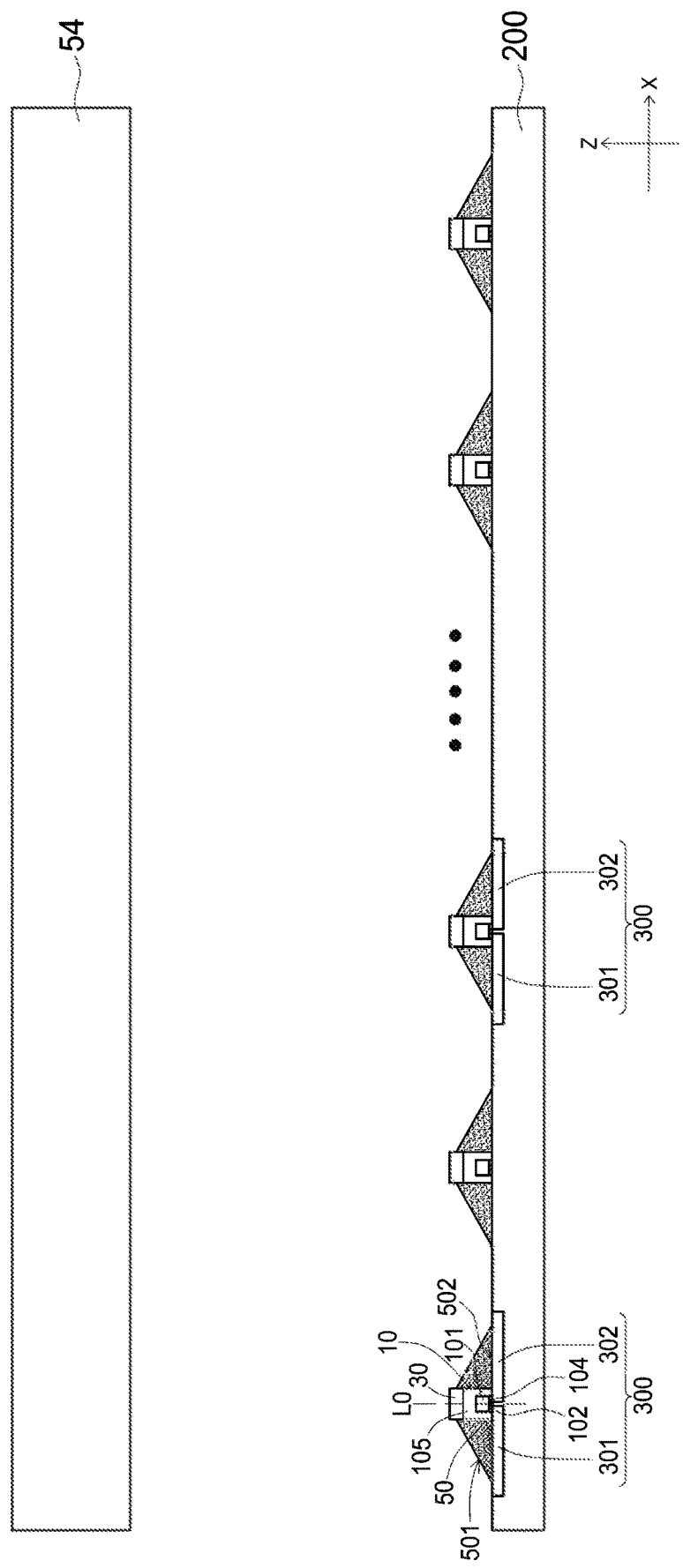
FIG. 11B shows a cross-sectional view of a light-emitting apparatus shown in FIG. 10A.

FIG. 11B shows a cross-sectional view of a light-emitting device in FIG. 11A. Referring to FIG. 11B, the cross-sectional view is defined by an X-axis and a Z-axis. In FIG. 11B, the fourth optical element 54 is arranged on the light-emitting unit 10 and covers multiple first optical elements 30 and multiple second optical elements 50. In an embodiment, the fourth optical element 54 includes a film having wavelength conversion material, such as phosphor or quantum dot. The light emitting unit 10 includes a light emitting structure 101, a light transmitting layer 105 surrounding and covering the light emitting structure 101 and electrodes 102, 104. The light emitting structure 101 includes a first conductive type semiconductor layer (not shown), an active layer (not shown) and a second conductive type semiconductor layer (not shown). The characteristics of the elements can be referred to elements with same numbers or names in the previous sections, and are omitted for brevity. The carrier 200 has circuit layer 300 to be electrically connected to the electrodes 102, 104 of the light-emitting units 10. To be more specific, the circuit layer 300 has a first circuit portion 301 and a second circuit portion 302 electrically connected to the electrodes 102, 104 respectively. The surface of the circuit portions 301, 302 connected to the light-emitting units 10 can reflect or diffuse the light from the light-emitting unit 10. In an embodiment, the surface of the circuit portions 301, 302 connected to the light-emitting units 10 has reflective metal, such as silver, gold, copper and/or aluminum in order to be electrically connected to the light-emitting units 10 and to reflect the light from the light-emitting units 10 in an upward direction and/or in a lateral direction. The reflection can be mirror reflection or diffusion reflection. If the reflection type provided by the circuit portions 301 and 302 is mirror reflection, the light from the light-emitting units 10 can be efficiently dispersed to lateral sides of the light-emitting apparatus 9000.

Figure 11C:
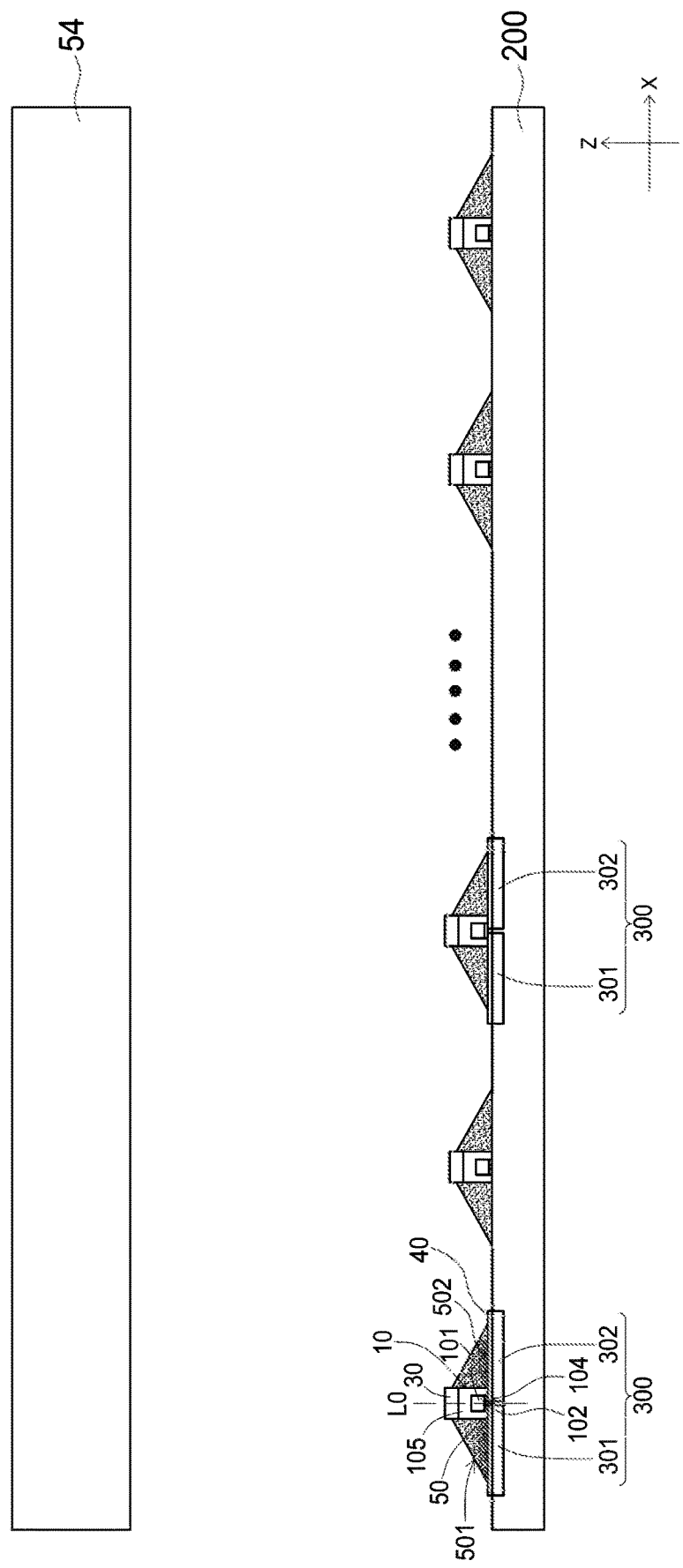
FIG. 11C shows a cross-sectional view of a light-emitting apparatus in accordance with an embodiment of the present disclosure.

FIG. 11C shows a cross-sectional view of a light-emitting device in accordance with an embodiment of the present disclosure. Referring to FIG. 11C, a reflective layer 40 is formed on the carrier to be entirely or partially overlapped with the circuit layer 300. The reflective layer 40 is covered by the fourth optical element 54. The reflective layer 40 is arranged corresponding to the light-emitting units 10 to reflect light from the light-emitting unit 10. The reflective layer 40 can be a diffusion reflection surface, wherein the light can be reflected to multiple directions. Or, the reflective layer 40 can be a mirror reflection surface, wherein the light can be reflected to a single direction and the incident angle of light is equal to the angle of reflection. The material of the reflective layer 40 can be an insulating material and/or conductive material. The insulating material can be white paint or ceramic ink. The conductive material can be metal, such as silver and aluminum. Description about materials can be referred to previous sections, and are omitted for brevity. In order to reflect light from the light-emitting unit 10, the area of the reflective layer 40 can be larger than that of the first optical element 30. To be more specific, the projection area of the reflective layer 40 on the carrier 200 is larger than that of the first optical element 30. Moreover, the projection area of the reflective layer 40 on the carrier 200 is larger than that of the second optical element 50. In an embodiment, the projection area of the reflective layer 40 on the carrier 200 is smaller than or equal to that of the second optical element 50. In an embodiment, the projection area of the first optical element 10 on a surface defined by X-axis and Y-axis is 125 μm*125 μm and the projection area of the reflective layer 40 on the same plane is 1 mm*1 mm. In an embodiment, the lengths of projections on a surface of the first optical element 30 and the reflective layer 40 in one direction form a ratio between 0.1~0.05, such as 0.25 and 0.125. To be more specific, the projection of the first optical element 30 on the plane defined by X axis and Y axis has a length of 250 μm while that of the reflective layer 40 has a length of 1 mm, wherein a ratio between them is 0.25. If the reflective layer 40 is insulated, at least part of the circuit portions 301 and 302 connected to the electrodes 102 and 104 is not covered by the reflective layer 40. In an embodiment, the reflective layer 40 on the carrier 200 extends to the region between the electrodes 102, 104 and the carrier 200. In an embodiment, the reflective layer 40 on the carrier 200 is overlapped with the light-emitting unit 10, the first optical element 30, and the second optical element 50.

Figure 11D:
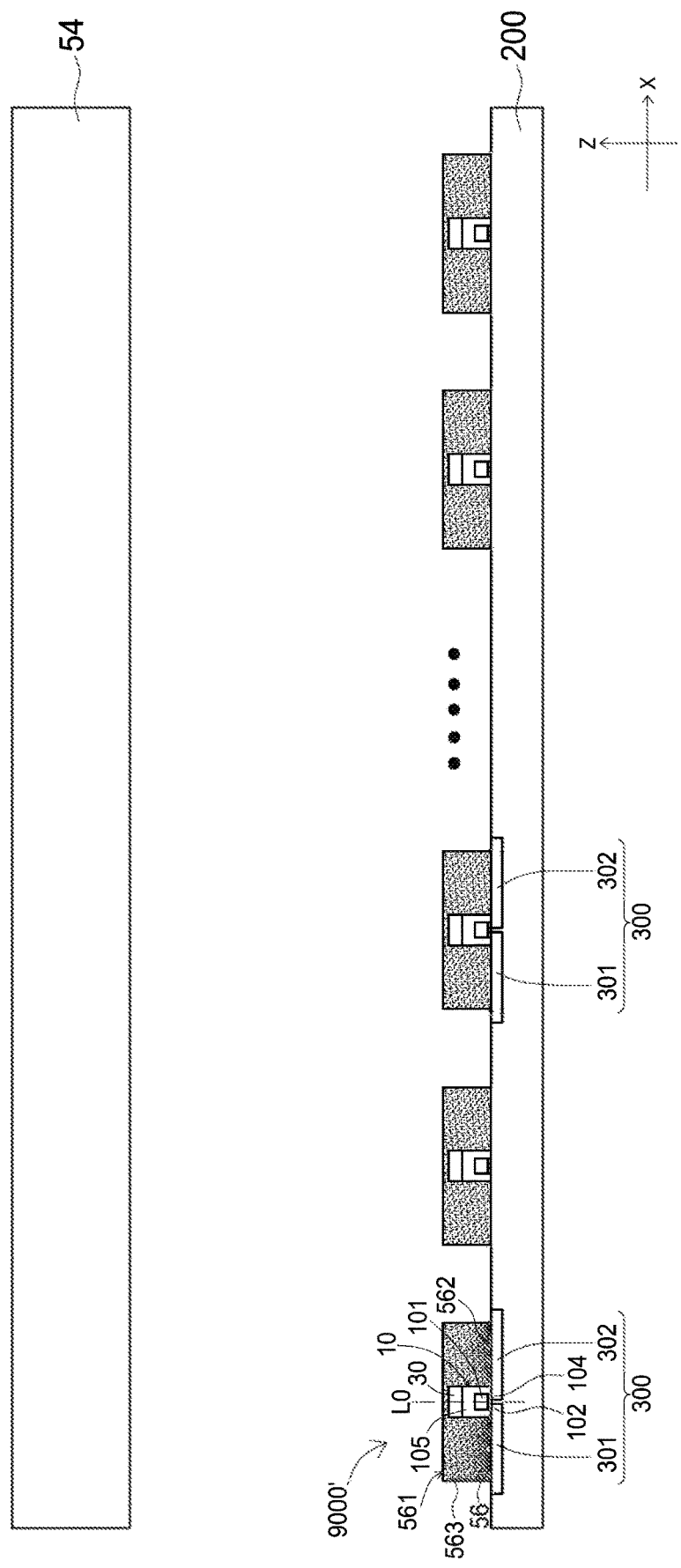
FIG. 11D shows a cross-sectional view of a light-emitting apparatus in accordance with an embodiment of the present disclosure.

FIG. 11D shows a cross-sectional view of a light-emitting device in accordance with an embodiment of the present disclosure. Referring to FIG. 11D, the light-emitting apparatus 9000' has a carrier 200, multiple light-emitting units 10, multiple first optical elements 30, multiple fifth optical elements 56, and a fourth optical element 54. The fourth optical element 54 is arranged on the light-emitting units 10 and covers multiple first optical elements 30 and multiple fifth optical elements 56. The fifth optical element 56 has a top surface 561, a bottom surface 562, and a side surface 563. The side surface 563 is arranged between the top surface 561 and the bottom surface 562. The top surface 561 is higher than the top surface of the first optical element 30. For example, a distance between the top surface 561 and the top surface of the first optical element 30 is not larger than 1~5 times of the thickness of the first optical element 30, and to be more specific, not larger than 2 times. Or, the top surface 561 can be substantially coplanar with the top surface of the first optical element 30. The bottom surface 562 is connected to the carrier 200. The light emitting unit 10 includes a light emitting structure 101, a light transmitting layer 105 surrounding and covering the light emitting structure 101 and electrodes 102, 104. The light emitting structure 101 includes a first conductive type semiconductor layer (not shown), an active layer (not shown), and a second conductive type semiconductor layer (not shown). The circuit layer 300 is formed on the carrier 200. The circuit layer 300 has a first circuit portion 301 and a second circuit portion 302 connected to the electrodes 102, 104 respectively. The characteristics of the elements can be referred to elements with same numbers or names in the previous sections, and are omitted for brevity. Referring to FIG. 11D, each fifth optical element 56 surrounds a light-emitting unit 10 and at least a part of the light from the light-emitting unit 10 exits the fifth optical element 56 through the top surface 561 and side surface 563 after being reflected or diffused by the first optical element 30.

Figure 11E:
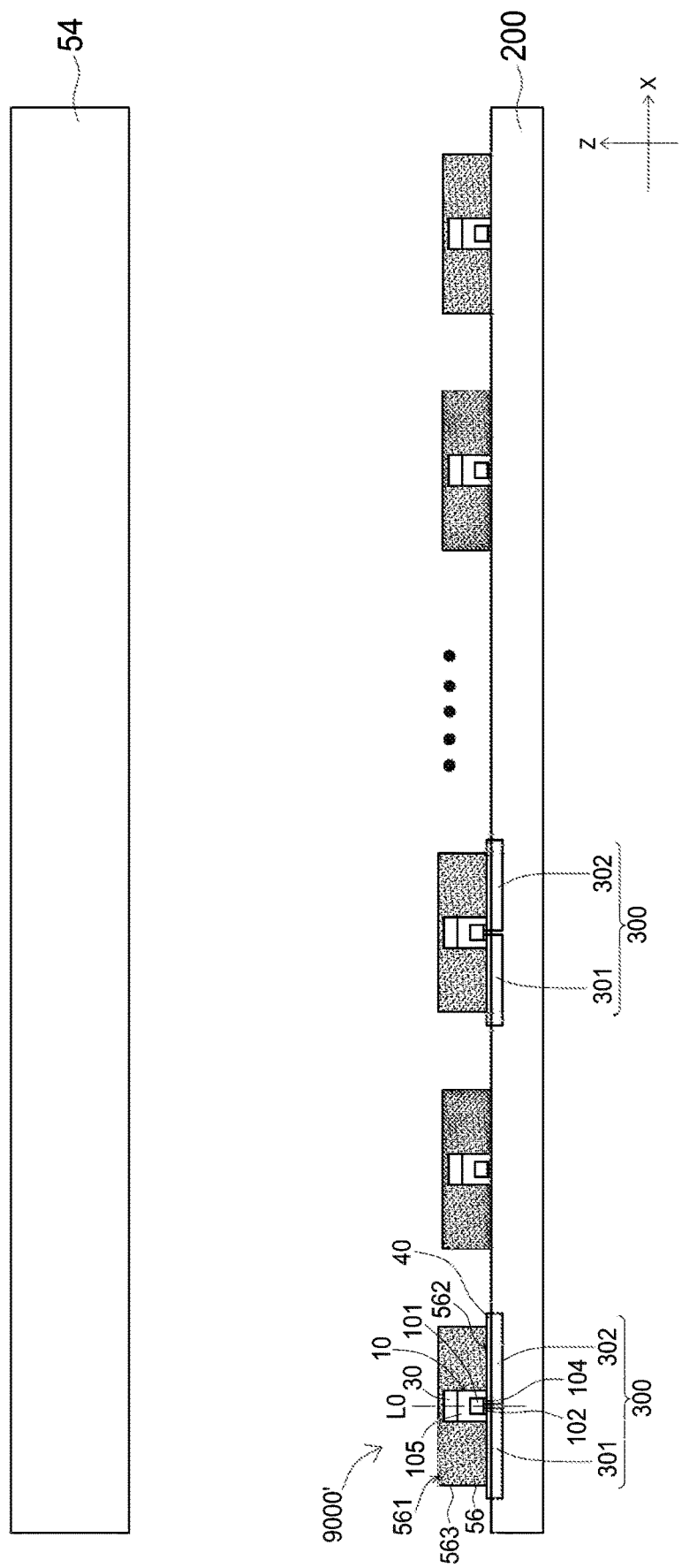
FIG. 11E shows a cross-sectional view of a light-emitting apparatus in accordance with an embodiment of the present disclosure.

FIG. 11E shows a cross-sectional view of a light-emitting device in accordance with an embodiment of the present disclosure. In FIG. 11E, a reflective layer 40 is formed on the carrier 200 to be overlapped with the circuit layer 300. The light-emitting apparatus 9000' has a reflective layer 40 formed on the carrier 200 to be overlapped with the fifth optical element 56. In an embodiment, the reflective layer 40 has a part exceeding the side surface 563 without being covered by the fifth optical element 56. The area of the surface 40 can be adjusted according to different requirement and can be larger than, smaller than, or equal to the coverage area of the fifth optical element 56. The characteristics of the reflective layer 40 can be referred to the previous sections, and are omitted for brevity.

Each of the light-emitting apparatuses 9000, 9000' has light-emitting units 10, first optical elements 30, fifth optical element 56 and fourth optical element 50 arranged in fixed intervals to guide the light to lateral sides. The optical characteristic of the light-emitting apparatuses 9000, 9000' related to light distribution pattern on a cartesian coordinate system or on a polar coordinate system disclosed in previous sections can be referred to the description of FIG. 2A. Therefore, the light-emitting apparatuses 9000, 9000' provide a planar light field with high uniformity and less bright or dark areas (or spots). To be more specific, the difference between the maximum light intensity and the minimum light intensity provided by the planar light field is less than 3%~10% of the maximum light intensity, or no dark or bright lines can be discerned. In an embodiment, the light-emitting device 1000 includes the light-emitting unit 10a or 10b. In an embodiment, each of the light-emitting apparatuses 8000, 9000, 9000' has two or more types of light-emitting units, such as light-emitting unit 10, 10a and 10b.

Figure 12A:
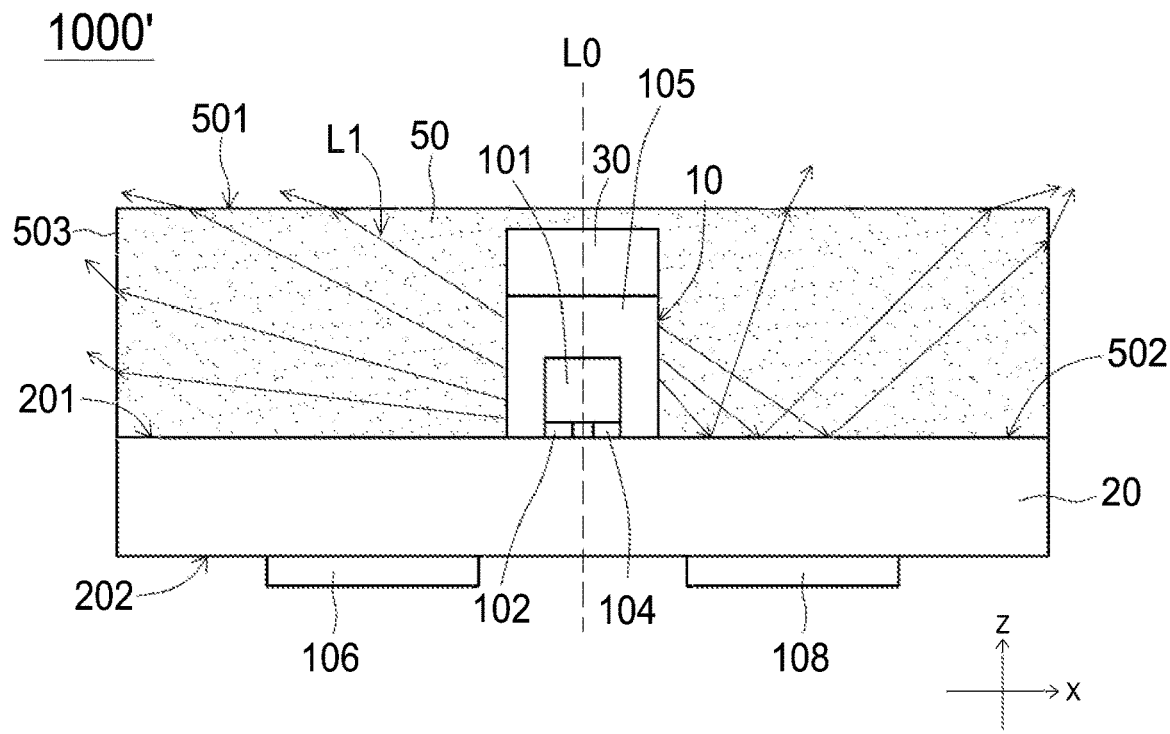
FIG. 12A shows a cross-sectional view of a light-emitting device in accordance with an embodiment of the present disclosure.
Figure 12B:
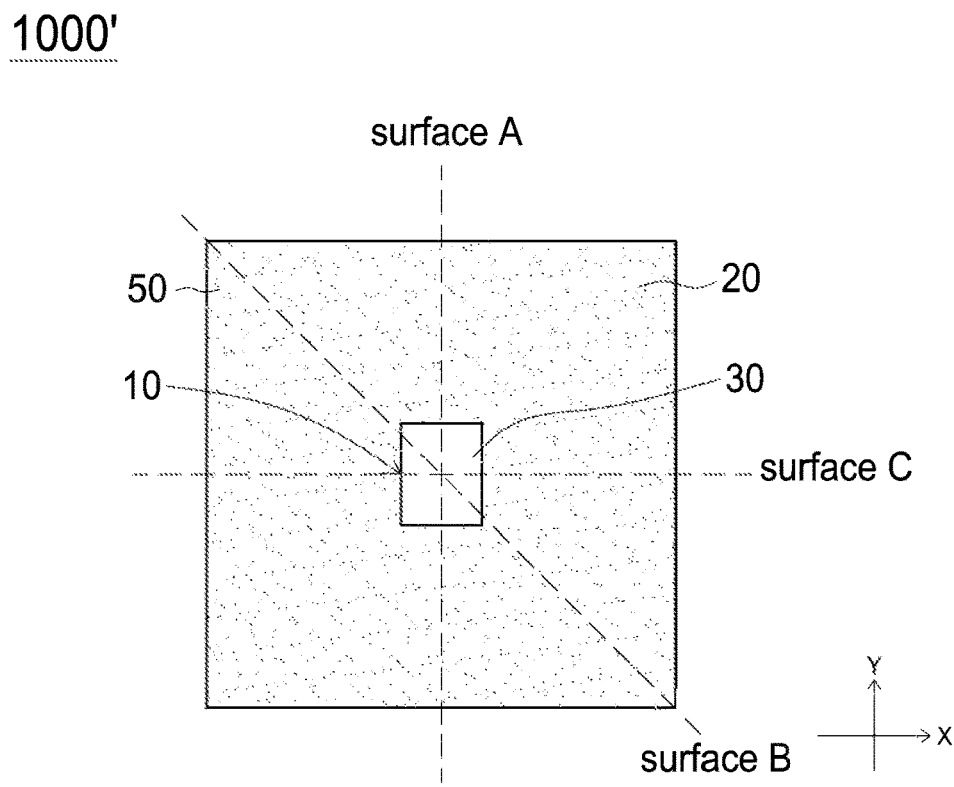
FIG. 12B shows a top view of a light-emitting device shown in FIG. 12A.
Figure 12C:
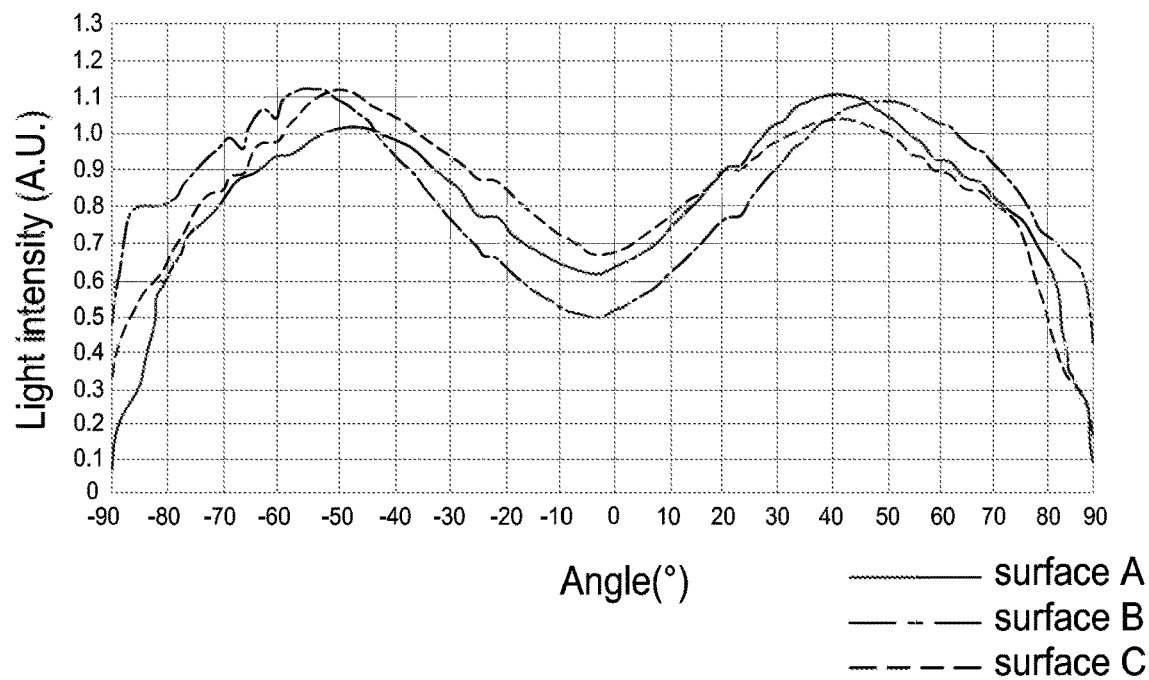
FIG. 12C shows a light distribution pattern of a light-emitting device in FIG. 12A on a cartesian coordinate system.
Figure 12D:
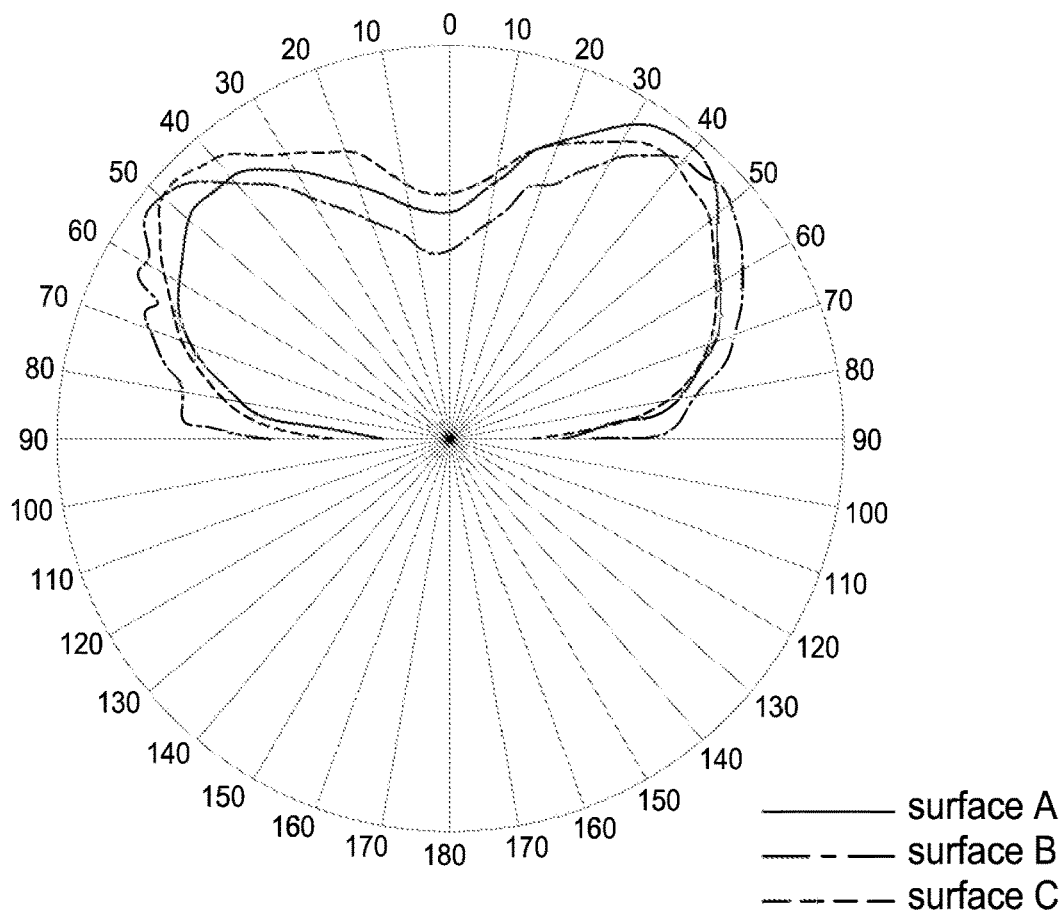
FIG. 12D shows a light distribution pattern of a light-emitting device in FIG. 12A on a polar coordinate system.

FIG. 12A shows a cross-sectional view of a light-emitting device in accordance with an embodiment of the present disclosure. The rays in FIG. 12A indicate the trajectory or tracks of the light from the light-emitting device. FIG. 12B shows a top view of a light-emitting device in FIG. 12A. Referring to FIG. 12A, the Z-axis matches the virtual center line L0, and the X-axis passes through the light-emitting unit 10 in a horizontal direction. The cross-sectional view of the second optical element 50 in the light-emitting device 1000' substantially covers two sides of the light-emitting unit 10. The side surface 501 of the second optical element 50 is substantially parallel to the top surface 201 of the carrier 20. The side surface 501 is coplanar with the top surface of the first optical element 30 or higher than the top surface of the first optical element 30. For example, when the side surface 501 is higher than the top surface of the first optical element 30, a distance between the side surface 501 and the top surface of the first optical element 30 is not larger than 1~5 times of the thickness of the first optical element 30, such as not larger than 2 times. The top surface 201 of the carrier 20 is a mirror reflection surface to guide the light from the light-emitting unit 10 towards lateral sides of the light-emitting device 1000'. As shown in FIG. 12A, the light is directed toward both sides, and the light is reflected by the top surface 201 and the first optical element 30, and exits the second optical element 50 via the side surface 503. Part of the light exits the second optical element 50 via the top surface 50. FIG. 12C shows a light distribution pattern of a light-emitting device in FIG. 12A on a cartesian coordinate system. The three curves in FIG. 12C show the light intensity measured from three different surfaces in FIG. 12B: the surface A (with respect to 90°), surface B (with respect to 135°) and surface C (with respect to 180°). The horizontal axis in FIG. 12C shows the measuring angle while the vertical axis represents the light intensity (a.u.). The labels of 90° and −90° on the horizontal axis substantially show the +X direction and the −X direction in FIG. 12A respectively while the label of 0° is overlapped with the virtual center line L0 which passes through the center of the light-emitting unit 10. The horizontal axis in FIG. 12C shows the measuring angle at a plane (for example, surface A, surface B or surface C) while the vertical axis represents the light intensity (a.u.). Referring to FIG. 12C, the light intensity of the light-emitting device 1000' has a distribution being substantially symmetrical with respect to the 0° and has a maximum value of about 1.1 a.u. on two sides within an angle range between 30° and 50°, which is about 1.8 times of the minimum light intensity (about 0.6 a.u.) at the center region within an angle range between 10° and −10°. FIG. 12D shows a light distribution pattern of a light-emitting device in FIG. 12A on a polar coordinate system. Referring to FIG. 12D, the light intensity of the light-emitting device 1000' has a distribution being substantially symmetrical with respect to the 0° or the geometric center of the light-emitting unit 10, and most of the light is distributed within an angle range between 30° and 90°. The difference between the light-emitting device 1000 in FIG. 1A and the light-emitting device 1000' is the second optical element 50. The second optical element 50 in the light-emitting device 1000' extends to edges of the carrier 20 and the side surface 503 is substantially being coplanar with the side surface of the carrier 20. Moreover, the second optical element 50 has a flat side surface 501, which affects the light intensity distribution. To be more specific, the position of the highest light intensity of the light-emitting device 1000' locates within an angle range between 30° and 50° while the position of the highest light intensity of the light-emitting device 1000 locates within an angle range between 40° and 70°. The area of the center region with lower light intensity decreases from the angle range between +15° and −15° to +10° and −10°. Besides, the ratio between the maximum light intensity and the minimum light intensity of the light-emitting device 1000' is less than that of the light-emitting device 1000.

Figure 12E:
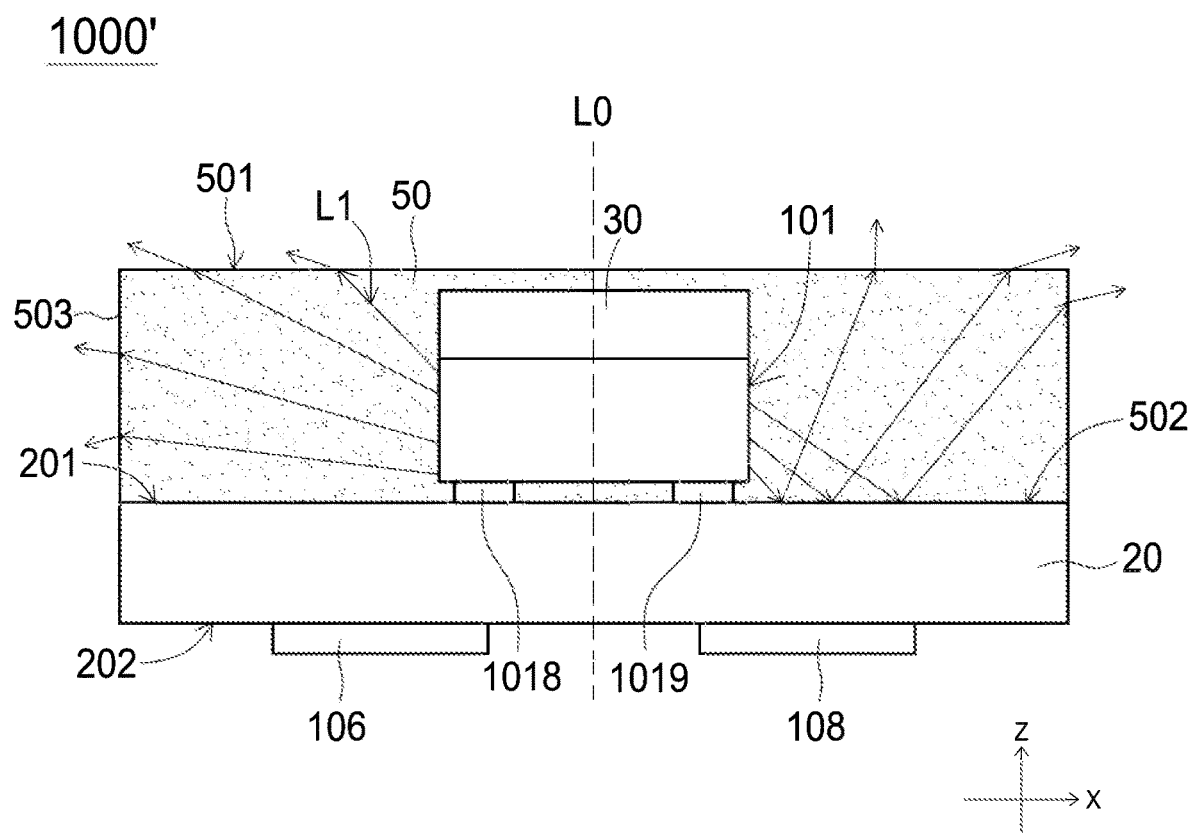
FIG. 12E shows a cross-sectional view of a light-emitting device in accordance with an embodiment of the present disclosure.

FIG. 12E shows a cross-sectional view of a light-emitting device in accordance with an embodiment of the present disclosure. Referring to FIG. 12E, the light-emitting device 1000' has a carrier 20, a light-emitting structure 101, a first optical element 30, a second optical element 50, and electrodes 106, 108. The discussion about the light emitting structure 101 can be referred to previous sections. The virtual center line L0 passing through the light-emitting structure 101 in the light-emitting device 1000' is vertical with the side surface 501 of the second optical element 50. Moreover, a surface including the virtual center line L0 is parallel to the side surface 503 of the second optical element 50. The light-emitting structure 101 is connected to the first optical element 30 and the second optical element 50. Compared with the light-emitting device 1000' in FIG. 12A, the light from the light-emitting structure 101 does not pass or being absorbed by the light-transmitting layer 105. The first optical element 30 can be formed on the light-emitting structure by coating, deposition, or adhesion. In an embodiment, an adhesion layer is formed between the first optical element 30 and the light-emitting structure 101 to combine or enhance the connection strength between the first optical element 30 and the light-emitting structure 101. The side surface 501 of the second optical element 50 is substantially parallel to the top surface 201 of the carrier 20. The side surface 501 is coplanar with the top surface of the first optical element 30 or higher than the top surface of the first optical element 30. For example, a distance between the side surface 501 and the top surface of the first optical element 30 is not larger than 1~5 times of the thickness of the first optical element 30, such as not larger than 2 times. The top surface 201 of the carrier 20 is a mirror reflection surface to guide the light from the light-emitting unit 10 towards lateral sides of the light-emitting device 1000'. The light emitted by the light emitting structure 101 can be reflected by the first optical element 30 and guided to the two sides of the light emitting device 1000' via the side surface 503 to exit the second optical element 50. Therefore, the light intensity toward the side surface 501 of the light-emitting device 1000' close to the virtual center line L0 is lower than that of a region away from the virtual center line L0, such as the region close to the side surface 503. In other words, the light-emitting device 1000' has a characteristic of a higher lateral light intensity larger than the central light intensity. It is noted that the light intensity distribution can be modified by adjusting the parameters of the above elements, such as the physical sizes and composition. For example, a light intensity distribution with a higher lateral light intensity larger than the central light intensity similar to the light intensity distribution similar to the distribution shown in FIGS. 2C~2D, FIGS. 3C~3D, FIGS. 4C~4D, FIGS. 9C~9D and FIGS. 12C~12D can be provided by modifying the characteristics of the elements in the light-emitting device 1000'.

In an embodiment, a reflective layer is formed on the top surface of the carrier 20. The reflective layer can be a mirror reflection surface, a diffusion reflection surface, or a reflective layer including mirror reflection surface and diffusion reflection. The diffusion reflection can reflect light to multiple directions. The description about the first optical element 30 and the second optical element 50 can be referred to previous sections.

Figure 13A:
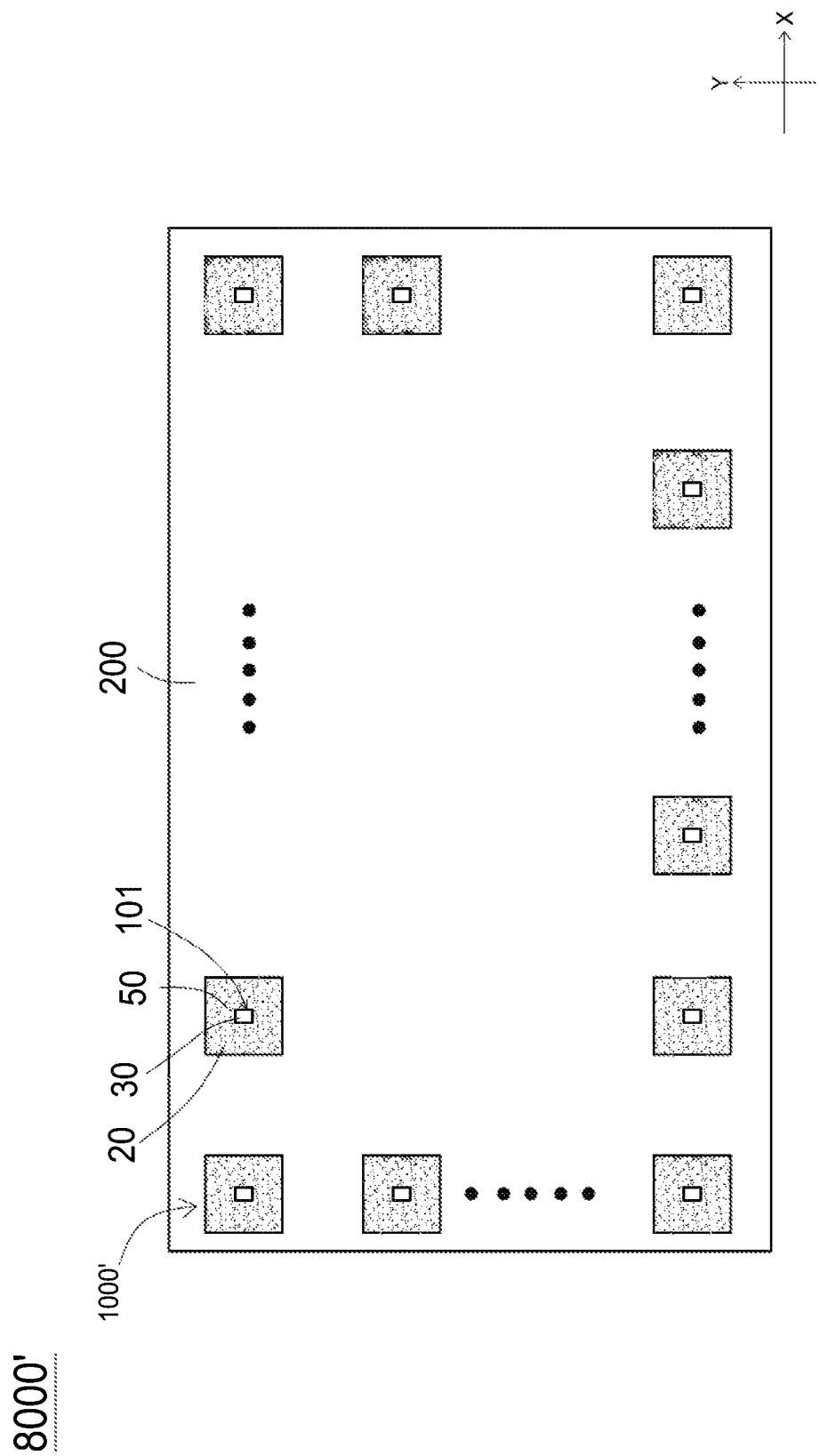
FIG. 13A shows a top view of a light-emitting apparatus in accordance with an embodiment of the present disclosure.

FIG. 13A shows a top view of a light-emitting device in accordance with an embodiment of the present disclosure. The light-emitting apparatus 8000' has a carrier 200, multiple light-emitting devices 1000' and a fourth optical element 54 (referring to FIG. 13B) covering these light-emitting devices 1000'. The descriptions about the light-emitting device 1000' can be referred to the previous sections, and are omitted for brevity. In an embodiment, the top surface 201 of the carrier 200 is a mirror reflection surface to efficiently extract light from the light-emitting structure 101 and reflect light toward the fourth optical element 54. These light-emitting devices 1000' are arranged in a form of a matrix on the carrier 200 with a fixed interval in X direction and a fixed interval in Y direction regularly. The optical characteristics of the light-emitting devices 1000', such as light-emitting intensity, light intensity distribution, color temperature, and wavelength are substantially the same. In an embodiment, the interval between two light-emitting devices can be the same or different. Or, the interval in one direction, such as in X direction or in Y direction, is gradually increased or decreased. In an embodiment, the optical characteristics of the light-emitting devices 1000', such as color of light, light intensity distribution and/or color temperature are different. Similarly, the light-emitting device 1000' can be replaced by other light-emitting device, such as the light-emitting device 1000, 2000, 3000, 4000, 5000, 6000, or 7000.

Figure 13B:
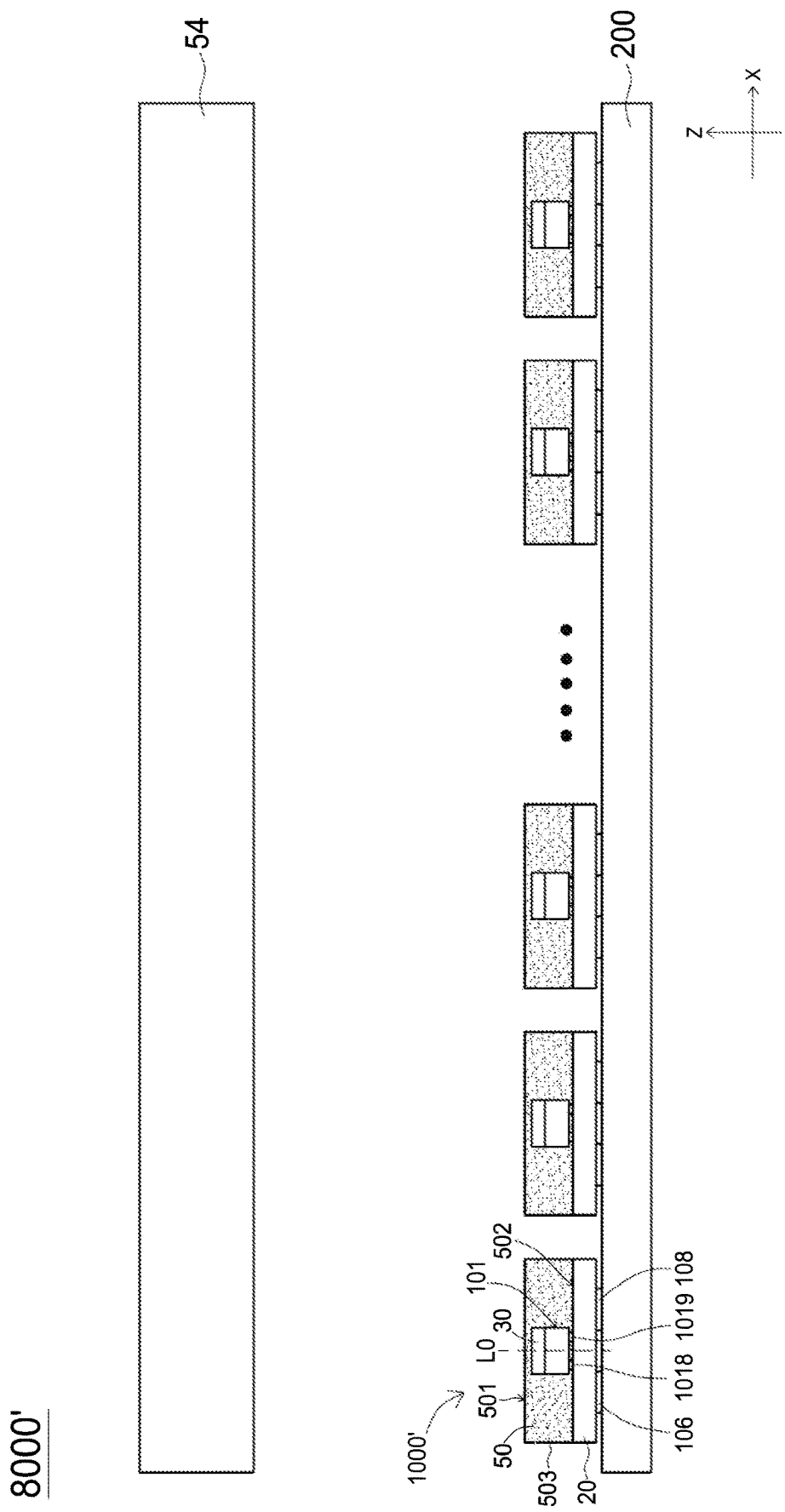
FIG. 13B shows a cross-sectional view of a light-emitting apparatus shown in FIG. 13A.

FIG. 13B shows a cross-sectional view of a light-emitting device in FIG. 13A. The fourth optical element 54 covers multiple light-emitting devices 1000' to adjust the light from the light-emitting devices 1000'. To be more specific, the fourth optical element 54 can be a single layer structure or a multi-layers structure. The fourth optical element 54 can be a multi-layers structure which has a brightness enhancing film, a prism sheet, a diffusion film and/or an alignment film to adjust the optical characteristic, such as the traveling direction of the light and the uniformity of light distribution. In an embodiment, the fourth optical element 54 includes a film having wavelength conversion material, such as phosphor or quantum dot. The light-emitting apparatus 8000' has light-emitting devices 1000' arranged in X direction and Y direction in fixed intervals. The light-emitting devices 1000' has a characteristic of providing higher light intensity on lateral sides than on the center portion. Therefore, the light-emitting apparatus 8000' can provide a planar light field with high uniformity and less bright or dark areas (or spots). To be more specific, the difference between the maximum light intensity and the minimum light intensity provided by the planar light field is less than 3%~10% of the maximum light intensity, or no dark or bright lines can be discerned.

Figure 14A:
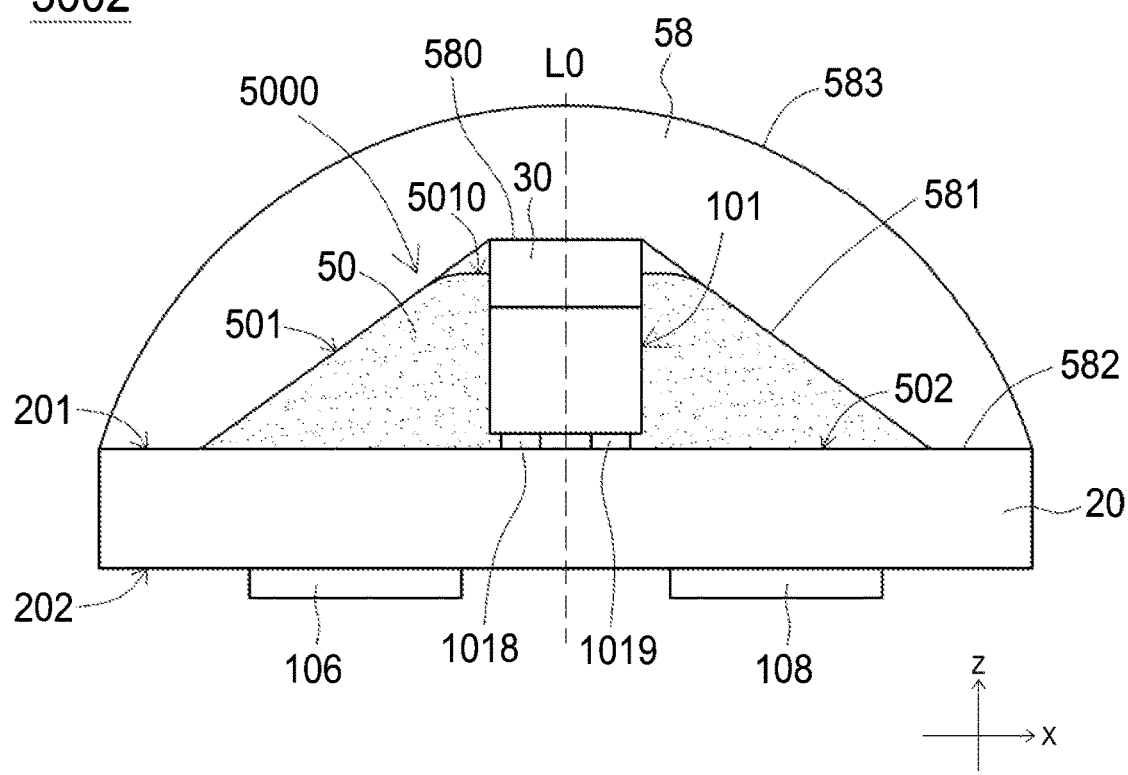
FIG. 14A shows a cross-sectional view of a light-emitting device in accordance with an embodiment of the present disclosure.

In addition to the application of the light-emitting device (such as the light-emitting devices 1000, 200 and 300) described in the preceding paragraphs, or the application of a combination of the light-emitting devices (such as the light-emitting apparatuses 8000, 8000' and 9000), the light-emitting device can be used with the optical element according to different requirements. FIG. 14A shows a cross-sectional view of a light-emitting device in accordance with an embodiment of the present disclosure. The light-emitting device 5002 is similar to the light-emitting device 5000. Therefore, the elements of same (or similar) names and/or numbers can be referred to previous sections and are omitted for brevity. Referring to FIG. 14A, the light-emitting device 5002 has a sixth optical element 58 arranged on the light-emitting device 5000 shown in FIG. 7. To be more specific, the sixth optical element 58 has an inner surface connected to the surfaces 201, 501 and the first optical element 30 of the light-emitting device 5000. The optical characteristics of the sixth optical element 58, such as the refractive index, are substantially the same with the second optical element 50. In an embodiment, an adhesion material is arranged on the light-emitting device 5000 to connect the sixth optical element 58. The adhesion material can be arranged on the first optical element 30, on the second optical element 50, and/or on the side of the carrier 20 adjacent to the sixth optical element 58. Referring to FIG. 14A, the sixth optical element 58 is a mirror symmetric structure. The virtual center line L0 is substantially passing the geographic center of the light-emitting structure 101 and the sixth optical element 58. The sixth optical element 58 has a first bottom surface 580, an inclined surface 581, a second bottom surface 582 and a top surface 583, wherein the surfaces 580, 581, 582, 583 are substantially smooth to reduce loss caused by scattering, refraction, or total reflection on the faces of the light emitted by the light-emitting structure 101 while passing through the optical element 58 and to reduce the influence of the path of the light. The contour of the top surface 583 can be a semi-circular or a semi-elliptical, and a tangent line can be measured at a point on the top surface 583. Moreover, the absolute value of the slope of the tangent line is decreased with the increase of the height of the measured point in a vertical direction from the top surface 201 of the carrier 20 to the top surface 583. In an embodiment, the top surface 583 is not a smooth surface and the sixth optical element 58 has recessed portion arranged on the top surface 583. The contour having the first bottom surface 580, the inclined surface 581, and the second bottom surface 582 substantially matches the surface profile of the connected light-emitting device 5000 to reduce gas between sixth optical element 58 and the light-emitting device 5000. Moreover, the loss of the light from passing through the sixth optical element 58 and the light-emitting device 5000 is also reduced. The minimum width of the first bottom surface 580 is substantially equal to the width of the light-emitting structure 101 and the width of the first optical element 30. The maximum width of the first bottom surface 580 is substantially equal to the width of the light-emitting device 5000. The first bottom surface 580 is substantially parallel to the surface of the first optical element 30. In an embodiment, the first bottom surface 580 is an inclined surface or a surface with depressed portion and/or protruded portion. As discussed in the previous sections, the light from the light-emitting structure 101 exits the light-emitting device 5000 in a bottom right (or (X, −Z)) direction and/or in a bottom left (or (Y, −Z)) direction. So, the light is emitted toward the second optical element 50 after leaving the light-emitting structure 101. So, the light can be guided to the peripheral region of the light-emitting device 5002 without being concentrated on the region directly above the light-emitting structure 101. As shown in FIG. 14A, the light exits from the second optical element 50 and passes through the sixth optical element 58 before entering the ambiance like air. The light is then guided to peripheral region of the light-emitting device 5002 because of the difference of refractive index between the sixth optical element 58 and the air. Moreover, the region corresponding to the maximum of the light distribution moves in a direction away from the virtual center line L0. Referring to FIG. 14G, the maximum of the light distribution locates at a range between 70° and 80°. In an embodiment, the sixth optical element 58 is arranged on the light-emitting device 5000 and a portion of the second optical element 50 is located between the second bottom surface 582 and the carrier 20 or outside of the sixth optical element 58.

The material of the sixth optical element 58 can be the same or similar with that of the second optical element 50, and the descriptions about materials can be referred to previous sections. In an embodiment, the sixth optical element 58 has a wavelength conversion material, such as pigment, phosphor powder or quantum dot material. It is noted that part of the adjacent phosphor particles in the phosphor powder are connected to each other, and some adjacent phosphor particles do not connect to each other. The maximum or average particle size of the wavelength particles (within a specific range) is between 5 µm~100 µm. The description about wavelength conversion material or phosphor can be referred to previous sections, and are omitted for brevity. In an embodiment, the sixth optical element 58 has diffusion particles, and the material of the diffusion particles can be titanium dioxide, zirconium oxide, zinc oxide or aluminum oxide.

Figure 14B:
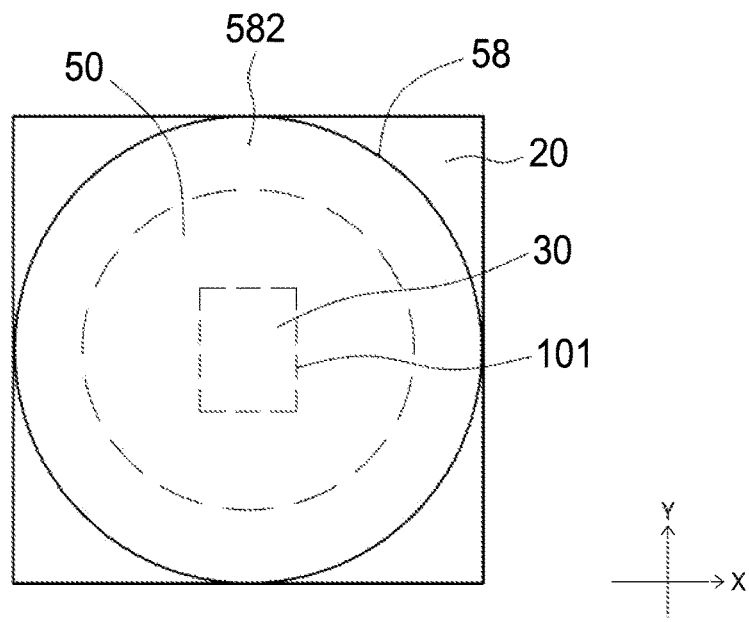
FIG. 14B shows a top view of a light-emitting device shown in FIG. 14A.
Figure 14G:
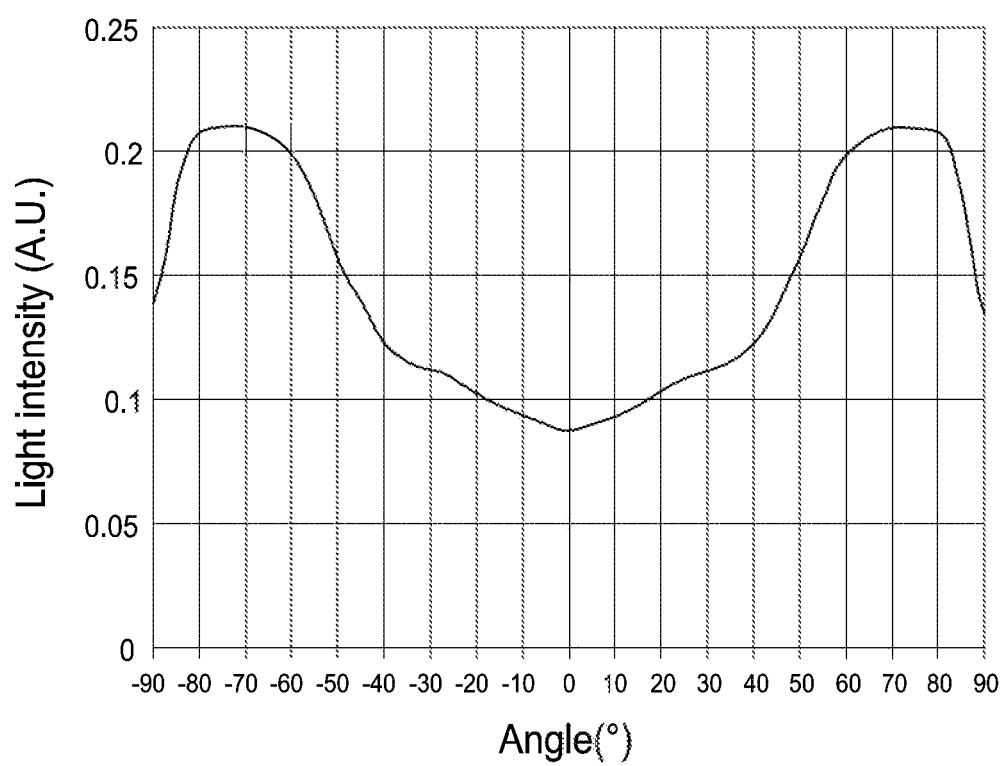
FIG. 14G shows a light distribution pattern of a light-emitting device in FIG. 14A on a cartesian coordinate system.

FIG. 14B shows a top view of a light-emitting device in FIG. 14A. Referring to FIG. 14B, the light-emitting structure 101 is covered by the first optical element 30. The sixth optical element 58 surrounds the light-emitting structure 101 and the first optical element 30. Referring to the top view, the sixth optical element 58 has a contour substantially equal to a circle or an ellipse, and the edge of the sixth optical element 58 is retracted from the edge of the carrier 20. The size of the sixth optical element 58 can be adjusted according to requirement, for example, the edge of the sixth optical element 58 is tangent to one or more edges of the carrier 20. There is a proportional relationship between the size of the light-emitting structure 101 and that of the reflective layer on the top surface 201 or on the carrier 20 in a cross-sectional view. There is a proportional relationship between the size of the light-emitting structure 101 and that of the second optical element 50 or that of the sixth optical element 58 in a cross-sectional view. For example, referring to FIG. 14B, the maximum width of the second optical element 50 or the sixth optical element 58 is three times or more of the maximum width of the light-emitting structure 101. Or the maximum width of the reflective layer on the carrier 20 or on the top surface 201 is three times or more of the maximum width of the light-emitting structure 101. Therefore, the light can be guided to the peripheral region of the light-emitting device 5002, and the region corresponding to the maximum of the light distribution falls in a region away from the virtual center line L0 or falls at a range of larger angle, such as the range between 70° and 80° as shown in FIG. 14G. In one embodiment, the maximum width of the reflective layer on the carrier 20 or on the top surface 201 is 10 times or more of the maximum width of the light-emitting structure 101.

FIG. 14C shows a bottom view of the optical element in FIG. 14A. Referring to the bottom view, the sixth optical element 58 is a mirror symmetric structure. The sixth optical element 58 has a first bottom surface 580 at the center portion of the sixth optical element 58 and an inclined surface 581 extends from the first bottom surface 580 to the second bottom surface 582. Therefore, the sixth optical element 58 provides a substantially symmetric light distribution. Referring to FIG. 14A, the sixth optical element 58 provides a light distribution pattern being symmetrical with the virtual center line L0. Or, referring to FIG. 14B, a circular light distribution pattern being symmetrical with the (geometric) center (not shown) of the sixth optical element 58 or the light-emitting device 5002 can be provided. The first bottom surface 580 is a flat surface and is concave from the second bottom surface 582 to form a space for accommodating the light-emitting device.

Furthermore, the degree of recess of the sixth optical element 58 can be adjusted according to the height of the light-emitting device, for example, the flatness of the first bottom surface 580, the inclination of the inclined surface 581, and the width of the second bottom surface 582 and/or the size and relative position of these faces can be adjusted.

FIG. 14D1 shows a bottom view of an optical element in accordance with an embodiment of the present disclosure. Referring to FIG. 14D1, the sixth optical element 58 is a mirror symmetric structure and has a bottom surface arranged at the center portion of the sixth optical element 58. FIG. 14D2 shows a cross-sectional view of the optical element in FIG. 14D1. Furthermore, the FIG. 14D2 shows a cross-sectional view along the line AA' of the optical element in FIG. 14D1. The depressed surface 584 is similar with the inclined surface 581, which extends substantially evenly from the first bottom surface 580 to the second bottom surface 582. The depressed surface 584 has a portion closer to the top surface 583 than the inclined surface 581, particularly the ridgeline 5840 between the depressed surfaces 584. The ridgeline 5840 is connected to the first bottom surface 580 and the second bottom surface 582. The ridgeline 5840 is a flat straight line. The quantity of the ridgelines 5840 equals to the quantity of the corners on the first bottom surface 580. In an embodiment, the ridgeline 5840 has one or more curved lines bent in a direction away from or close to the top surface 583. Referring to FIG. 14D1, the inclined surface 581 is arranged between the depressed surfaces 584 and being collinear with the side portion of the first bottom surface 580. The quantity of the inclined surfaces 581 equals to the quantity of the first bottom surfaces 580. The interface between the inclined surface 581 and the second bottom surface 582 has a curved contour. In an embodiment, the quantity of the ridgeline 5840 is different from the quantity of the corners of the first bottom surface 580. The depressed surface 584 has a wider portion near the first bottom surface 580 and a narrower portion near the second bottom surface 582. In an embodiment, the depressed surface 584 has a uniform width between the first bottom surface 580 and the second bottom surface 582. In an embodiment, the depressed surface 584 has a narrower portion near the first bottom surface 580 and a wider portion near the second bottom portion 582.

The sixth optical element 58 is a symmetric structure. Therefore, the sixth optical element 58 provides a substantially symmetrical optical characteristic. The first bottom surface 580 is a flat surface and is closer to the top surface 583 than the second bottom surface 582 is to form a space for accommodating a light-emitting device. Furthermore, the recess of the first bottom surface 580 can be adjusted according to the height of the light-emitting device, wherein the first bottom surface 580 is substantially parallel to the surface of the light-emitting device, especially the first bottom surface 580 is parallel to the top surface of the optical element (for example, the optical element 30) located at the highest portion in a light-emitting device.

FIG. 14E shows a cross-sectional view of an optical element in accordance with an embodiment of the present disclosure. The seventh optical element 59 is similar with the sixth optical element 58. The first bottom surface 590 is arranged on the center region of the seventh optical element 59. The inclined surface 591 extends from the first bottom surface 590 to the second bottom surface 592. It is noted that the top surface 593 of the seventh optical element 59 is not a flat surface. As shown in FIG. 14E, multiple recessed portions 5930 are formed on the seventh optical element 59. To be specific, the recessed portions 5930 are arranged regularly on the top surface 593. So, the slope of the tangent line at the measuring point on the top surface 593 is not continuously decreased with an increase of the height of the measuring point. The height of the measuring point is a shortest distance between the measuring point and the second bottom surface 592 measured along a virtual line being vertical with respect to the second bottom surface 592 in a cross-sectional view. In an embodiment, the recessed portions 5930 are arranged randomly on the top surface 593. To be more specific, referring to FIG. 14E, the measuring point C20 is higher than the measuring point C10, and the slope of the tangent line C1 measured at the measuring point C10 is larger than that measured at the tangent line C2 at the measuring point C20. However, the slope of the tangent line C3 measured at the measuring point C30, which is higher than measuring point C20, is larger than that of the tangent line C2 at the measuring point C20. In other words, the slope of the tangent line at measuring points on different locations of the top surface 593 is not decreased with the increase of the vertical distance from the second bottom surface 592 or decreased with the increase of the height of the measuring point. That is, the absolute value of the slope of the tangent line is decreased within a height range and increased within a higher height range, which is different from characteristic of the slope of the tangent line (not shown) of the top surface 583 in FIG. 14A in which the absolute value of the slope of the tangent line is decreased with the increase of the height. To be more specific, the absolute value of the slope of the tangent line between the measuring point C20 and the measuring point C10 in the previous paragraph becomes smaller as the height increases, but the absolute value of the slope of the tangent line at a higher measuring point C30 is larger than that at a lower measuring point C20 within another height range between measuring point C30 and the measuring point C20. The characteristics of the tangent lines can be represented by the angle θ between the tangent lines and the bottom surface 592. FIGS. 14F1~14F3 show cross-sectional views of a light-emitting device in accordance with an embodiment of the present disclosure. The angle between the tangent line at one measuring point and the bottom surface in a certain height interval decreases as the height of the measuring point from the second bottom surface 592 increases. For example, the angle θ1 in FIG. 14F1 represents the angle between the tangent line C1 (through the measuring point C10) and the second bottom surface 592, and the angle θ2 in FIG. 14F2 represents the angle between the tangent line C2 (through the measuring point C20) and the second bottom surface 592, wherein the angle θ2 is smaller than the angle θ1. The angle θ3 in FIG. 14F3 represents the angle between the tangent line C3 (through the measuring point C30) and the second bottom surface 592, wherein the angle θ3 is larger than the angle θ2. Therefore, the angle θ is decreased with the increase of the height within a height range. For example, the angle θ2 is smaller than the angle θ1. Furthermore, at least one measuring point having an angle θ, between the tangent line at the measuring point and the second bottom surface 592, larger than the angle θ in the previous height interval can be found in a higher height interval. For example, the angle θ3 is larger than the angle θ2. It is noted that the angle between the tangent line and the second bottom surface 592 following the variation rules of slope (or angle) related to height as discussed above is not larger than 90° and not less than 0°. In an embodiment, the top surface 593 has multiple curved surfaces with same or different radius of curvature. It is noted that the sixth optical element 58 and the seventh optical element 59 disclosed in FIGS. 14A-14E can be combined with previous light-emitting structures 101, light-emitting unit, such as light-emitting unit 10, 10a, and 10b, light-emitting device, such as light-emitting device 1000, 1000', 2000, 3000, 4000, 5000, 6000, and 7000, and light-emitting apparatus 8000, 8000', 9000, and 9000'.

FIG. 14G shows a light distribution pattern of a light-emitting device in FIG. 14A on a cartesian coordinate system. The description about the light-intensity distribution in FIG. 14G is similar to that described in FIG. 2C, and the meaning of the horizontal axis and vertical axis can be referred to previous sections, and are omitted for brevity. Referring to FIG. 14G, the distribution of the light intensity of the light-emitting device 5002 is symmetrically distributed with respect to the 0° and has a maximum value of about 0.2 a.u. on two sides within an angle range between 60° and 80°, which is about 3 times of the minimum light intensity (about 0.09 a.u.) at the center region within an angle range between 10° and −10°.

Figure 15A:
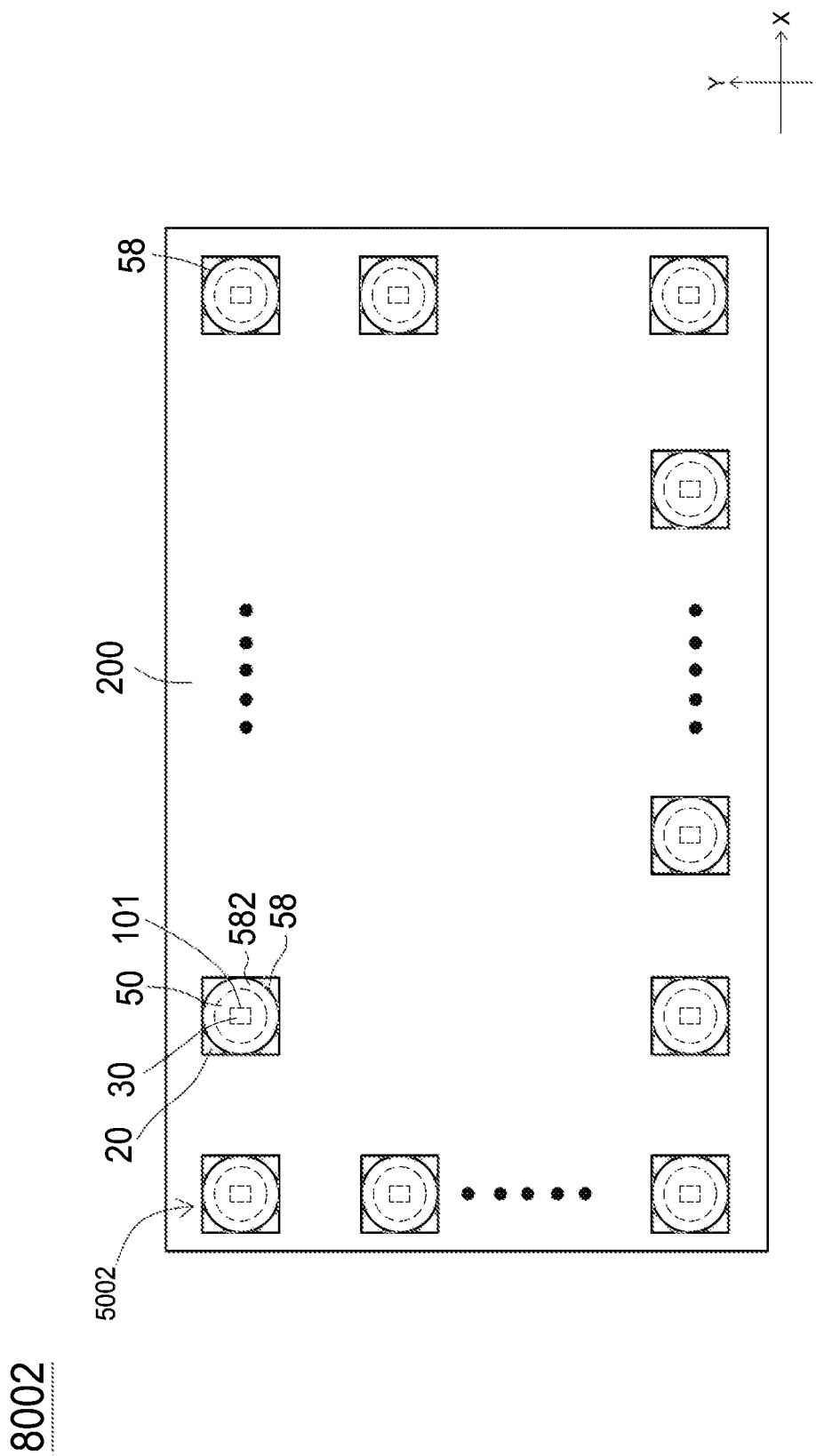
FIG. 15A shows a top view of a light-emitting apparatus in accordance with an embodiment of the present disclosure.

Referring to FIG. 15A, the light-emitting apparatus 8002 is similar with the light-emitting apparatus 8000. The light-emitting apparatus 8002 has a carrier 200, multiple light-emitting devices 5002 and a fourth optical element 54 (referring to FIG. 15B) covering these light-emitting devices 5002. The descriptions of the elements having same or similar labels can be referred to previous sections, and are omitted for brevity. Referring to FIG. 15A, the sixth optical element 58 covers the carrier 20 and a part of the carrier 20 is exposed. These light-emitting devices 5002 are arranged in a form of a matrix on the carrier 200 with a fixed interval in X direction and a fixed interval in Y direction regularly. The optical characteristics of the light-emitting devices 5000, such as light-emitting intensity, light intensity distribution, color temperature and wavelength are substantially the same. In another embodiment, the interval between two light-emitting devices can be the same or different. Or, the interval in one direction, such as in X direction or in Y direction, is gradually increased or decreased.

Figure 15B:
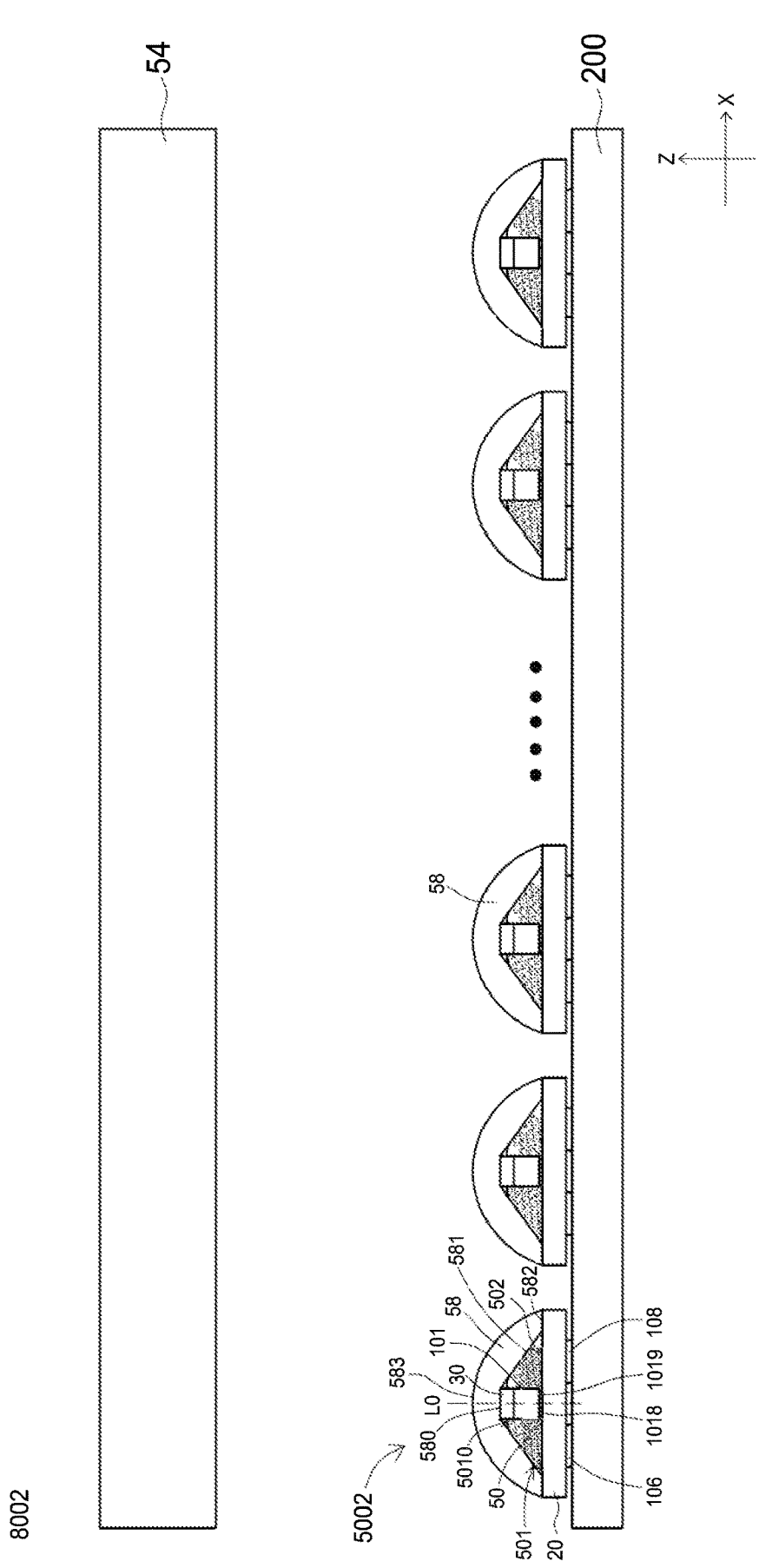
FIG. 15B shows a cross-sectional view of a light-emitting apparatus shown in FIG. 15A.

FIG. 15B shows a cross-sectional view of a light-emitting device in FIG. 15A. The fourth optical element 54 covers multiple light-emitting devices 5002 to adjust the light from the light-emitting devices 5002. Therefore, the light-emitting apparatus 8002 can provide a planar light field with high uniformity and less bright or dark areas (or bright spots). To be more specific, the difference between the maximum light intensity and the minimum light intensity provided by the planar light field is less than 3%~10% of the maximum light intensity or no dark or bright lines can be discerned. It is noted that the light is further evenly transmitted to the periphery uniformly with the arrangement of the sixth optical element 58 so that the light-emitting apparatus 8002 can provide a more uniform planar light field. In an embodiment, the seventh optical element 59 can be used to replace the sixth optical element 58 in the light-emitting device 5002.

Figure 16A:
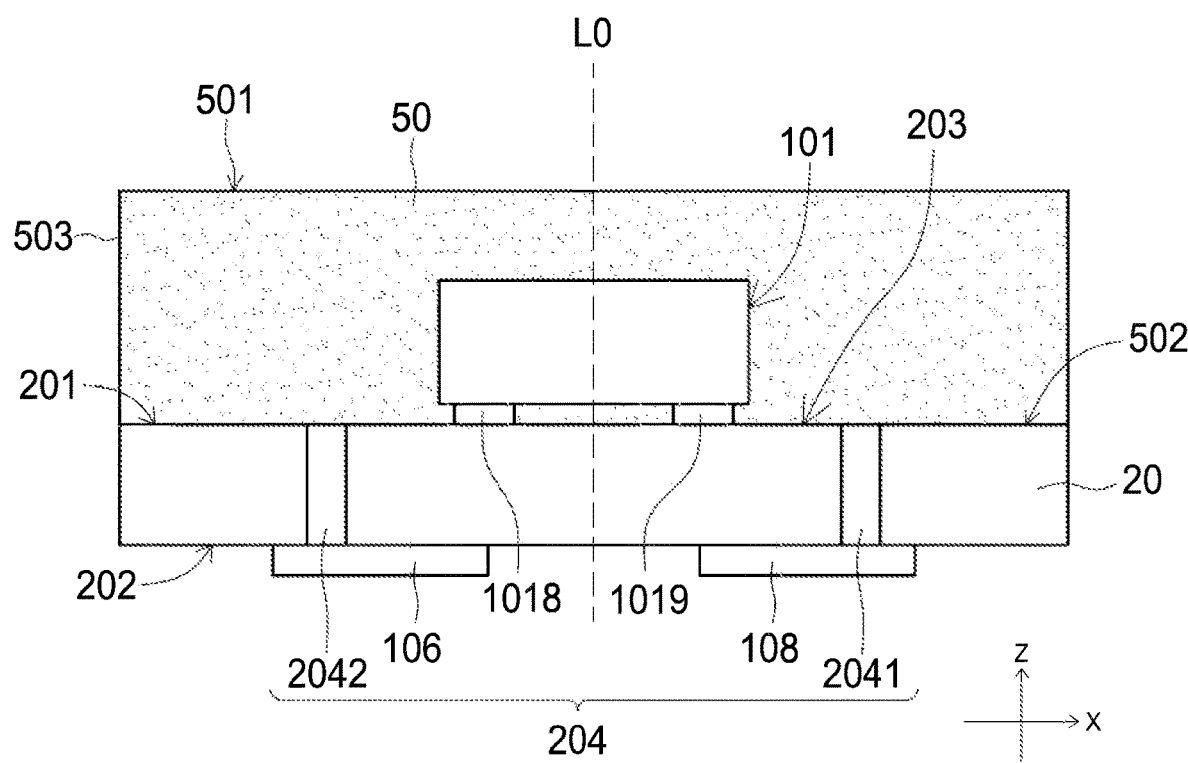
FIG. 16A shows a cross-sectional view of a light-emitting device in accordance with an embodiment of the present disclosure.
Figure 16B:
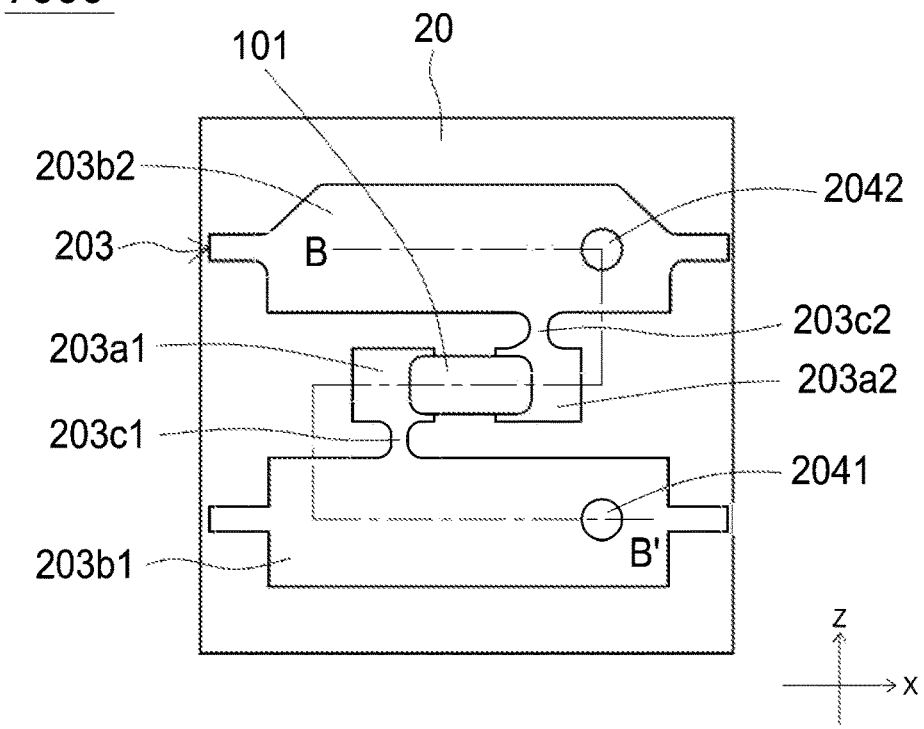
FIG. 16B shows a top view of a light-emitting device shown in FIG. 16A.

FIG. 16A shows a cross-sectional view of a light-emitting device in accordance with an embodiment of the present disclosure. FIG. 16B shows a top view of the light-emitting device 7000' shown in FIG. 16A. FIG. 16A shows a cross-sectional view on the plane defined by the X-axis and the Z-axis. FIG. 16B shows a cross-sectional view on the plane defined by the X-axis and the Y-axis, wherein the cross-sectional view is plotted along the line BB' in FIG. 16A. The light-emitting device 7000' has a carrier 20, a light-emitting structure 101, a second optical element 50, a first circuit layer 203, a second circuit layer 204 embedded in the carrier 20 and electrodes 106, 108. The elements in the light-emitting device 7000' can be referred to related sections above, except the circuit layers 203, 204. The first circuit layer 203 is formed on the carrier 20, and the second circuit layer 204 penetrates the carrier 20. To be more specific, the second circuit layer 204 has a first connection portion 2041 and a second connection portion 2042 electrically connected to the first circuit layer 203 on the top surface 201 and the electrodes 106, 108 on the bottom surface 202. In the light-emitting device 7000', the second optical element 50 is directly connected to the light-emitting structure 101. A part of the light from the light-emitting structure 101 moves upward and leaves the light-emitting device 7000' via the side surface 501 of the second optical element 50. A part of the light from the light-emitting structure 101 moves toward the carrier 20 and leaves the light-emitting device 7000' via the side surface 503 and/or the side surface 501 after being reflected by the first circuit layer 203 on the surface 203 of the carrier 20. The first circuit layer 203 can be a mirror reflection surface or a diffusion reflection surface to guide the light from the light-emitting structure 101 to the top region and/or the peripheral region of the light-emitting device 7000'. Descriptions about mirror reflection and diffusion reflection can be referred to related sections discussed above.

Referring to FIG. 16B, the light-emitting structure 101 is arranged on the position substantially matches to the geometric center of the carrier 20. The first circuit layer 203 has a first circuit portion 203a1, a second circuit portion 203a2, a third circuit portion 203b1, a fourth circuit portion 203b2, a fifth circuit portion 203c1 and a sixth circuit portion 203c2. The light-emitting structure 101 is overlapped with the first circuit portion 203a1 and the second circuit portion 203a2. The first circuit portion 203a1 is directly connected to the electrode pad 1019. The second circuit portion 203a2 is directly connected to the electrode pad 1018. The first circuit portion 203a1 is electrically connected to the third circuit portion 203b1 through the fifth circuit portion 203c1. The second circuit portion 203a2 is electrically connected to the fourth circuit portion 203b2 through the sixth circuit portion 203c2. The maximum widths of the circuit layers 203a1, 203a2 are wider than those of the circuit layers 203c1, 203c2. The narrower circuit portions 203c1, 203c2 allow the adhesive material (not shown) for adhering the light emitting structure 101 and the first circuit layer 203 to stay on the circuit portions 203a1, 203a2, and not easily flow to the circuit portions 203b1, 203b2 via the circuit portions 203c1, 203c2. The adhesive material can be a conductive material easy to flow during manufacturing, such as a solder. To be more specific, the adhesive material is easier to flow while being arranged on the metallic material (for example, the metallic portion of the circuit layer 203) than being arranged on the insulating material (for example, the insulated portion of the carrier 20). So, the adhesive material usually flows along the wires of the circuit layer. With the arrangement of the circuit portions 203c1, 203c2 having maximum widths narrower than those of the circuit portions 203a1, 203a2, the flow path of the adhesive material toward the circuit portions 203b1, 203b2 is reduced. So, the adhesive material is not easy to flow toward the circuit portions 203b1, 203b2. Then, there is sufficient adhesive material remained between the circuit portions 203a1, 203a2 and the circuit portions 203b1, 203b2 to maintain a reliable electrical connection. Furthermore, the adhesive material is avoided to flow to the circuit portions 203b1, 203b2 to affect reflectivity of the circuit portions 203b1, 203b2. The shapes of the first circuit portion 203a1 and the second circuit portion 203a2 are substantially rectangular. The first circuit portion 203a1 and the second circuit portion 203a2 are arranged on the carrier 20 symmetrically with respect to the light-emitting structure 101. The shapes of the third circuit portion 203b1 and the fourth circuit portion 203b2 are different, and the circuit portions 203b1, 203b2 are correspondingly arranged on two sides of the light-emitting structure 101. The fifth circuit portion 203c1 and the sixth circuit portion 203c2 are arranged to be a rotational symmetrical structure with respect to the light-emitting structure 101. In an embodiment, the shapes of the third circuit portion 203b1 and the fourth circuit portion 203b2 are the same. Then, the first circuit layer 203 has a rotational symmetrical pattern, wherein the pattern of the first circuit layer 203 after being rotated 180° around the light-emitting structure 101 on the top surface 201 is consistent with the original pattern before being rotated. The first connection portion 2041 of the second circuit layer 204 is overlapped with the third circuit portion 203b1. The second connection portion 2042 of the second circuit layer 204 is overlapped with the fourth circuit portion 203b2. In an embodiment, the first connection portion 2041 and the second connection portion 2042 are formed on the inner walls of the through holes in the carrier 20 or in almost all of the space of the through holes. The material of the first connection portion 2041 and the second connection portion 2042 can be conductive material, such as metal. It is noted that the interfaces between the first circuit layer 203 and the connection portions 2041, 2042 are not flat surfaces, such as protruded surfaces or depressed surfaces. In an embodiment, the interfaces between the electrodes 106, 108 and the connection portions 2041, 2042 are not flat surfaces, such as protruded surfaces or depressed surfaces.

Figure 16C:
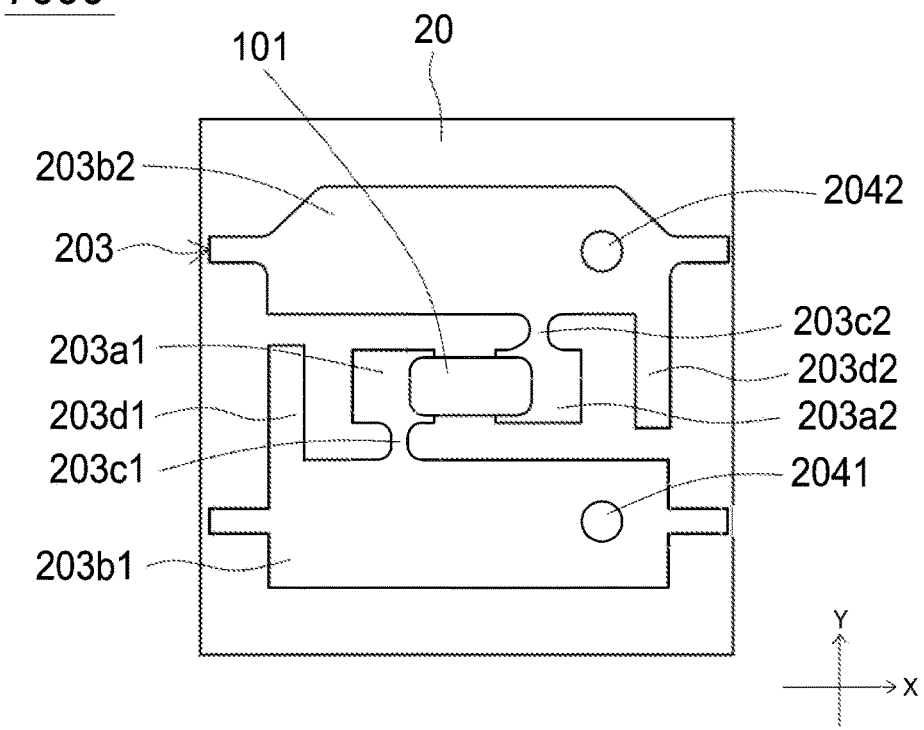
FIG. 16C shows a cross-sectional view of a light-emitting device in accordance with an embodiment of the present disclosure.

FIG. 16C shows a cross-sectional view of a light-emitting device in accordance with an embodiment of the present disclosure. Referring to FIG. 16C, the first circuit layer 203 has a seventh circuit portion 203d1 and a eighth circuit portion 203d2. The seventh circuit portion 203d1 and the eighth circuit portion 203d2 are substantially symmetrically arranged on the carrier 20 with respect to the light-emitting structure 101. It is noted that the material of the first circuit layer 203 can be reflective with respect to the light emitted from the light-emitting structure 101. Therefore, the seventh circuit portion 203d1 and the eighth circuit portion 203d2 can enhance the light intensity in a direction from the light-emitting structure 101 toward the circuit portions 203d1, 203d2 by reflecting the light that originally illuminates the carrier 20 outward from the light-emitting structure 101. In other words, the first circuit layer 203 shown in FIG. 16C covers more area than the embodiment shown in FIGS. 16A-16B to provide a better reflection effect. To be specific, the light-emitting device in FIG. 16C provides a light distribution pattern centered on the light emitting structure 101 and having a substantially circular shape on a surface defined by the X-axis and the Y-axis in a top view.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a carrier comprising a reflection surface and a first bottom surface opposite to the reflection surface;
   a light-emitting unit arranged on the reflection surface;
   a first optical structure reflective to light from the light-emitting unit, and completely arranged above the light-emitting unit;
   a second optical structure arranged between the first optical structure and the carrier to surround the light-emitting unit and directly contact the carrier and the first optical structure, and comprising a top surface and a second bottom surface which are substantially parallel with each other; and
   a virtual center line passing through the light-emitting device,
   wherein the top surface is higher than the light-emitting unit and lower than the first optical structure, and
   wherein the light-emitting device has a light intensity distribution which is symmetrically distributed with respect to the virtual center line, the light intensity distribution has a maximum value within an angle ranging between 40° and 60° with respect to the virtual center line.

2. The light-emitting device according to claim 1, wherein in a cross-sectional view, and the second optical structure is substantially surrounding the light-emitting unit and symmetrical with respect to the virtual center line.

3. The light-emitting device according to claim 1, wherein the first optical structure is a white paint reflective layer, a ceramic ink reflective layer, a metal reflective layer, or a distributed Bragg reflector.

4. The light-emitting device according to claim 1, wherein the second optical structure comprises a wavelength conversion material.

5. The light-emitting device according to claim 1, wherein the light-emitting unit comprises a light-emitting structure, and a light transmitting layer located between and directly connected to the first optical structure and the light-emitting structure.

6. The light-emitting device according to claim 1, further comprising an electrode below the first bottom surface of the carrier.

7. The light-emitting device according to claim 1, wherein the second optical structure further comprises a lateral surface located between the top surface and the second bottom surface and not parallel with the top surface and the second bottom surface.

8. The light-emitting device according to claim 1, wherein the first optical structure has a first width, the light-emitting unit comprises a light-emitting structure which has a second width, the first width and the second width are measured in a direction parallel with the reflection surface, and the first width is larger than the second width.

9. A light-emitting apparatus, comprising:
a substrate; and
a plurality of the light-emitting devices arranged in a form of a matrix on the substrate,;
wherein each light-emitting device in the plurality of the light-emitting devices comprises:
  a carrier comprising a reflection surface and a first bottom surface opposite to the reflection surface;
  a light-emitting unit arranged on the reflection surface;
  a first optical structure reflective to light from the light-emitting unit, and completely arranged above the light-emitting unit;
  a second optical structure arranged between the first optical structure and the carrier to surround the light-emitting unit and directly contact the carrier and the first optical structure, and comprising a top surface and a second bottom surface which are substantially parallel with each other; and
  a virtual center line passing through the light-emitting device,
wherein the top surface is higher than the light-emitting unit and lower than the first optical structure, and
wherein the light-emitting device has a light intensity distribution which is symmetrically distributed with respect to the virtual center line, the light intensity distribution has a maximum value within an angle ranging between 40° and 60° with respect to the virtual center line.

10. The light-emitting apparatus according to claim 9, wherein the plurality of the light-emitting devices is arranged on the substrate with a fixed interval in a direction.

* * * * *